(12) United States Patent
Yamakita

(10) Patent No.: US 8,730,278 B2
(45) Date of Patent: May 20, 2014

(54) DISPLAY DEVICE AND METHOD OF MANUFACTURE THEREOF

(75) Inventor: Hiroyuki Yamakita, Osaka (JP)

(73) Assignee: Panasonic Corporation, Osaka (JP)

( * ) Notice: Subject to any disclaimer, the term of this patent is extended or adjusted under 35 U.S.C. 154(b) by 302 days.

(21) Appl. No.: 13/322,113

(22) PCT Filed: Nov. 5, 2010

(86) PCT No.: PCT/JP2010/006525
§ 371 (c)(1),
(2), (4) Date: Nov. 22, 2011

(87) PCT Pub. No.: WO2011/058725
PCT Pub. Date: May 19, 2011

(65) Prior Publication Data
US 2012/0069064 A1   Mar. 22, 2012

(30) Foreign Application Priority Data

| Nov. 10, 2009 | (JP) | ................ | 2009-257020 |
| Nov. 10, 2009 | (JP) | ................ | 2009-257021 |
| Jan. 20, 2010 | (JP) | ................ | 2010-009872 |
| Feb. 3, 2010 | (JP) | ................ | 2010-021994 |

(51) Int. Cl.
*G09G 5/10* (2006.01)

(52) U.S. Cl.
USPC .................... 345/690; 345/211; 345/107

(58) Field of Classification Search
CPC ............. G02F 1/167; G09F 9/30; G09F 9/37; G09F 9/46
USPC ............ 345/107, 173–184, 211, 690; 445/24; 358/296
See application file for complete search history.

(56) References Cited

U.S. PATENT DOCUMENTS

| 6,636,186 B1* | 10/2003 | Yamaguchi et al. ............ 345/31 |
| 2003/0231162 A1 | 12/2003 | Kishi |

(Continued)

FOREIGN PATENT DOCUMENTS

| JP | 09-211499 | 8/1997 |
| JP | 2004-020818 | 1/2004 |
| JP | 2005-031541 | 2/2005 |
| JP | 2005-221520 | 8/2005 |

(Continued)

OTHER PUBLICATIONS

Taiwan Patent Application No. 99138482 Office Action dated Jul. 30, 2013, 7 pages.

*Primary Examiner* — Abbas Abdulselam
*Assistant Examiner* — Gerald Oliver

(57) ABSTRACT

Disclosed is a paper-like display device. A front substrate 1 and a back substrate 2 are disposed to face each other with a space therebetween, and partition walls 5 partition the space vertically (Y) and horizontally (X) into cell spaces 3. A predetermined quantity of black-colored particles 4 is enclosed within each cell space 3. A white reflective layer 6, first electrodes 7, and an insulating layer 8 are formed on the inner surface of the back substrate 2. Each first electrode 7 is separately formed for a different pixel and extends along the bottom surface of the cell space 3. Each partition wall 5 includes an upper partition wall 5b, facing the front substrate 1, and a lower partition wall 5a, facing the back substrate 2. A second electrode 9 serving as a common electrode is formed between the upper partition wall 5b and the lower partition wall 5a.

68 Claims, 47 Drawing Sheets

(56) References Cited

U.S. PATENT DOCUMENTS

| | | |
|---|---|---|
| 2004/0032390 A1* | 2/2004 | Liang et al. ............... 345/107 |
| 2004/0130776 A1 | 7/2004 | Ho et al. |
| 2005/0151830 A1* | 7/2005 | Yamazaki ............... 347/238 |
| 2007/0018917 A1* | 1/2007 | Miyazawa ............... 345/76 |
| 2007/0188431 A1* | 8/2007 | Sato et al. ............... 345/90 |
| 2009/0079676 A1 | 3/2009 | Shirasaki et al. |
| 2010/0002175 A1* | 1/2010 | Kim et al. ............... 349/115 |
| 2010/0284058 A1 | 11/2010 | Kaga et al. |

FOREIGN PATENT DOCUMENTS

| | | |
|---|---|---|
| JP | 2007-057724 | 3/2007 |
| JP | 2007-108771 | 4/2007 |
| JP | 2007-316346 | 12/2007 |
| JP | 2008-015161 | 1/2008 |
| JP | 2008-293024 | 12/2008 |
| JP | 2009-075331 | 4/2009 |
| JP | 2009-092773 | 4/2009 |
| TW | I230833 | 4/2005 |

* cited by examiner

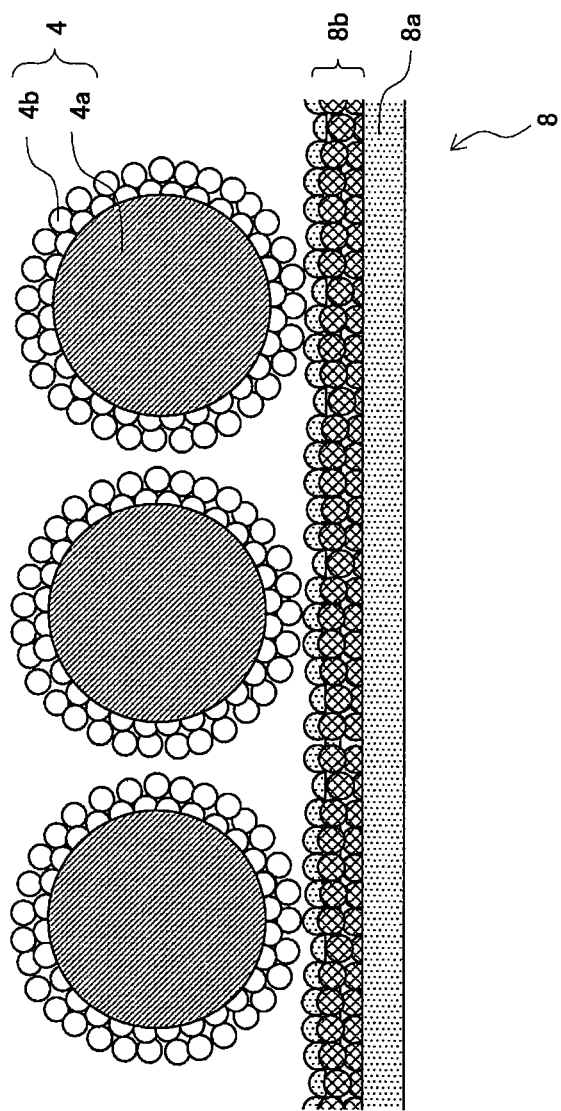

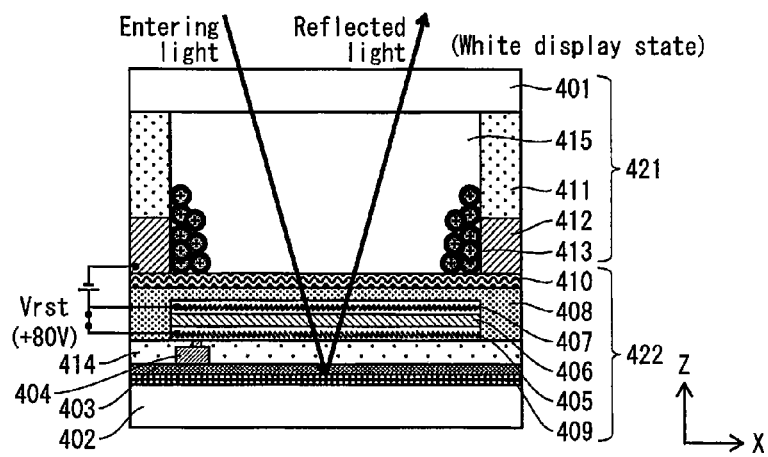
FIG. 45 (White display state)
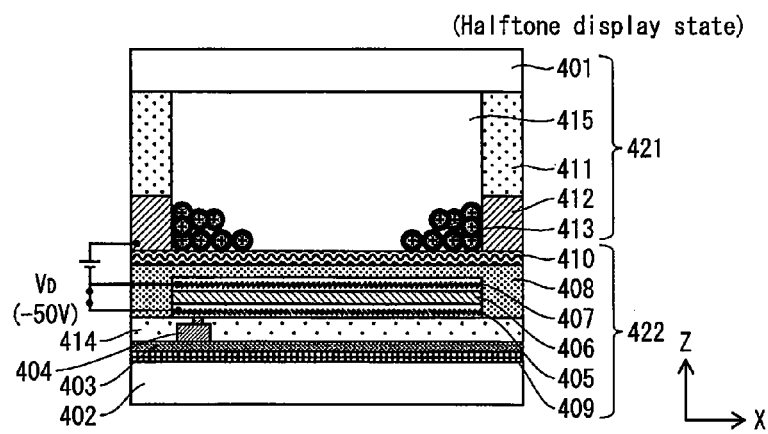
FIG. 46 (Halftone display state)
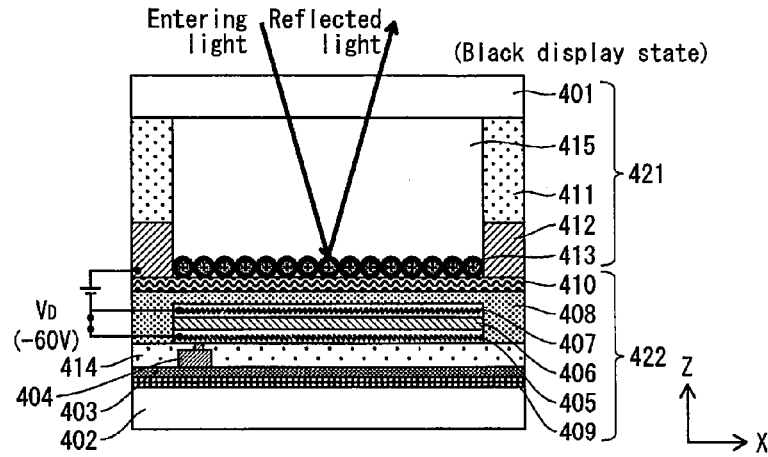
FIG. 47 (Black display state)

DISPLAY DEVICE AND METHOD OF MANUFACTURE THEREOF

TECHNICAL FIELD

The present invention relates to display devices that display images, and in particular to display devices such as electronic paper that display images through movement of colored particles between electrodes.

BACKGROUND ART

In recent years, a variety of mobile devices, starting with cellular telephones, have become widespread. At the same time, development of displays used in these devices has progressed rapidly. In addition to liquid crystal displays (LCDs) and organic electroluminescent displays (OLEDs), electronic paper has also emerged on the market.

These display devices include a display panel having pixels arranged in a matrix on a substrate, the pixels being composed of display elements such as EL elements, liquid crystal elements, electronic paper, or the like. The display devices also include a driving means that applies voltage to the display elements. Display characteristics differ depending on the type of display elements forming the pixels.

For example, OLEDs emit light and allow for high-performance, full-color video display. Like transmissive type LCDs, however, OLEDs exhibit reduced brightness and contrast in direct sunlight, making it difficult to achieve satisfactory image display. While the luminous efficiency of OLEDs has improved over recent years, considerable power consumption is required even when displaying black and white images, such as electronic books.

On the other hand, electronic paper is a reflective display device that has been used in recent years in devices such as electronic book terminals. Types of electronic paper include electrophoretic and cholesteric liquid crystal types.

For example, in the panel disclosed in Patent Literature 2, a front substrate and a back substrate are disposed to face each other with a space therebetween. Partition walls are provided in the space to partition adjacent cells, and colored particles are injected in each partitioned cell space. Voltage is applied across a cell electrode along the back substrate in each cell space and a focusing electrode provided between adjacent cell spaces, thereby causing the colored particles to move within the cell spaces.

Since this electronic paper retains images, display can be maintained without consuming nearly any electricity until the display screen is changed. Paper-like display devices such as electronic paper are chiefly black and white, but color displays are also being developed.

For example, one type of display device achieves color display by attaching a color filter to each cell of the display device in front of the cell space. In this type, however, the light reflected from each cell space is absorbed by the color filter, thus lowering the degree of reflection.

By contrast, Patent Literature 3 discloses an electrophoretic display device that displays images by providing two layered sets of a display electrode and a focusing electrode in each cell space, injecting translucent colored particles of two colors selected from among cyan, yellow, magenta, black, and the like, and causing the particles to migrate between the display electrode and the focusing electrode.

This display device can display a plurality of colors in each pixel without using a color filter by collecting colored particles necessary for color display on the display electrode and shielding light from colored particles not necessary for display by causing these particles to attach to the back side of the focusing electrode. While this yields a color display with bright, sharp colors, many problems remain to be resolved, such as improvement in response speed, assurance of gradation, improvement in degree of reflection, and more.

CITATION LIST

Patent Literature

Patent Literature 1: Japanese Patent Application Publication No. 9-211499
Patent Literature 2: Japanese Patent Application Publication No. 2005-31541
Patent Literature 3: Japanese Patent Application Publication No. 2004-20818
Patent Literature 4: Japanese Patent Application Publication No. 2007-108771

SUMMARY OF INVENTION

Technical Problem

The following sort of problems are found in such a display device provided with reflective display elements.

First, in a paper-like display device, it is preferable to improve the degree of reflection (brightness) and contrast in order to achieve a display with excellent visibility. In order to increase degree of reflection and contrast, it is preferable for colored particles to be moved so as not to remain in the central region of a pixel when displaying the color white. In practice, however, even if the applied driving voltage is increased so as to move colored particles to the periphery of a pixel, a portion of the colored particles still remains in the central region of the pixel.

For example, in a device with display electrodes and focusing electrodes, as in the electrophoretic display device disclosed in Patent Literature 1, since the electrical energy density is concentrated at the boundary of both electrodes, it is possible to drive colored particles at a relatively low voltage; nevertheless, a portion of the colored particles ends up not moving at all within the cell space.

Furthermore, if colored particles agglomerate, a portion remains on the display electrode, even when attempting to cause the colored particles to move towards and attach to the focusing electrode. This makes achieving color purity problematic.

This results in an overall gray color when attempting to display the color white, causing a reduction in the degree of reflection and contrast.

A first object is therefore to provide a paper-like display device which has improved contrast and image quality and is capable of high-speed operation at low driving voltage.

Second, Patent Literature 4 discloses a display device in which an organic EL element and a liquid crystal display element that displays images by reflecting external light are provided side-by-side in display pixels.

By thus providing a light-emitting element and a reflective element side-by-side in each pixel of the display device, the advantages of each element can be capitalized on by driving the elements individually as needed. This allows for excellent visibility both indoors and outdoors, while reducing power consumption.

Providing both light-emitting elements and reflective elements on the substrate in the same pixel, however, reduces the area occupied by the display element within the pixel as well as the aperture ratio as compared to regular light-emitting elements or to reflective display devices, leading to a reduced amount of light from the light-emitting elements and poorer image quality.

The area occupied by the display element in each pixel can be guaranteed by providing the reflective element on top of the light-emitting element in each pixel, so that light from the light-emitting element traverses the reflective element and is emitted towards the front of the panel. This structure, however, leads to the problem of a decreased degree of transparency of the light from the light-emitting element, thus easily causing reduced image quality.

A second object is therefore to provide a display device with excellent visibility both indoors and outdoors without reducing luminous efficiency or image quality.

Third, if both light-emitting elements and reflective elements are provided in the same pixel, then when the light-emitting elements are driven, voltage also ends up being applied to the reflective elements, thus changing the display state and resulting in reduced image quality during display by the light-emitting elements.

In particular, in a device structure in which the reflective element is provided on top of the light-emitting element in each pixel, if the display state of the reflective element changes, the amount of light emitted by the light-emitting element towards the front of the panel changes, thus easily reducing image quality during display by the light-emitting element.

A third object is therefore to provide a display device that achieves display with excellent visibility both indoors and outdoors by providing both a light-emitting element and a reflective element in each pixel, and in which the display state of the reflective element does not change while the light-emitting element is being driven.

Solution to Problem (1) To achieve the first object, a display device according to a first aspect of the present invention is provided with a panel and a driving unit, the panel including a front substrate and a back substrate disposed to face each other with a space therebetween, partition walls disposed in the space to partition adjacent pixels into cell spaces, and colored particles enclosed in each cell space, the driving unit causing the colored particles to move within the cell space, a first electrode being provided independently in each pixel of the panel at a bottom of the cell space facing the back substrate, a second electrode, having a common electric potential in every pixel, being provided within the partition walls and closer to the front substrate than the first electrode, and the driving unit applying a voltage between the first electrode and the second electrode to cause the colored particles in each pixel to move between being gathered by the first electrode and being gathered by the second electrode, in order to change an amount of light emitted towards the front of the panel.

The "second electrode . . . closer to the front substrate than the first electrode" means generally providing the second electrode at a distance from the bottom of the cell space towards the front substrate. The distance at which the second electrode is provided from the bottom of the cell space towards the front substrate is preferably at least ⅓ a height of the partition walls.

The thickness of the second electrode in a direction of thickness of the substrates is preferably between 5 μm and 25 μm inclusive.

The second electrode preferably protrudes from a side of the partition wall towards a central region of the cell space.

In plan view from the front of the panel, at least a portion of the second electrode preferably overlaps an outer periphery of the first electrode.

It is preferable for the first aspect of the display device also to have the following features.

The colored particles are enclosed in a gas in the cell space.

The colored particles are constituted by core particles and surface particles covering a surface of the core particles, the core particles being formed from a material that takes a positive or negative electrostatic charge.

A surface-treated layer having protrusions on a surface thereof is provided on an inner surface of the cell space.

The surface-treated layer is formed from a material having the same electrostatic charge property as the colored particles.

An average distance between the protrusions on the surface of the surface-treated layer is set smaller than an average particle diameter of the colored particles.

The protrusions on the surface of the surface-treated layer are formed evenly across the entire surface.

The surface-treated layer is a coated layer formed by applying a coating agent having particles dispersed therein to the inner surface of the cell space.

The colored particles are constituted by core particles and surface particles covering a surface of the core particles, and an average particle diameter of the particles dispersed in the coating agent is set larger than an average particle diameter of the surface particles and set smaller than an average particle diameter of the core particles.

A color filter is provided on the front substrate.

Before displaying an image, the driving unit causes the colored particles to be gathered by the second electrode by applying a reset voltage between the first electrode and the second electrode.

The back substrate is provided with a reflective layer facing a back surface of the first electrode, and the driving unit causes the colored particles to move in order to change an amount of light reflected after entering from the front of the panel.

A backlight is provided at a back side of the back substrate.

In the panel, a light-emitting display element facing a back surface of the first electrode is provided in each pixel, the first electrode and the light-emitting display element transmit visible light, and a reflective layer is provided facing a back surface of the light-emitting display element.

(2) To achieve the second object, a display device according to a second aspect of the present invention is provided with a display panel and a driving unit, the display panel including a front substrate, a back substrate facing the front substrate, an intermediate substrate between the front substrate and the back substrate, and a plurality of pixels in a matrix, each pixel including a first display element facing the front substrate and a second display element facing the back substrate, the driving unit driving the first display element and the second display element, in the first display element, first partition walls being disposed in a space between the front substrate and the intermediate substrate to partition adjacent pixels into first cell spaces, first colored particles having an electrostatic charge property being enclosed in each first cell space, a first display electrode facing the front substrate being provided in each first cell space, and one or more first focusing electrodes being provided within the first partition walls, in the second display element, second partition walls being disposed in a space between the back substrate and the intermediate substrate to partition adjacent pixels into second cell spaces, second colored particles having an electrostatic charge property being enclosed in each second cell space, a second display electrode facing the back substrate being provided in each second cell space, and one or more second focusing electrodes being provided within the second partition walls, the driving unit changing a voltage application pattern between the first display electrode and the first focusing electrode and a voltage application pattern between the second display electrode and the second focusing electrode, and by changing the voltage application patterns, the driving unit causing the first colored particles to shift between covering the front substrate and clearing the front substrate to attach to the first partition walls and causing the second colored particles to shift between covering the back substrate and clearing the back substrate to attach to the second partition walls, in order to change a gradation of light extracted through the front of the panel.

It is preferable for the second aspect of the display device also to have the following features.

In the first display element, the first colored particles include two types of colored particles, the two types having a different color and a different electrical polarity, the first focusing electrodes are provided as a pair at opposing positions within the first partition walls on either side of the first cell space, and the driving unit applies voltage between the first display electrode and the pair of first focusing electrodes using different voltage application patterns.

In the second display element, the second colored particles include two types of colored particles, the two types having a different color and a different electrical polarity; the second focusing electrodes are provided as a pair at opposing positions within the second partition walls on either side of the second cell space, and the driving unit applies voltage between the second display electrode and the pair of second focusing electrodes using different voltage application patterns.

The first colored particles are of two colors selected from among red, green, blue, and black, and the second colored particles are of the two remaining colors not selected for the first colored particles.

Alternatively, the first colored particles are of two colors selected from among cyan, yellow, magenta, and black, and the second colored particles are of the two remaining colors not selected for the first colored particles.

The front substrate, the intermediate substrate, the first display electrode, and the second display electrode are made of transparent material.

A white reflective layer is provided facing a back surface of the second display element.

With respect to each pixel, the driving unit adjusts voltage applied between the first display electrode and the first focusing electrode in the first display element and voltage applied between the second display electrode and the second focusing electrode in the second display element, and displays gradations by changing a proportion of the first colored particles covering the front substrate and a proportion of the second colored particles covering the back substrate.

Before applying voltage for image display, the driving unit applies a reset voltage between the first display electrode and the first focusing electrode in the first display element to cause the first colored particles to be gathered by the first focusing electrode, and applies a reset voltage between the second display electrode and the second focusing electrode in the second display element to cause the second colored particles to be gathered by the second focusing electrode.

The first focusing electrode is positioned within the first partition walls between a side of the first cell space facing the front substrate and a side of the first cell space facing the intermediate substrate, and the second focusing electrode is positioned within the second partition walls between a side of the second cell space facing the back substrate and a side of the second cell space facing the intermediate substrate. The first focusing electrode is positioned at a distance towards the intermediate substrate from a side of the first cell space facing the front substrate, and the second focusing electrode is positioned at a distance towards the intermediate substrate from a side of the second cell space facing the back substrate.

The first focusing electrode is positioned in a central region of the first cell space in a direction of height of the first partition walls, and the second focusing electrode is positioned in a central region of the second cell space in a direction of height of the second partition walls.

The first cell space and the second cell space are filled with a gas.

At least one the first colored particles and the second colored particles includes core particles and surface particles covering a surface of the core particles, the core particles being formed from a material that takes a positive or negative electrostatic charge.

A surface-treated layer having protrusions on a surface thereof is provided on an inner surface of the first cell space and on an inner surface of the second cell space.

Each surface-treated layer is formed from a material having the same electrostatic charge property as the colored particles enclosed in the corresponding cell space.

An average distance between the protrusions on the surface of each surface-treated layer is set smaller than an average particle diameter of the colored particles enclosed in the corresponding cell space.

The protrusions on the surface of each surface-treated layer are formed evenly across the entire surface.

Each surface-treated layer is a coated layer formed by applying a coating agent having particles dispersed therein to the inner surface of each cell space.

(3) To achieve the third object, a display device according to a third aspect of the present invention comprises: a panel including a front substrate and a back substrate, disposed to face each other and to enclose a light-emitting first display element and a reflective second display element in overlap in each pixel; and a driving unit configured to drive the first display element and the second display element separately, the second display element including partition walls partitioning adjacent pixels into cell spaces, colored particles enclosed in each cell space, and an in-plane electrode along an inner surface of the cell space, and the driving unit applying a voltage to the in-plane electrode to cause the colored pixels to move within the cell space in order to change an amount of light reflected after entering from the front of the panel.

The colored particles generally move in the cell space in a direction along the substrate surface. Specifically, the in-plane electrode is formed by a pair of a partition wall electrode provided along the partition wall and a back electrode provided along a bottom of the cell space, and the driving unit applies voltage between the partition wall electrode and the back electrode to cause the colored particles to move between being gathered by the partition wall electrode and being gathered by the back electrode.

Before driving the first display element, the driving unit applies voltage between the partition wall electrode and the back electrode to cause the colored particles to be gathered by the partition wall electrode.

It is preferable for the display device also to have the following features.

The first display element is formed from material that transmits visible light, and a reflective layer is provided at a back of the first display element.

In the second display element, a light-conducting layer is provided facing the cell space on the back electrode.

The colored particles are constituted by core particles and surface particles covering a surface of the core particles, the core particles taking a positive or negative electrostatic charge.

In the second display element, the colored particles are enclosed in a gas in the cell space.

The first display element is sealed by a sealing layer, and the cell space in the second display element is provided in front of the sealing layer.

A surface-treated layer having protrusions on a surface thereof is provided on an inner surface of the cell space.

The surface-treated layer is formed from a material having the same electrostatic charge property as the colored particles.

An average distance between the protrusions on the surface of the surface-treated layer is set smaller than an average particle diameter of the colored particles.

The protrusions on the surface of the surface-treated layer are formed evenly across the entire surface.

The surface-treated layer is a coated layer formed by applying a coating agent having particles dispersed therein to the inner surface of the cell space.

The coating agent is formed by dispersing $TiO_2$ particles in a medium of water, the $TiO_2$ particles having an anatase crystal structure.

The coating agent is formed by dispersing inorganic particles in a medium constituted by a solution of insulating resin fused in a solvent.

Polycarbonate is used as the insulating resin.

When the colored particles are constituted by core particles and surface particles covering a surface of the core particles, an average particle diameter of the particles dispersed in the coating agent is set larger than an average particle diameter of the surface particles and set smaller than an average particle diameter of the core particles.

The driving unit is provided with a first semiconductor switching element applying voltage to the first display element and a second semiconductor switching element applying voltage to the second display element.

A method of manufacturing the display device according to the third aspect includes the step of dispersing, in a dry gas atmosphere having a constant amount of moisture, the colored particles in each cell space partitioned by the partition walls. The method also includes the step of sealing the first display element with a sealing layer in a dry gas atmosphere.

(4) To achieve the third object, a display device according to a fourth aspect of the present invention comprises: a panel including a front substrate and a back substrate, disposed to face each other and to enclose a light-emitting first display element and a reflective second display element in each pixel; and a driving unit configured to drive the first display element and the second display element separately, the driving unit applying a driving voltage equaling at least a threshold voltage when driving the second display element, and the driving unit applying a driving voltage equaling at most the threshold voltage when driving the first display element.

In other words, the "threshold voltage" is the minimum voltage necessary to drive the second display element. The maximum value of the driving voltage applied to the second display element when the driving unit drives the second display element is set to be at least the threshold voltage, and the maximum value of the driving voltage applied to the first display element when the driving unit drives the first display element is set to be at most the threshold voltage.

It is preferable for the display device also to have the following features.

In each pixel, the second display element is provided in front of and overlapping the first display element.

The second display element includes partition walls partitioning adjacent pixels into cell spaces, colored particles enclosed in each cell space, and an in-plane electrode along an inner surface of the cell space, and the driving unit applies a voltage to the in-plane electrode to cause the colored pixels to move within the cell space in order to change an amount of light reflected after entering from outside of the panel. The colored particles generally move in the cell space in a direction along the substrate surface. The threshold voltage corresponds to a minimum voltage necessary to apply to the electrode to cause the colored particles to move in the cell space.

In the second display element, the colored particles are enclosed in a gas in the cell space.

The in-plane electrode in the second display element is formed by a pair of a partition wall electrode provided along the partition wall and a back electrode provided along a bottom of the cell space. The driving unit applies voltage between the partition wall electrode and the back electrode to cause the colored particles to move between being gathered by the partition wall electrode and being gathered by the back electrode.

When the first display element includes an anode and a cathode, the cathode also functions as the back electrode.

When the first display element includes an anode and a cathode, then when the second display element is driven, the anode of the first display element and the back electrode of the second display element are connected so as to be at the same electric potential.

The first display element is formed from material that transmits visible light, and a reflective layer is provided at a back of the first display element.

At least one of the first display device and the second display element is driven by a simple matrix method.

The driving unit drives the first display element and the second display element with a common semiconductor switching element.

Advantageous Effects of Invention (1) In the display device of the first aspect, the first electrode is provided independently in each pixel the bottom of the cell space facing the back substrate, and the second electrode is provided in the partition walls closer to the front substrate than the first electrode. Therefore, sufficient distance is guaranteed along the side of the partition walls between the second electrode and the outer periphery of the first electrode. When the driving unit applies driving voltage between the first electrode and the second electrode, electric energy density does not concentrate in a narrow region within the cell space. Rather, a uniform electrical field forms along the side of the partition walls between the second electrode and the outer periphery of the first electrode.

As a result, when displaying white, the colored particles enclosed in the cell space are caused to move to the side of the partition walls so as to evenly attach thereto, even with a relatively small the driving voltage. Therefore, this structure widely exposes pixels and achieves display with a high degree of reflection and high contrast.

Since the second electrode is at a common potential in all of the pixels, i.e. the second electrode is a common electrode conducting between all of the pixels, a conductive film or the like, with holes corresponding to the cell spaces, can be used for the second electrode. Accordingly, the display panel can be manufactured with a simple method.

In order to guarantee the region to which the colored particles attach within the cell space, it is preferable to provide the second electrode at a distance from the bottom of the cell space towards the front substrate, and for the distance at which the second electrode is provided from the bottom of the cell space to be at least $\frac{1}{5}$ a height of the partition walls.

It is also preferable for the thickness of the second electrode in the direction of thickness of the substrates to be between 5 μm and 25 μm inclusive in order to guarantee the distance between the front substrate and the second electrode.

If the second electrode protrudes from a side of the partition wall towards a central region of the cell space, or in plan view from the front of the panel, if at least a portion of the second electrode overlaps an outer periphery of the first electrode, the distribution of electric energy density along the side of the partition walls increases. This reduces the driving voltage.

By enclosing the colored particles in a gas in the cell space, the resistance when the colored particles move in the cell space decreases, so that the particles move quickly, allowing for high-speed display when driving the panel.

By forming the colored particles from core particles and surface particles covering a surface of the core particles, the core particles being formed from a material that takes a positive or negative electrostatic charge, and by forming a surface-treated layer having protrusions on a surface thereof on an inner surface of the cell space, the van der Waals forces that operate between the colored particles and the inner wall of the cell space are reduced, thereby reducing driving voltage necessary for causing the colored particles to move.

The colored particles move even more easily in the cell space by forming the surface-treated layer from a material having the same electrostatic charge property as the colored particles (a material that is close in the triboelectric series), by setting the average distance between the protrusions on the surface of the surface-treated layer to be smaller than the average particle diameter of the colored particles, or by forming the protrusions on the surface of the surface-treated layer evenly across the entire surface.

The surface-treated layer can easily be formed by applying a coating agent in which particles are dispersed. In this case, the conductivity of the surface-treated layer can be adjusted with the particles.

When the colored particles are constituted by core particles and surface particles covering a surface of the core particles, the colored particles move more easily in the cell space if an average particle diameter of the particles dispersed in the coating agent is set larger than an average particle diameter of the surface particles and set smaller than an average particle diameter of the core particles.

By providing a color filter on the front substrate, the display device of the first aspect can perform full-color display.

Before displaying a desired image, a reset voltage that is 10%-20% higher than the normal driving voltage is applied between the first electrode and the second electrode, thereby removing colored particles remaining in the central region of each pixel and reliably causing the colored particles to gather by the partition walls. This allows for display with a high degree of reflection and high contrast over a long period of time.

Providing a reflective layer on the back substrate in the display device according to the third aspect allows for reflective display by causing the colored particles to move in order to change the amount of light reflected after entering from the front of the panel.

Providing a backlight behind the back substrate in the display device of the first aspect allows for transmissive display of images in which transmitted light passing through the front of the panel is changed by movement of the colored particles.

In the display device of the first aspect, a layered structure with a light-emitting display element and a reflective display element in every pixel may be adopted by providing a light-emitting display element facing the back surface of the first electrode in each pixel, forming the first electrode and the light-emitting display element to transmit visible light, and providing a reflective layer facing a back surface of the light-emitting display element. Such a display device allows for a large aperture ratio when the reflective display element displays white, thus achieving reflective display with a high degree of reflection and high contrast, while also allowing for light from the light-emitting display element to be emitted well through the front of the panel, thus achieving light-emitting display with high luminous efficiency.

Accordingly, the display device suffers almost no reduction in image quality during both reflective display and light-emitting display, while capitalizing on the characteristics of both the light-emitting display element (excellent visibility indoors, excellent video display) and the reflective display element (excellent visibility outdoors, low power consumption), thus achieving display that offers excellent visibility both indoors and outdoors, with low power consumption.

(2) In the display panel of the display device of the second aspect, a first display element, facing the front substrate, and a second display element, facing the back substrate, are provided in each pixel. In the first display element, first partition walls are disposed in a space between the front substrate and the intermediate substrate to partition adjacent pixels into first cell spaces, and first colored particles are enclosed in each first cell space. A first display electrode facing the front substrate is provided in each first cell space, and one or more first focusing electrodes are provided within the first partition walls. In the second display element, second partition walls are disposed in a space between the back substrate and the intermediate substrate to partition adjacent pixels into second cell spaces, and second colored particles are enclosed in each second cell space. A second display electrode facing the back substrate is provided in each second cell space, and one or more second focusing electrodes are provided within the second partition walls. The driving unit changes the pattern of voltage applied between the first display electrode and the first focusing electrode to cause the first colored particles to shift between covering the front substrate and clearing the front substrate to attach to the first partition walls. The driving unit also changes the pattern of voltage applied between the second display electrode and the second focusing electrode to cause the second colored particles to shift between covering the back substrate and clearing the back substrate to attach to the second partition walls. In this way, the display device selectively displays the color of the colored particles. In other words, the display device displays color images by changing the gradation of light that is extracted through the front of the panel.

When the driving unit applies voltage between the first display electrode and the first focusing electrode, a large, uniform distribution of electric energy density forms along the side of the first partition walls, so that the first colored particles attach to the side of the first partition walls without remaining in the central region of the first cell space, thereby exposing the first cell space to a great degree. When the driving unit applies voltage between the second display electrode and the second focusing electrode, a large, uniform distribution of electric energy density forms along the side of the second partition walls, so that the second colored particles attach to the side of the second partition walls without remaining in the central region of the second cell space, thereby exposing the second cell space to a great degree.

This structure therefore achieves display with a high degree of reflection and high contrast, as well as high color purity.

In the first display element, the first colored particles may include two types of colored particles, the two types having a different color and a different electrical polarity. The first focusing electrodes may be provided as a pair at opposing positions within the first partition walls on either side of the first cell space. The driving unit may apply voltage between the first display electrode and the pair of first focusing electrodes using different voltage application patterns. This structure allows for selective display of the colors of the two types of colored particles.

In the second display element, the second colored particles may include two types of colored particles, the two types having a different color and a different electrical polarity. The second focusing electrodes may be provided as a pair at opposing positions within the second partition walls on either side of the second cell space. The driving unit may apply voltage between the second display electrode and the pair of second focusing electrodes using different voltage application patterns. This structure allows for selective display of the colors of the two types of colored particles.

Accordingly, through a combination of the first and the second display elements in each pixel, selective display of three or four colors is possible.

For full-color display by additive color mixing, the first colored particles may be of two colors selected from among red, green, blue, and black, and the second colored particles may be of the two remaining colors not selected for the first colored particles.

Alternatively, for full-color display by subtractive color mixing, the first colored particles may be of two colors selected from among cyan, yellow, magenta, and black, and the second colored particles may be of the two remaining colors not selected for the first colored particles.

By providing a white reflective layer facing a back surface of the second display element, light that is reflected off the white reflective layer is used to achieve a clear white display.

With respect to each pixel, the driving unit adjusts voltage applied to a pair of the first display electrode and the first focusing electrode in the first display element and voltage applied to a pair of the second display electrode and the second focusing electrode in the second display element, and displays gradations by changing a proportion of the first colored particles covering the front substrate and a proportion of the second colored particles covering the back substrate.

Before applying voltage for image display, the driving unit applies a reset voltage between the first display electrode and the first focusing electrode in the first display element to cause the first colored particles to be gathered by the first focusing electrode, and applies a reset voltage between the second display electrode and the second focusing electrode in the second display element to cause the second colored particles to be gathered by the second focusing electrode. Adopting this structure removes colored particles remaining in the central region of each pixel and reliably causes the colored pixels to gather by the partition walls, thereby allowing for achievement of display with a high degree of reflection and high contrast over a long period of time.

Positioning the first focusing electrode within the first partition walls between a side of the first cell space facing the front substrate and a side of the first cell space facing the intermediate substrate, in particular at an intermediate position along the height of the first cell space, guarantees sufficient distance along the side of the first partition wall between the first display electrode and the first focusing electrode. Positioning the second focusing electrode within the second partition walls between a side of the second cell space facing the back substrate and a side of the second cell space facing the intermediate substrate, in particular at an intermediate position along the height of the second cell space, guarantees sufficient distance along the side of the second partition wall between the second display electrode and the second focusing electrode. In particular, positioning the first focusing electrode at a distance towards the intermediate substrate from a side of the first cell space facing the front substrate, and the second focusing electrode at a distance towards the intermediate substrate from a side of the second cell space facing the back substrate, is highly effective.

Accordingly, when the driving unit applies driving voltage, electric energy density does not concentrate in a narrow region within the first and second cell spaces. Rather, a uniform electrical field forms along the side of the first and second partition walls, so that the colored particles enclosed in the cell spaces are caused to evenly attach to the side of the partition walls. Therefore, in particular when displaying white, this structure widely exposes pixels and achieves display with a high degree of reflection and high contrast.

If the colored particles enclosed first cell space and the second cell space are in a gas, resistance when the colored particles move in the cell space decreases, thus allowing for high-speed display.

The van der Waals forces operating between the colored particles and the inner wall of the cell space can be reduced, thus reducing the driving voltage for moving the colored particles, if at least one the first colored particles and the second colored particles includes core particles and surface particles covering a surface of the core particles, the core particles being formed from a material that takes a positive or negative electrostatic charge, or if a surface-treated layer having protrusions on a surface thereof is provided on an inner surface of the first cell space and on an inner surface of the second cell space, or if each surface-treated layer is formed from a material having the same electrostatic charge property as the colored particles enclosed in the corresponding cell space.

The colored particles move even more easily in the cell space by forming the surface-treated layer from a material having the same electrostatic charge property as the colored particles (a material that is close in the triboelectric series), by setting the average distance between the protrusions on the surface of the surface-treated layer to be smaller than the average particle diameter of the colored particles, or by forming the protrusions on the surface of the surface-treated layer evenly across the entire surface.

When the colored particles are constituted by core particles and surface particles covering a surface of the core particles, the colored particles move more easily in the cell space if an average particle diameter of the particles dispersed in the coating agent is set larger than an average particle diameter of the surface particles and set smaller than an average particle diameter of the core particles.

The surface-treated layer can easily be formed by applying a coating agent in which particles are dispersed. In this case, the conductivity of the surface-treated layer can be adjusted with the particles.

(3) In the display device according to the third aspect, the first, light-emitting display element and the second, reflective display element are provided in each pixel. Therefore, driving may be switched between reflective display and light-emitting display as needed. Accordingly, the display device capitalizes on the characteristics of both the light-emitting display element (excellent visibility indoors, excellent video display) and the reflective display element (excellent visibility outdoors, low power consumption), thus achieving display that offers excellent visibility both indoors and outdoors, with low power consumption.

Furthermore, since the first display element and the second display element are provided in each pixel in overlap, rather than side by side, the area occupied by the first display element and the second display element in the pixel may be set to a large value, without the elements being restricted by one another.

The second display element includes partition walls partitioning adjacent pixels into cell spaces, colored particles enclosed in each cell space, and an in-plane electrode along an inner surface of the cell space, and an image is displayed by the driving unit applying a voltage to the in-plane electrode to cause the colored pixels to move within the cell space in order to change an amount of light reflected after entering from the front of the panel. Therefore, when driving the first display element for light-emitting display, a large aperture ratio is guaranteed for the second display element, and light from the first display element is emitted well through the front of the panel.

In this way, the display device achieves good image display with almost no reduction in image quality during both reflective display and light-emitting display.

Specifically, a structure in which the in-plane electrode is formed by a pair of a partition wall electrode provided along the partition wall and a back electrode provided along a bottom of the cell space, and the driving unit applies voltage between the partition wall electrode and the back electrode to cause the colored particles to move between being gathered by the partition wall electrode and being gathered by the back electrode, changes the amount of light reflected after entering from outside the panel to achieve good reflective display.

Furthermore, before driving the first display element, if the driving unit applies voltage between the partition wall electrode and the back electrode to cause the colored particles to be gathered by the partition wall electrode, then the aperture ratio of the second display element increases, and light emitted by the first display element is emitted through the front of the panel without being blocked by the second display element.

In the display device according to the third aspect, if the first display element is formed from material that transmits visible light, and a reflective layer is provided at a back of the first display element, then the reflective layer is used not only for display by the second display element, but also functions to reflect light from the first display element towards the front of the panel.

In the second display element, providing a light-conducting layer facing the cell space on the back electrode allows for smooth movement of the colored particles in the cell space.

Constituting the colored particles from core particles and surface particles covering a surface of the core particles, the core particles taking a positive or negative electrostatic charge, allows for easy formation of colored particles with a positive or negative electrostatic charge.

In the second display element, if the colored particles are enclosed in a gas in the cell space, then the optical characteristics of the light-emitting display element do not deteriorate easily as compared to when the colored particles are enclosed in a liquid, since the refractive index of the gas is approximately one.

Furthermore, by enclosing the colored particles in a gas, a voltage of a certain magnitude is necessary to cause the colored particles that are attached to the inner surface of the cell space to move, but the colored particles move quickly after movement begins.

Therefore, the colored particles remain stably at rest in the cell space when driving voltage is not applied to the second display element yet move rapidly when driving voltage is applied, thus achieving display that is both stable and rapid.

By sealing the first display element with a sealing layer, and providing the cell space in the second display element in front of the sealing layer, the first display element is protected from moisture. In particular, this structure is useful when the first display element is an organic EL element that is fragile with respect to moisture.

Providing a surface-treated layer, having protrusions on a surface thereof, on an inner surface of the cell space allows the colored particles to move easily within the cell space.

The colored particles move even more easily in the cell space by forming the surface-treated layer from a material having the same electrostatic charge property as the colored particles (a material that is close in the triboelectric series), by setting the average distance between the protrusions on the surface of the surface-treated layer to be smaller than the average particle diameter of the colored particles, or by forming the protrusions on the surface of the surface-treated layer evenly across the entire surface.

When the colored particles are constituted by core particles and surface particles covering a surface of the core particles, the colored particles move more easily in the cell space if an average particle diameter of the particles dispersed in the coating agent is set larger than an average particle diameter of the surface particles and set smaller than an average particle diameter of the core particles.

The surface-treated layer can easily be formed by applying a coating agent in which particles are dispersed. In this case, the conductivity of the surface-treated layer can be adjusted with the particles.

The coating agent may specifically be formed by dispersing $TiO_2$ particles in a medium of water, the $TiO_2$ particles having an anatase crystal structure. The coating agent may also be formed by dispersing inorganic particles in a medium constituted by a solution of insulating resin, such as polycarbonate, fused in a solvent.

Providing the driving unit with a first semiconductor switching element applying voltage to the first display element and a second semiconductor switching element applying voltage to the second display element allows for separate active driving of the first display element and the second display element.

In the method of manufacturing the display device according to the third aspect, inclusion of the step of dispersing, in a dry gas atmosphere having a constant amount of moisture, the colored particles in each cell space partitioned by the partition walls, and the step of sealing the first display element with a sealing layer in a dry gas atmosphere, is effective for preventing moisture from entering the display elements.

(4) In the display device according to the fourth aspect, the first, light-emitting display element and the second, reflective display element are provided in each pixel. Therefore, driving may be switched between reflective display and light-emitting display as needed. Accordingly, the display device capitalizes on the characteristics of both the light-emitting display element (excellent visibility indoors, excellent video display) and the reflective display element (excellent visibility outdoors, low power consumption), thus achieving display that offers excellent visibility both indoors and outdoors, with low power consumption.

Furthermore, the driving voltage for driving the first display element is larger than the threshold voltage necessary for driving the second display element. Therefore, when driving the light-emitting element, a change in display by the reflective element due to the influence of the driving voltage is prevented. Accordingly, light-emitting display is achieved without a reduction in image quality.

By adopting a panel structure in which the second display element is provided in front of and overlapping the first display element, the area occupied by the first display element and the second display element in the pixel may be set to a large value, without the elements being restricted by one another, thereby contributing to an increase in display quality by the first and the second display elements. Particularly when driving the light-emitting element, the display device with such a panel structure is highly effective at maintaining the quality of images during light-emitting display by preventing change in the display by the reflective element.

If the second display element includes partition walls partitioning adjacent pixels into cell spaces, colored particles enclosed in each cell space, and an in-plane electrode along an inner surface of the cell space, and if an image is displayed by the driving unit applying a voltage to the in-plane electrode to cause the colored pixels to move within the cell space in order to change an amount of light reflected after entering from outside of the panel, then when the first display element is driven for light-emitting display, a large aperture ratio is guaranteed for the second display element, and light from the first display element is emitted well through the front of the panel.

Specifically, a structure for the second display element in which the in-plane electrode is formed by a pair of a partition wall electrode provided along the partition wall and a back electrode provided along a bottom of the cell space, and the driving unit applies voltage between the partition wall electrode and the back electrode to cause the colored particles to move between being gathered by the partition wall electrode and being gathered by the back electrode, changes the amount of light reflected after entering from outside the panel to achieve good reflective display.

In the second display element, if the colored particles are enclosed in a gas in the cell space, then the optical characteristics of the light-emitting display element do not deteriorate easily as compared to when the colored particles are enclosed in a liquid, since the refractive index of the gas is approximately one.

Furthermore, by enclosing the colored particles in a gas, a voltage of a certain magnitude is necessary to cause the colored particles that are attached to the inner surface of the cell space to move. Therefore, it is easy to guarantee the threshold voltage for driving the second display element, and the colored particles move quickly after movement begins.

Accordingly, the colored particles remain stably at rest in the cell space when driving voltage is not applied to the second display element yet move rapidly when driving voltage is applied, thus achieving display that is both stable and rapid.

If the first display element includes an anode and a cathode, and the cathode also functions as the back electrode for the second display element, then the number of constituent elements between the light-emitting display element and the reflective display element is reduced, thereby increasing light transmission.

If the first display element includes an anode and a cathode, then when the second display element is driven, if the anode of the first display element and the back electrode of the second display element are connected so as to be at the same electric potential, the driving element for the first display element may also be used to drive the second display element.

If the first display element is formed from material that transmits visible light, and a reflective layer is provided at a back of the first display element, then the reflective layer is used not only for display by the second display element, but also functions to reflect light from the first display element towards the front of the panel.

If at least one of the first display device and the second display element is driven by a simple matrix method, it is not necessary to provide a semiconductor switching element, such as a TFT, for the display element, thereby providing the display device with a simple, inexpensive structure that is particularly useful in compact display devices.

A structure in which the driving unit drives the first display element and the second display element with a common semiconductor switching element allows for a relatively simple wiring structure.

BRIEF DESCRIPTION OF DRAWINGS

FIG. 2 is an enlarged cross-section diagram schematically showing the colored particles attached to the insulating layer.

FIG. 14 is a partial cross-section diagram showing a white display state of the display panel according to Example 3a.

FIG. 45 is a cross-section diagram schematically showing the structure of a pixel unit in the display panel according to Embodiment 4-1, illustrating white display.

FIG. 46 is a cross-section diagram schematically showing the structure of a pixel unit in the display panel according to Embodiment 4-1, illustrating halftone display.

FIG. 47 is a cross-section diagram schematically showing the structure of a pixel unit in the display panel according to Embodiment 4-1, illustrating black display.

DESCRIPTION OF EMBODIMENTS

Embodiment 1-1

A display device according to the present embodiment is composed of a driving unit 10 and a display panel 100, in which a plurality of pixels are arranged in a matrix along the horizontal direction (X direction) and the vertical direction (Y direction).

<Display Panel>

The following describes the device structure of the display panel 100.

Figure 1A:
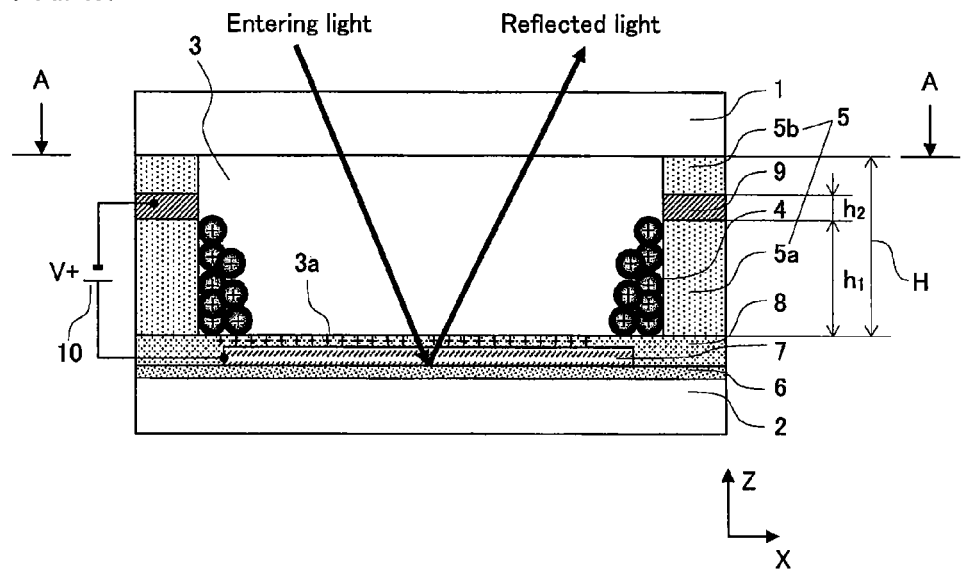
FIG. 1A is a partial cross-section diagram showing a white display state of the display panel according to Embodiment 1-1.

FIG. 1A is a partial cross-section diagram showing the structure of the display panel according to Embodiment 1-1, illustrating a representative pixel (unit of display).

The following describes a display panel in which each pixel displays black or white. A full-color display panel can also be achieved, however, by structuring each pixel to have sub-pixels that are red (R), green (G), and blue (B), or cyan (C), yellow (Y), and magenta (M).

An example of the size of each pixel is a pitch of 300 μm in both the horizontal direction (X direction) and vertical direction (Y direction). In the case of a full-color display, each of the red (R), green (G), and blue (B), or cyan (C), yellow (Y), and magenta (M) sub-pixels is a rectangle measuring 100 μm horizontally by 300 μm vertically.

Figure 1B:
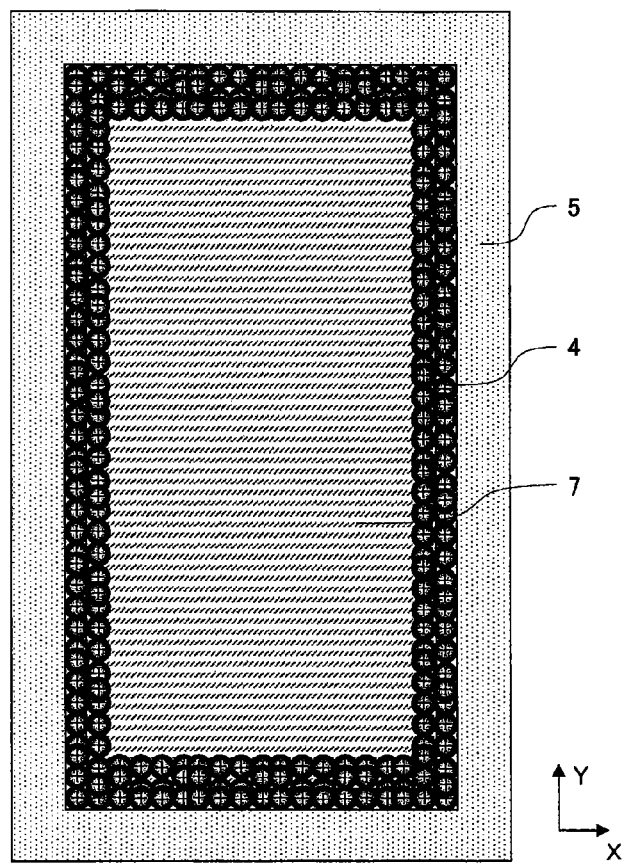
FIG. 1B is a plan view of an A-A cross-section.

FIG. 1B shows an A-A cross-section in FIG. 1A.

Each pixel is shaped as a rectangle, as in FIG. 1B, and is partitioned by partition walls 5.

As shown in FIG. 1A, a front substrate 1 and a back substrate 2 are disposed to face each other with a space therebetween, and this space is partitioned by partition walls 5 (5a, 5b) in the vertical direction (Y direction) and the horizontal direction (X direction) in a criss-cross fashion, thereby dividing the space into a matrix of cell spaces 3. A predetermined quantity of black-colored particles 4 (particle group of colored particles 4) is encapsulated within each cell space 3.

A white reflective layer 6 is formed above the back substrate 2, with a first electrode 7 formed thereabove, and an insulating layer 8 formed to cover the first electrode 7. The first electrode 7 is a rectangular electrode formed to be slightly smaller than the cell space 3 partitioned by the partition walls 5.

The partition walls 5 are formed of polymer resin and are each composed of an upper partition wall 5b provided closer to the front substrate 1 and a lower partition wall 5a provided closer to the back substrate 2.

A second electrode 9 is formed between the upper partition wall 5b and the lower partition wall 5a. The second electrode 9 is a common electrode having the same electric potential for every pixel. Like the partition walls 5, the second electrodes 9 are formed in the vertical direction (Y direction) and the horizontal direction (X direction) in a criss-crossed fashion, so as to enclose the cell space of each pixel.

The second electrodes 9 are provided at a distance from the bottom of the cell space 3 towards the front substrate 1 corresponding to the height h1 of the lower partition wall 5a.

Voltage for driving the colored particles 4 is applied across the first electrodes 7 and the second electrodes 9 by the driving unit 10.

When the driving unit 10 applies voltage across the first electrodes 7 and the second electrodes 9, the colored particles 4 flow within the cell spaces 3 so that an image is displayed towards the front substrate 1 (in the Z direction).

Figure 5:
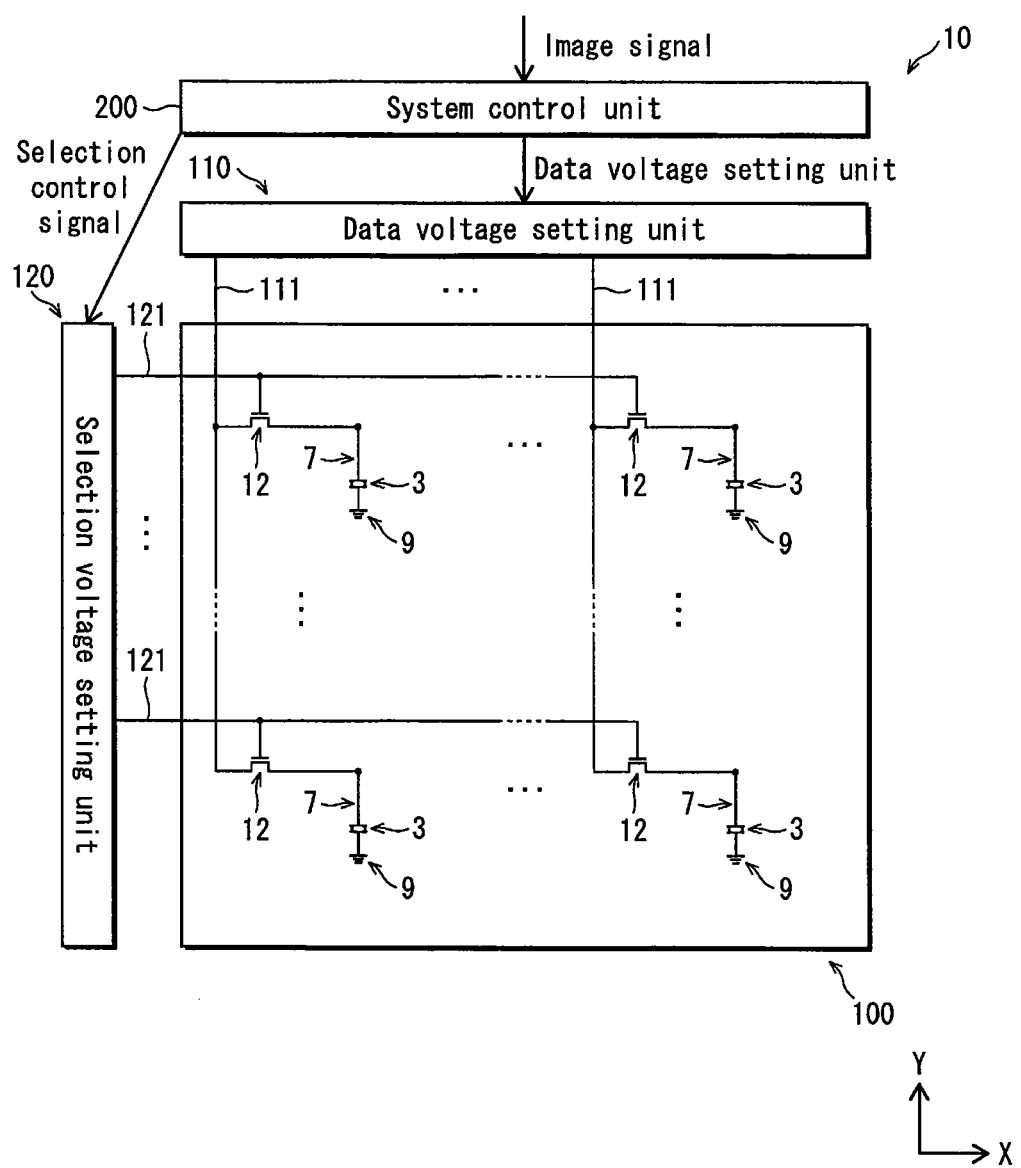
FIG. 5 shows an example of the structure of the driving unit.

While not shown in FIGS. 1 and 2, a switch element composing the driving unit 10 is formed on the back substrate 2 of the display panel 100. For example, as shown in FIG. 5, a TFT element 12 is formed for each pixel and is electrically connected to the first electrode 7.

Since it is necessary to extract light from the front substrate 1, the front substrate 1 may be formed from a transparent glass material such as borosilicate alkali glass, soda-lime glass, or the like. A transparent resin film such as PEN, PES, PET, or the like may also be used.

The back substrate 2 may be formed from a glass material such as borosilicate alkali glass, soda-lime glass, or the like. A resin film such as PEN, PES, PET, or the like, or a gold film of stainless steel may also be used.

The first electrodes 7 are formed from a transparent electrode material such as Indium Tin Oxide (ITO), Indium Zinc Oxide (IZO), or the like.

The insulating layer 8 is formed from a polycarbonate charge transport material used for electrophotographic photoreceptors and is a colorless, transparent resin material that allows visible light to pass through.

The front substrate 1, the insulating layer 8, and the first electrodes 7 are thus all transparent with respect to visible light. Therefore, the white reflective layer 6 can be seen from the front of the panel through regions of the insulating layer 8 not covered by the colored particles 4.

The second electrodes 9 are formed from a conductive metal such as Cr/Al/Cr, Cr/Cu/Cr, Ti/Al/Ti, or the like. The reason for adopting a sandwich structure with Al or Cu between Cr or Ti is that using Al or Cu, which are low-resistance materials, as the core material increases conductivity of the electrodes, and using Cr and Ti both increases adhesion between the partition walls 5 and the core material and prevents a reduction in contrast by acting as an antireflective film.

FIG. 2 is an enlarged cross-section diagram schematically showing the colored particles 4 attached to the insulating layer 8.

As shown in FIG. 2, the colored particles 4 are composite fine particles composed of a core particle 4a and surface particles 4b covering the surface of the core particle 4a. The colored particles 4 have a positive electrostatic charge.

The core particles 4a are formed by a base of a spherical particle polymer MBX-5 (average particle diameter of 5 μm), produced by Sekisui Plastics Co., Ltd., or Chemisnow MX-5 (average particle diameter of 5 μm), produced by Soken Chemical and Engineering Co., Ltd. The base is colored with black pigment or the like. The surface particles 4b are electrostatically treated monodisperse silica particles having an average diameter of 16 nm, thus endowing the colored particles 4 with an electrostatic charge property.

The core particles 4a are acrylic, having a small true specific gravity of 1.2 g/cm$^3$ and a low softening point. On the other hand, the surface particles have a larger true specific gravity, 2.1 g/cm$^3$, than the core particles, but are small in proportion and therefore have little effect on the overall particles. Furthermore, as compared to the core particles, the surface particles have a high softening point, making it easy to attach the surface particles to the core particles by a mechanochemical or other method.

A styrenic, melamine, or other resin material may also be used for the core particles 4a. Silica is used for the surface particles 4b because it allows for stable electrostatic treatment with a silane coupling agent to obtain a large electrostatic charge.

The insulating layer 8 formed as above from charge transport material changes electrostatic state based on the relationship between a reference voltage Vo (=Vgnd) applied to the second electrode 9 and a positive or negative voltage applied to the first electrode 7. In response to this electrostatic state, the positively charged colored particles 4 move to the left or right above the insulating layer 8, resulting in a change in the proportion of colored particles 4 covering the insulating layer 8 (i.e. the proportion of the colored particles 4 covering the white reflective layer 6).

As shown in FIG. 2, on the surface of the insulating layer 8, it is preferable to provide a surface-treated layer 8b having minute protrusions formed thereon.

<Driving Unit 10>

FIG. 5 shows an example of the structure of the driving unit 10.

In order to drive the display element in each pixel, the driving unit 10 is provided with a data voltage setting unit 110 and a selection voltage setting unit 120, as well as with a system control unit 200.

The system control unit 200 transmits a data control signal and an image signal to the data voltage setting unit 110, the data control signal indicating the time at which to apply data voltage, and transmits a selection control signal to the selection voltage setting unit 120 to indicate the time at which to apply selection voltage.

Based on the data control signal, the selection control signal, and a power supply control signal transmitted by the system control unit 200, the data voltage setting unit 110 and the selection voltage setting unit 120 apply data voltage, selection voltage, and power supply voltage to each of the pixels in the display panel 100 in order to perform display operations.

As described above, a TFT element 12 is provided in each cell space 3 of the matrix of cell spaces 3 in the display panel 100.

A plurality of data lines 111 extend in the vertical direction (Y direction) from the data voltage setting unit 110 in order to apply data voltage to each semiconductor switching element 12, whereas a plurality of selection lines 121 extend in the horizontal direction (X direction) from the selection voltage setting unit 120 in order to apply selection voltage to each semiconductor switching element 12.

The driving unit 10 is structured to allow for a reset voltage V+r (+50 V) to be applied to the first electrode 7 in each pixel. Note that the reset voltage V+r may be applied to the first electrodes 7 from the data voltage setting unit 110 via the plurality of data lines 111 and TFT elements 12, or separate reset voltage lines may be provided.

These lines 111 and 121 are formed along the surface of the back substrate 2.

Structure of Switching Element in Each Pixel

As shown in FIG. 5, in the TFT element 12 provided in correspondence with each cell space 3, the gate electrode is connected to the selection line 121, one S/D electrode is connected to the data line 111, and the other S/D electrode is connected to the first electrode 7, so that driving voltage can be applied to the first electrode 7.

Note that the second electrodes 9, which are one electrode common to the entire panel, are connected at a constant standard potential Vo (=Vgnd).

Operations of the driving unit 10 are described next.

An image signal transmitted by the system control unit 200 is mainly for displaying a still image. An image signal for one frame is composed of luminance signals (white, intermediate, and black) corresponding to each pixel in the display panel 100.

Upon receiving the image signal, the system control unit 200 applies a positive reset voltage V+r to the first electrode 7 in all of the pixels at once.

Next, in accordance with the image signal, the system control unit 200 transmits a data control signal to the data voltage setting unit 110 and a selection control signal to the selection voltage setting unit 120 in order to drive the display element in each pixel via the setting units 110 and 120 and display an image.

Specifically, while successively applying selection voltage to the plurality of selection lines 121 through the selection voltage setting unit 120, the system control unit 200 applies positive or negative data voltage to the plurality of data lines 111 through the data voltage setting unit 110, the data voltage corresponding in size to a display concentration based on the image signal.

This data voltage is set to an appropriate value for different displays: 1. for pixels to display white, V+ (+40 V); 2. for pixels to display black, V− (−40 V); 3. for pixels to display a halftone, a voltage Vm− (having an absolute value of 35 V or less) that is a smaller absolute value than the negative voltage V− during black display.

Note that due to the above reset operation, all of the pixels are already displaying white, and therefore the application of the data voltage V+ to pixels to display white may be omitted.

With the above operations, in each pixel on the selection line 121 to which the selection voltage Vs is applied, the above data voltage VD is applied to the first electrode 7, so that each pixel is written based on the image signal. Therefore, by successively scanning the selection line, all of the pixels in the display panel 100 are written.

In this way, based on the image signal, each pixel in the display panel 100 displays white, a halftone, or black, thereby displaying one frame of an image.

After writing, the image display state is maintained even without applying voltage to each first electrode 7, due to van der Waals forces.

Accordingly, the text screen or still image of an electronic book can be displayed over an extended time with little power consumption.

Next, when an image signal for displaying new contents is transmitted, the system control unit 200 performs a reset operation and a writing operation, as above.

<Operations of Each Pixel in the Display Panel>

Figure 3:
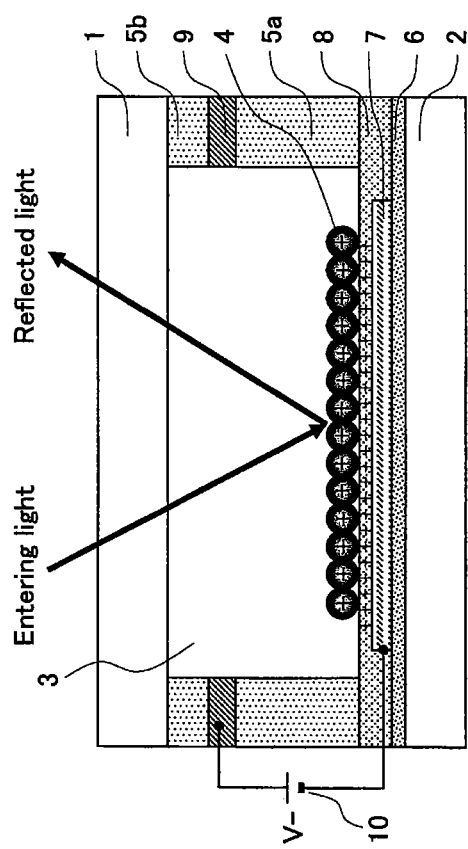
FIG. 3 is a partial cross-section diagram showing a black display state of the display panel according to Embodiment 1-1.
Figure 4:
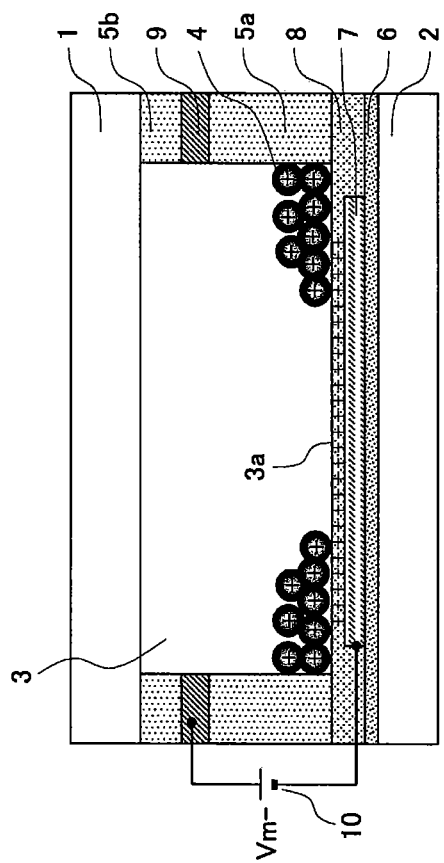
FIG. 4 is a partial cross-section diagram showing a halftone display state of the display panel according to Embodiment 1-1.

With reference to FIGS. 1, 3, and 4, the following describes operations of each pixel in the display panel 100 upon the above-described application of driving voltage on the display panel 100 by the driving unit 10.

1. Pixels Displaying White

In a pixel that is to display white, the positive voltage V+ is applied to the first electrode 7, whereby an electrical field is formed from the first electrode 7 towards the second electrode 9. The colored particles 4 (with a positive electrostatic charge) above the insulating layer 8 are thus forced towards the side of the partition walls 5 (the second electrode 9), as shown in FIG. 1A, thereby exposing the insulating layer 8. Accordingly, light that enters from the front of the panel traverses the insulating layer 8 and the first electrode 7, which are made of transparent material, without being blocked by the colored particles 4, reflects off the white reflective layer 6, and is emitted from the front of the panel, thus yielding a white display state.

Since an adhesive force, mainly due to van der Waals forces, is produced between the colored particles 4 and the side of the partition walls 5, this white display state is maintained until driving voltage is next applied to the first electrode 7, even if the positive voltage applied by the driving unit 10 is suspended.

2. Pixels Displaying Black

In a pixel that is to display black, the negative voltage V− is applied to the first electrode 7 by the driving unit 10, whereby a negative electrical charge prevails along the surface of the insulating layer 8. The colored particles 4 with a positive electrostatic charge are thus attracted towards the first electrode 7, as shown in FIG. 3, thereby becoming unevenly distributed to cover the insulating layer 8. As a result, in this pixel, the entire white reflective layer 6 is covered by the black-colored particles 4, thus yielding a black display state.

Since a strong adhesive force, mainly due to van der Waals forces, is produced between the colored particles 4 and the insulating layer 8, this black display state is maintained until driving voltage is next applied to the first electrode 7, even if the negative voltage applied by the driving unit 10 is suspended.

3. Halftone Display

In a pixel that is to display a halftone, the voltage Vm− that is relatively low is applied to the first electrode 7 by the driving unit 10, whereby an electrical field is formed from the second electrode 9 to the first electrode 7 as during the above black display. Since the resulting electrical energy density is small, however, the amount of negative electrical charge along the surface of the insulating layer 8 is smaller than during black display. Therefore, as shown in FIG. 4, a portion of the positively charged colored particles 4 separates from the partition walls 5 and is attracted towards the first electrode 7, so that a portion of the insulating layer 8 is covered by the black-colored particles 4. The result is a halftone display that combines the white reflective layer 6 with the black-colored particles 4.

In the same way as during white display and black display, since a strong adhesive force, mainly due to van der Waals forces, is produced between the colored particles 4 and the side of the partition walls 5, or between the colored particles 4 and the insulating layer 8, this halftone display state is maintained until driving voltage is next applied to the first electrode 7, even if the negative voltage applied by the driving unit 10 is suspended.

In the above way, based on the value of voltage applied by the driving unit 10, each pixel forming the display panel displays white, a halftone, or black, thereby displaying one frame of an image. The display image is maintained even if the driving voltage is suspended.

Note that before displaying an image as described above, it is preferable for all of the pixels in the display panel 100 to be set to a white display state by applying a positive reset voltage V+r that is 10%-20% larger than the voltage V+ applied to the first electrode 7 during normal white display.

With this reset operation, as during the above white display, the colored particles 4 (with a positive electrostatic charge) in the cell space 3 are forced towards the side of the partition walls 5 (by the second electrode 9), and since a stronger electrical field is formed between the first electrode 7 and the second electrode 9, any colored particles 4 remaining in the central region of the cell space are removed, and the colored particles 4 are reliably collected along the partition walls 5. Therefore, over a long period of time, it is possible to continually achieve display with a high degree of reflection and high contrast. This structure also prevents burn-in whereby colored particles 4 remain attached to the insulating layer 8.

<Advantageous Effects of the Display Device According to the Present Embodiment>

As shown in FIG. 1B, in plan view of the X-Y plane, the first electrode 7 is a rectangular electrode that is slightly smaller than the size of the cell space 3 partitioned by the partition walls 5. Therefore, while the outer edge of the first electrode 7 and the inner edge of the second electrode 9 are near each other, the first electrode 7 and the second electrode 9 are separated in the Z direction by a distance h1, as shown in FIG. 1A. Accordingly, when voltage is applied between the first electrode 7 and the second electrode 9, an electrical field that is even in the Z direction forms along the side of the lower partition wall 5a in the space between the first electrode 7 and the second electrode 9.

Even if the applied voltage is relatively small, the colored particles attach evenly to the side of the lower partition wall 5a in this region. Therefore, by guaranteeing the distance h1 between the outer peripheral edge of the first electrode 7 and the second electrode 9, the colored particles enclosed in the cell space do not remain in the central region of the pixel, but rather move to the side of the lower partition walls 5a, thereby exposing the bottom surface 3a of the cell space 3 to a great degree. This structure therefore achieves display with a high degree of reflection and high contrast.

To sufficiently achieve this advantageous effect, the separation distance h1 in the Z direction between the first electrode 7 and the second electrode 9 is preferably at least $\frac{1}{5}$ a height H of the partition walls 5 including the second electrode 9 (h1≥$\frac{1}{5}$×H).

Furthermore, in the display panel 100, since the colored particles 4 are enclosed in a gas in the cell space 3, while a voltage of a certain magnitude is necessary to begin movement, the colored particles move more quickly after movement begins than in an electrophoretic display device in which colored particles move within a liquid.

Accordingly, the colored particles 4 in the cell space 3 remain stably at rest when driving voltage is not applied and also move quickly when driving voltage is applied. This achieves a display that is both stable and rapid.

The gas, such as air, that is enclosed in the cell space 3 has a refractive index of approximately one. Therefore, good optical characteristics are obtained, in particular an excellent white display, as compared to when the particles are enclosed in an insulating transparent liquid used in an electrophoretic system, such as silicon oil (refractive index of 1.4).

The second electrodes 9 are one common electrode with a common potential in every pixel, and therefore are formed with a simple method using a conductive film or the like. Accordingly, the display panel can be manufactured relatively simply.

Note that the display device of the present embodiment achieves particularly good optical characteristics and rapid operations by enclosing a gas in the cell space 3. The degree of reflection and contrast are also improved, however, when using a liquid in the cell space 3.

Example 1

The following describes an example of a method of manufacturing the display panel 100.

Manufacturing the Back Substrate 2

The white reflective layer 6, which is formed from a titanium oxide (titania) film, is coated, printed, cold sprayed, or the like on the back substrate 2, which is formed from alkali-free glass, so as to be formed on the surface necessary for image display, i.e. almost the entire surface of the substrate except for the peripheral portion thereof.

Next, a thin film is formed from ITO, which is a transparent conductive material, by sputtering, vapor deposition, or the like, and a predetermined rectangular shape is patterned by a process such as lithography or etching in order to form the first electrode 7. Polycarbonate charge transport material that is dissolved in a solvent is then coated or printed to form the insulating layer 8 on almost the entire substrate, except for the peripheral portion thereof. The surface-treated layer 8b, having protrusions on the surface thereof, is formed on the surface of the insulating layer 8 as indicated below.

Formation of the Surface-Treated Layer 8b

A coating agent formed by dispersing $TiO_2$ particles in a medium is coated on the surface of the insulating layer 8 to form the surface-treated layer 8b.

When the medium for the coating agent is water, it is preferable to use $TiO_2$ particles with an anatase crystal structure. On the other hand, when using an organic medium, the $TiO_2$ particles need not have an anatase crystal structure, and instead may be a rutile type or amorphous.

Specifically, the surface-treated layer 8b is formed, as shown in FIG. 2, by coating the surface 8a of the insulating layer 8a with a coating agent formed by dispersing $TiO_2$ particles in a medium in which polycarbonate powder is melted in a cyclic ether solvent THF. This surface-treated layer 8b is formed by a $TiO_2$ particle layer and a polycarbonate layer that is exposed on the uppermost surface.

The reason for selecting polycarbonate as the medium for the surface-treated layer 8b is that polycarbonate is located relatively close to acrylic resin (PMMA), the structural material for the colored particles 4, in the triboelectric series. In other words, since the colored particles 4 and the surface-treated layer 8b have similar electrostatic characteristics, the electrostatic force operating between the two is reduced. Therefore, when voltage is actually applied to the first electrode 7, the colored particles 4 smoothly move within the cell space 3. Note that it has been confirmed by experiment that good voltage characteristics are actually obtained with this structure.

The surface-treated layer 8b thus formed is firm, has a high degree of transparency, and is a uniform layer, with agglomerations of $TiO_2$ particles being relatively rare, and layered particles having an even particle diameter distribution. The layer is approximately 100 nm thick.

Depending on the type or amount of $TiO_2$ particles used in the coating agent, conductivity of the surface-treated layer 8b that is formed can be adjusted.

By thus forming the surface-treated layer 8b on the surface of the insulating layer 8, the van der Waals forces operating between the insulating layer 8 and the colored particles 4 are reduced, thus allowing for the colored particles 4 to be removed from the insulating layer 8 with a low applied voltage.

The $TiO_2$ particles used for the coating agent are 30 nm in diameter, smaller than the colored particles 4 that are 5 μm in diameter. The reason for adopting this size is that if particles having a larger diameter than the colored particles 4 are used to form the surface-treated layer 8b, the protrusions formed on the surface-treated layer 8b become large, and the colored particles 4 end up attaching between the protrusions, thus eliminating the advantageous effect of reducing the van der Waals forces.

By using particles with a smaller diameter than the colored particles 4, the average interval between protrusions on the surface-treated layer 8b is smaller than the average particle diameter of the colored particles 4. The van der Waals forces that act between the colored particles 4 and the insulating layer 8 are thus reliably reduced, allowing for the colored particles 4 to be removed from the insulating layer 8 with a low driving voltage. For the same reason, it is preferable that the protrusions on the surface-treated layer 8b be formed evenly across the entire surface of the layer. Specifically, it is preferable to form the surface-treated layer 8b to have no gaps larger than the diameter (5 μm) of the colored particles 4.

The thickness of the insulating layer 8 in the present embodiment is set to 15 μm so that dielectric breakdown due to voltage application will not occur.

This sort of surface-treated layer 8b may be formed not only on the insulating layer 8, but also on the surface of the partition walls 5 and the second electrodes 9. By doing so, conditions such as electric resistance, electrostatic charge property, and shape are uniform across the entire surface of the cell space 3, yielding nearly the same voltage characteristics as the colored particles 4 attached to the surface-treated layer 8b and achieving good display characteristics during driving.

Next, using a method such as photolithography, the lower partition walls 5a are formed in a criss-cross fashion in accordance with pixel size. The dimensions of the lower partition walls 5a are a pitch of 300 μm, width of 10 μm, and height h1 of 20 μm.

This concludes formation of the white reflective layer 6, the first electrodes 7, the insulating layer 8, and the lower partition walls 5a on the back substrate 2.

Manufacturing the Front Substrate 1

The upper partition walls 5b are formed on the front substrate 1, which is formed from alkalifree glass. The upper partition walls 5b are formed with the same method as the lower partition walls 5a, in the same shape, at the same pitch, and with the same width. The height of the upper partition walls 5b, however, is 5 μm. Next, by screen printing, an inkjet method, a dispenser method, or the like, the upper partition walls 5b formed in a criss-cross fashion are coated with a paste having Ag as a primary component, and then are dried and burned to form the second electrodes 9 to a height of 5 μm.

In this way, the upper partition walls 5b and the second electrodes 9 are formed on the front substrate 1.

Method of Manufacturing Colored Particles

The following describes a method of manufacturing the colored particles 4.

An appropriate method to manufacture the composite particles shown in FIG. 2 is to manufacture the core particles and then attach the surface particles thereto by a mechanochemical method.

The hybridization system by Nara Machinery Co., Ltd. is a device for fixing surface particles to core particles using a high-speed air flow impact method, which is a type of mechanochemical method. By using this device to cause the surface particles 4b, which are monodisperse silica particles, to impact and fix to the core particles 4a, which are polymer particles, in a high-speed air flow, the surface of the polymer particles is covered nearly evenly with monodisperse silica particles.

The proportion of the surface particles 4b covering the entire surface of the core particles 4a is set slightly larger than the theoretical proportion, with a weight ratio of core particles 4a to surface particles 4b of 100:3 or 100:5. In this context, the theoretical proportion is the value calculated assuming that the entire surface of the core particle 4a is covered by one layer of surface particles 4b. The reason for setting the proportion higher than the theoretical value is that with the high-speed air flow impact method, there is a limit to how uniform the layer of surface particles 4b can be formed, making it difficult to cover the entire surface of the core particle 4a with one layer of surface particles 4b.

Alternative methods of manufacturing composite particles include a one-time process such as suspension polymerization. However, in composite particles manufactured by suspension polymerization, a film of additives, used during the manufacturing process for the surface active agent or the like, forms on the surface of the surface particles. Therefore, the fluidity of the composite particles does not improve unless this film is removed by the high-speed air flow impact method or the like.

The colored particles 4 manufactured as above have a positive electrostatic charge. In order to maintain this charge amount constant, it is preferable to store the colored particles 4 in an atmosphere of dry air, dry nitrogen gas, or the like having a constant amount of moisture.

Panel Assembly Process

Colored particles 4 are spread nearly evenly in the spaces partitioned by the lower partition walls 5a for each pixel in the back substrate 2 manufactured as above. The back substrate 2 is then overlaid on the front substrate 1, and the periphery of the front substrate 1 is coated with an epoxy-based UV adhesive. The front substrate 1 and the back substrate 2 are aligned, so that the upper partition walls 5b and the second electrodes 9 along the front substrate 1 overlap the lower partition walls 5a along the back substrate 2, and are then exposed to UV light. The adhesive thereby hardens to complete assembly of the display panel.

It is preferable to assemble the display panel in a dry gas atmosphere (such as dry nitrogen) that has been desiccated to severely reduce moisture. By doing so, dry gas from which moisture has been removed is enclosed in the cell space 3 with the colored particles 4, and the amount of electrostatic charge of the colored particles 4 is maintained constant.

In the manufactured display panel 100, the height H of the entire partition wall 5, including the height h2 of the second electrode 9 (5 μm), is 30 and the height of the cell space 3 between the front substrate 1 and the back substrate 2 is the same. The separation distance h1 in the Z direction between the first electrode 7 and the second electrode 9 is 20 μm.

(Example of Driving the Display Device)

The display panel 100 manufactured as above according to Example 1 was connected to a drive circuit and driven with the following driving voltages.

Reset voltage V+r=+50 V
Voltage applied to pixels displaying black: V−=−40 V
Voltage applied to pixels displaying halftone: Vm−=−20 V
Voltage applied to pixels displaying white: V+=+40 V As a result, an excellent white color was obtained when displaying white.

Figure 6:
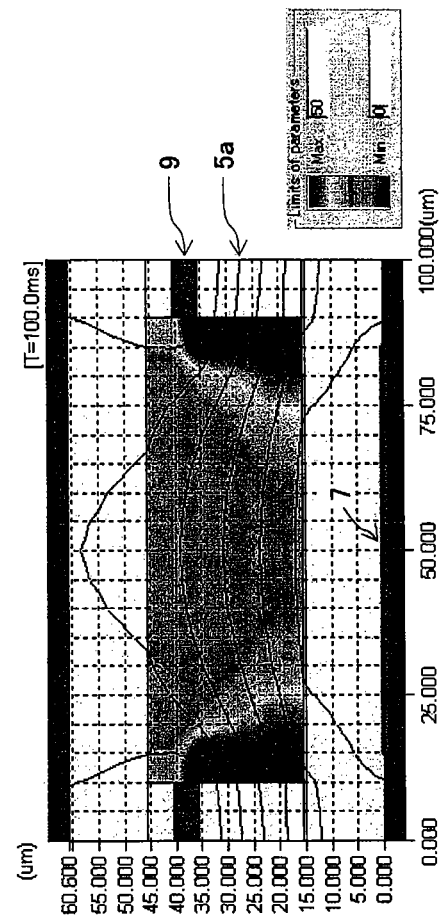
FIG. 6 shows a distribution of electric energy density when the display panel according to Example 1 displays white.

FIG. 6 shows the results of a simulation of equipotential surfaces and a distribution of electric energy density when the display panel 100 of the example displays white. Note that the electric energy density in each region is proportional to the square of the magnitude of the electrical field.

FIG. 6 shows that equipotential surfaces intersect the side of the partition wall 5 nearly perpendicularly at equal intervals, and that over a wide region along the side of the partition wall 5, an electric field with a uniform strength is formed. It is also clear that electric energy density is also uniform along the side of the partition wall 5.

Note that when using the colored particles 4 with the above-described particle diameter, in order for all of the colored particles 4 enclosed in the cell space 3 to attach to the side of the partition walls 5, it is necessary to guarantee a minimum of 5 μm-6 μm as the separation distance h1 in the Z direction between the first electrode 7 and the second electrode 9. With the height H (30 μm) of the partition walls 5 as a reference, this distance corresponds to approximately ⅕ H.

It is therefore preferable to set h1>⅕×H as described above.

If the film thickness (height) h2 in the Z direction of the second electrode 9 is set less than 5 μm, then it becomes difficult to move the colored particles 4 even if the driving voltage is increased. It is thus preferable to set h2 to be at least 5 μm. When the height H of the partition walls 5 is 30 μm, it is necessary to set the film thickness h2 in the Z direction to be 25 μm or less, in order to guarantee a separation distance h1 in the Z direction of at least 5 μm.

As described above, an advantageous effect of the composite particles and the surface-treated layer is to reduce the van der Waals forces occurring between the colored particles 4 on the one hand and the insulating layer 8 and the partition walls 5 on the other. Another advantageous effect is that the composite particles also improve anti-humidity characteristics.

With regards to this point, the change in amount of electrostatic charge was measured for composite particles and for acrylic polymerized toner at an atmospheric temperature of 45° C. by raising humidity from 50% to 90%. The composite particles only exhibited a reduction of approximately 15%, whereas the amount of electrostatic charge decreased 55% as compared to the initial value for the acrylic polymerized toner.

Modification to Example 1

Figure 21:
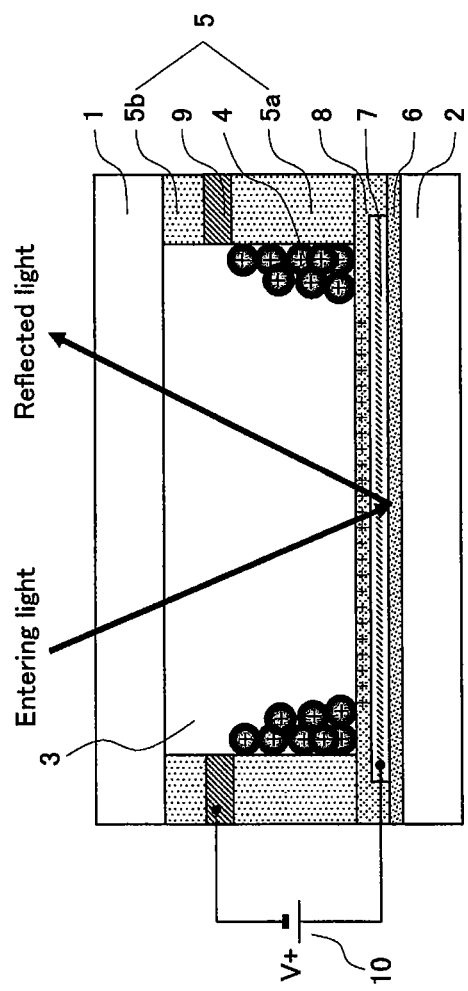
FIG. 21 is a partial cross-section diagram showing a modification of the display panel according to Embodiment 1-1.

In Example 1 shown in FIG. 1, the dimensions of the first electrode 7 are set to fit within the region of the cell space 3 on the inner side of the partition walls 5. As in the example shown in FIG. 21, however, the first electrode 7 may be formed to extend beyond the region of the cell space 3, so that in plan view from the front of the panel, the outer periphery of the first electrode 7 overlaps the second electrode 9.

In this modification, as in the display panel 100 in FIG. 1, a uniform electrical field forms along the side of the partition walls 5. Since the electric energy density grows higher, however, the driving voltage may be lowered. This advantageous effect is similar to the advantageous effect of forming the second electrode 9 to project from the side of the partition walls 5 as described below in Embodiment 1-2.

Comparative Example 1

Figure 7:
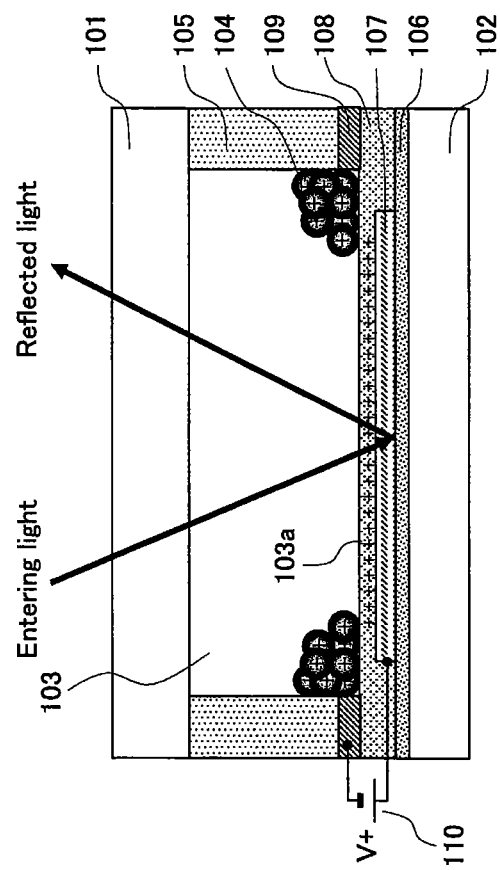
FIG. 7 is a partial cross-section diagram showing a white display state of an electrophoretic display device according to Comparative Example 1.

FIG. 7 is a partial cross-section diagram showing a pixel unit in an electrophoretic display device according to Comparative Example 1, illustrating a white display state.

In this display device, the basic panel structure, such as pixel size, is nearly the same as the display panel 100 in Example 1. Whereas the second electrodes 9 in the display panel 100 of Example 1 are separated from the insulating layer 8 at the back substrate 2 towards the front, in Comparative Example 1, the second electrodes are formed directly on an insulating layer 108 at a back substrate 102. Furthermore, colored particles are not covered by surface particles, the insulating layer 108 and the sides of the partition walls 105 are not surface treated, and the cell space 103 encloses a liquid. Voltage applied to the electrodes is that same as in Example 1.

In the panel in Comparative Example 1, the colored particles 104 agglomerate between the first electrode 107 and the second electrode 109, and a portion of the colored particles 104 attaches to the bottom surface 103a of the cell space 103, thus reducing the aperture ratio. As a result, the region displaying white via the white reflective layer 106 decreases and the black-colored particles 104 are visible, yielding a grayish-white color when attempting to display the color white.

Furthermore, when switching the voltage applied to the first electrode 107 from positive to negative in order to switch from white to black display, a portion of the colored particles 104 remained attached between the first electrode 107 and the second electrode 109. The number of black-colored particles 104 that can move thus decreases, preventing a sufficiently black display.

Consequently, the panel structure of Comparative Example 1 yielded a display with a low degree of reflection and contrast.

This result is considered to be because in Comparative Example 1, the electrical field was concentrated in a narrow region between the first electrode 107 and the second electrode 109, increasing the electric energy density.

Figure 8:
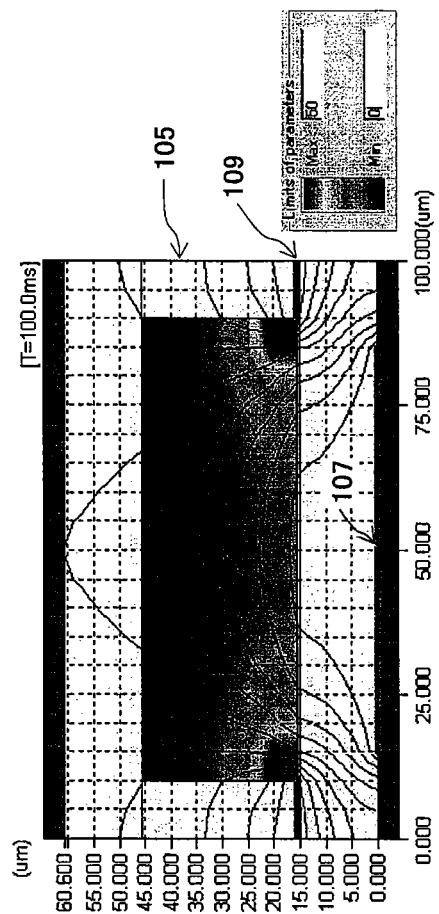
FIG. 8 shows a distribution of electric energy density when the electrophoretic display panel according to Comparative Example 1 displays white.

FIG. 8 shows equipotential lines and a distribution of electric energy density when the display panel of Comparative Example 1 displays white.

In the display panel 100 of Example 1, the maximum value of the electric energy density when applying +100 V to the first electrode 7 was 58.3 N/m$^2$, whereas in Comparative Example 1, the maximum value of the electric energy density when applying +100 V to the first electrode 107 was 66.2 N/m$^2$. Under the same conditions, the electric energy density was slightly larger.

It is considered that Comparative Example 1 has a lower threshold voltage for driving the colored particles 104. In practice, however, whereas the display panel 100 in Example 1 can be driven at ±40 V, with the panel structure of Comparative Example 1, a driving voltage of ±100 V is necessary. The reasons why the display panel 100 in Example 1 can be driven at a low voltage are considered to be the use of composite particles for the colored particles 4 and the surface treatment of the insulating layer 8 and the sides of the partition walls 5.

Comparative Example 2

Figure 9:
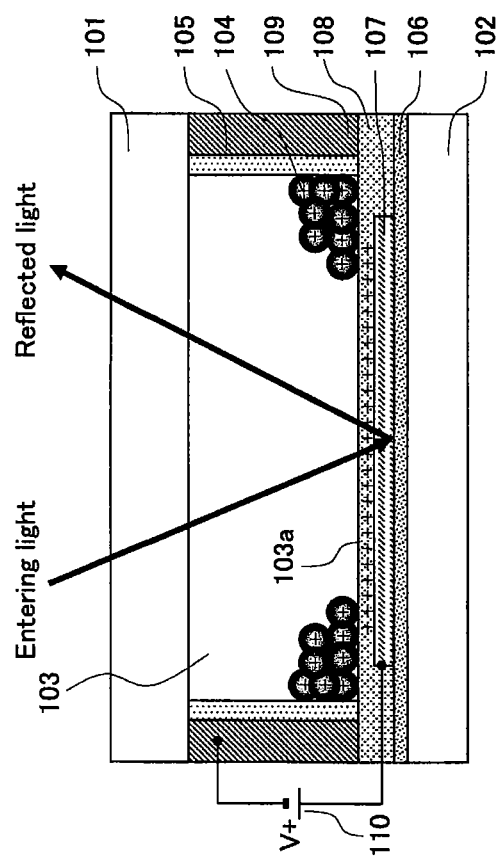
FIG. 9 is a partial cross-section diagram showing a white display state of an electrophoretic display device according to Comparative Example 2.

FIG. 9 is a partial cross-section diagram showing a pixel unit in an electrophoretic display device according to Comparative Example 2, illustrating a white display state.

Comparative Example 2 has the same panel structure as Comparative Example 1; only the structure of the second electrode differs. Specifically, in Comparative Example 2, partition walls 105 are composed of a conductive core material enclosed by an insulating layer. The core material is the second electrode 109, and the height of the second electrode 109 is the same as the height of the partition walls 105.

When driving Comparative Example 2, as in Comparative Example 1, the colored particles 104 agglomerate between the first electrode 107 and the second electrode 109, and a portion of the colored particles 104 attached to the bottom surface 103a. As a result, the aperture ratio was reduced when displaying white, thus reducing the region displaying white via the white reflective layer 106 and causing the black-colored particles 104 to become visible.

This result is considered to be because in Comparative Example 2 as well, the electrical field was concentrated in a narrow region between the first electrode 107 and the second electrode 109, increasing the electric energy density.

The amount of colored particles 104 attached in the central region of the cell space in Comparative Example 2 was slightly larger than in Comparative Example 1, yielding a more grayish-white color when attempting to display the color white.

When switching the voltage applied to the first electrode 107 from positive to negative in order to switch from white to black display, however, fewer of the colored particles 104 remained attached between the first electrode 107 and the second electrode 109 than in Comparative Example 1. A relatively stable black display was thus achieved.

Figure 10:
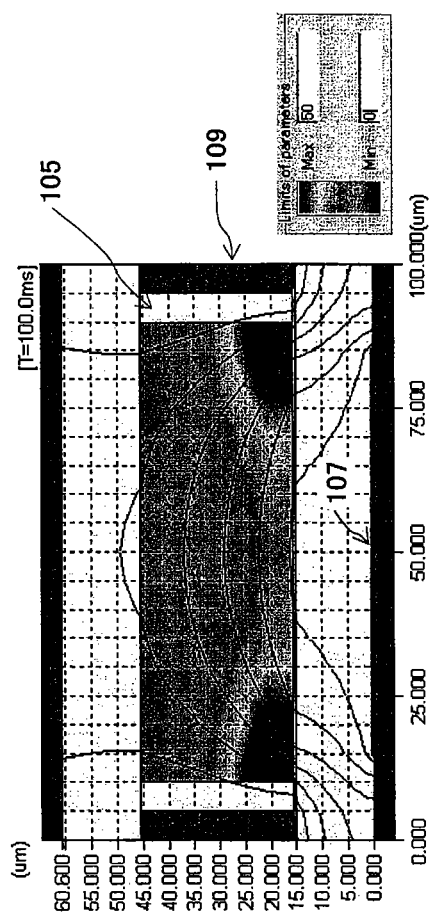
FIG. 10 shows a distribution of electric energy density when the electrophoretic display panel according to Comparative Example 2 displays white.

FIG. 10 shows equipotential lines and a distribution of electric energy density when the display panel of Comparative Example 2 displays white.

The maximum value of the electric energy density when applying +100 V to the first electrode 107 was 74.9 N/m$^2$, which is larger than the maximum value of the electric energy density under the same conditions in Comparative Example 1. While it is thought that Comparative Example 2 reduces the threshold voltage for driving the colored particles 104 as compared to Comparative Example 1, a large driving voltage of ±100 V was necessary.

Embodiment 1-2

Figure 11A:
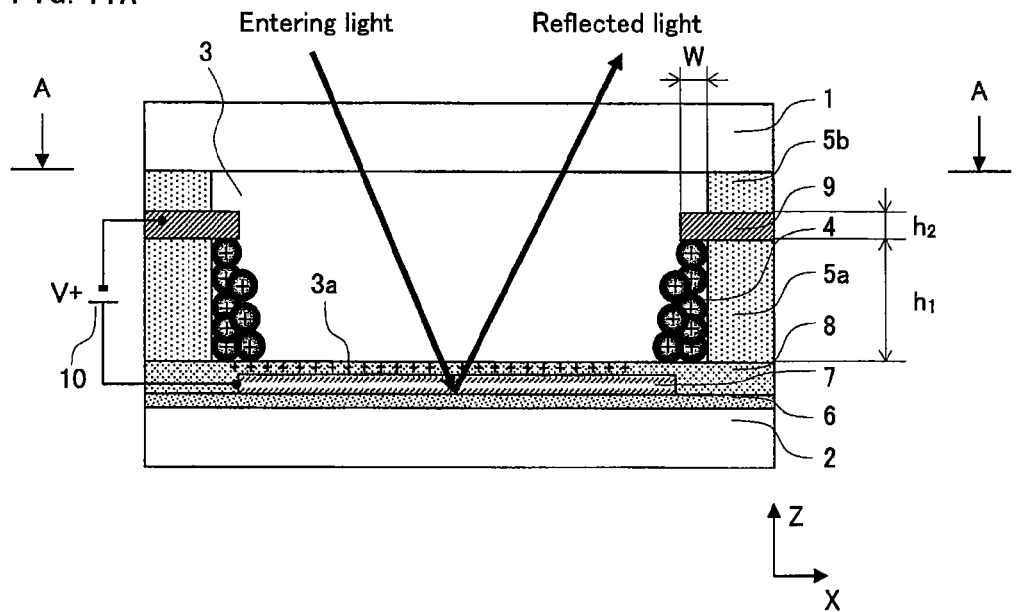
FIG. 11A is a partial cross-section diagram showing a white display state of the display panel according to Embodiment 1-2.
Figure 11B:
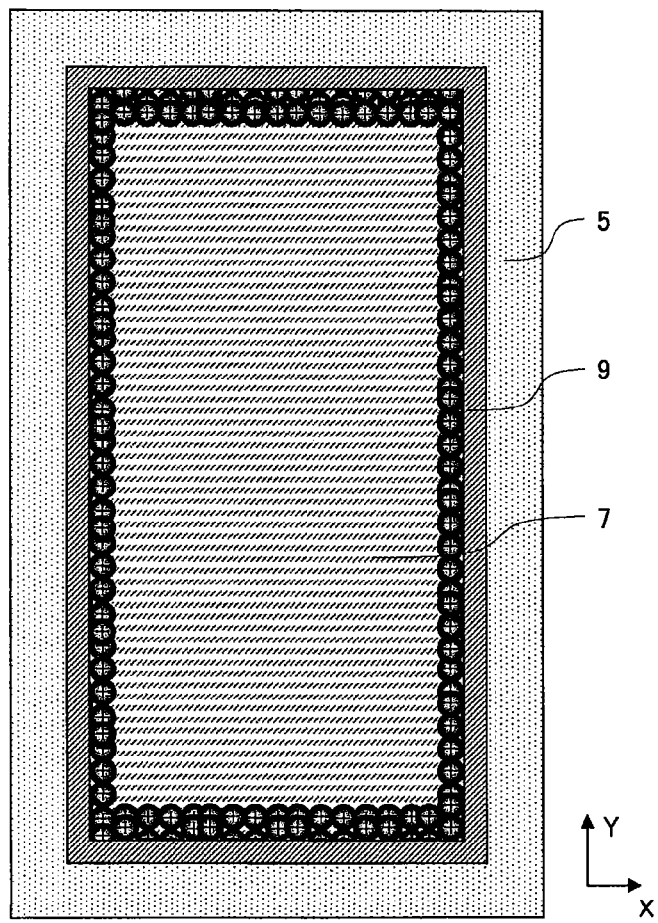

FIG. 11A is a partial cross-section diagram showing a pixel unit in a display device according to Embodiment 1-2, illustrating a white display state. FIG. 11B is a plan view of an A-A cross-section in FIG. 11A.

The difference in the display panel according to the present embodiment as compared to Embodiment 1-1 is that the second electrode 9 is formed to project from the side of the partition walls 5 towards the center of the cell space.

The advantageous effects of the display panel according to the present embodiment are basically similar to Embodiment 1-1. By applying voltage between the first electrode 7 and the second electrode 9, the distribution of electric energy density along the side of the partition walls 5 becomes uniform, and therefore the colored particles 4 attach evenly to the side of the partition walls 5. In the present embodiment, a higher electric energy density than in Embodiment 1-1 forms along the side of the partition walls 5, resulting in a better white color when displaying white.

Another similarity is that since the colored particles 4 are enclosed within a gas, while a voltage of a certain magnitude is necessary to begin movement, the colored particles move more quickly after movement begins.

Example 2

The pixel size in the display panel according to Example 2 is the same as in Example 1.

The height h2 of the second electrode 9 is 5 μm, as in Example 1, and the projection amount W from the side of the partition walls 5 is 5 μm.

Figure 12:
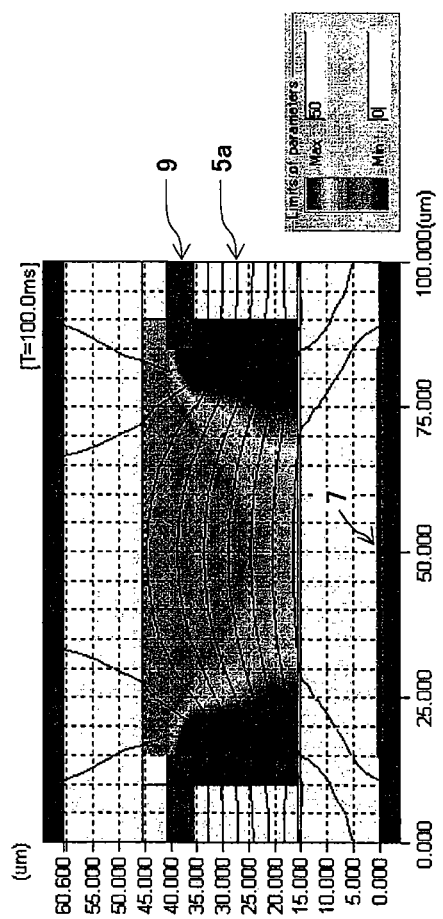
FIG. 12 shows equipotential lines and a distribution of electric energy density when the display panel according to Example 2 displays white.

FIG. 12 shows equipotential lines and a distribution of electric energy density when the display panel of Example 2 displays white.

Whereas the driving voltage in Example 1 is ±40 V, the driving voltage in Example 2 is reduced to ±30 V.

In the display panel of Example 2, the electric energy density produced by applying ±100 V to the first electrode 7 had a maximum value of 92.0 N/m$^2$. This is over 1.5 times the maximum value of 58.3 N/m$^2$ for the electric energy density in Example 1 under the same conditions.

The method of manufacturing the display panel according to Example 2 is the same as Example 1 through formation of the upper partition walls 5b on the front substrate 1 and of the lower partition walls 5a on the back substrate 2. The method of manufacturing the second electrode 9, however, greatly differs from Embodiment 1. A gold film mesh with holes corresponding to the shape of cell spaces is used.

With the method described in Example 1, if the second electrode is formed by screen printing, an inkjet method, a dispenser method, or the like on the partition walls 5 formed in a criss-cross fashion, then during drying and burning, the electrode contracts towards the center of the walls, making it difficult to cause the second electrode 9 to accurately project from the side of the partition walls 5. Such projection is possible, however, by using a gold film.

The gold film is processed to have holes along the X and Y directions in a matrix corresponding to the positions of pixels. The size of the holes is smaller than the size of the cell space 3. For example, in order to cause the second electrode to project 5 μm from the inner side of the cell space 3 (the side of the partition walls 5), the diameter of the hole should be 10 μm smaller than the inner dimensions of the cell space 3.

Figure 13:
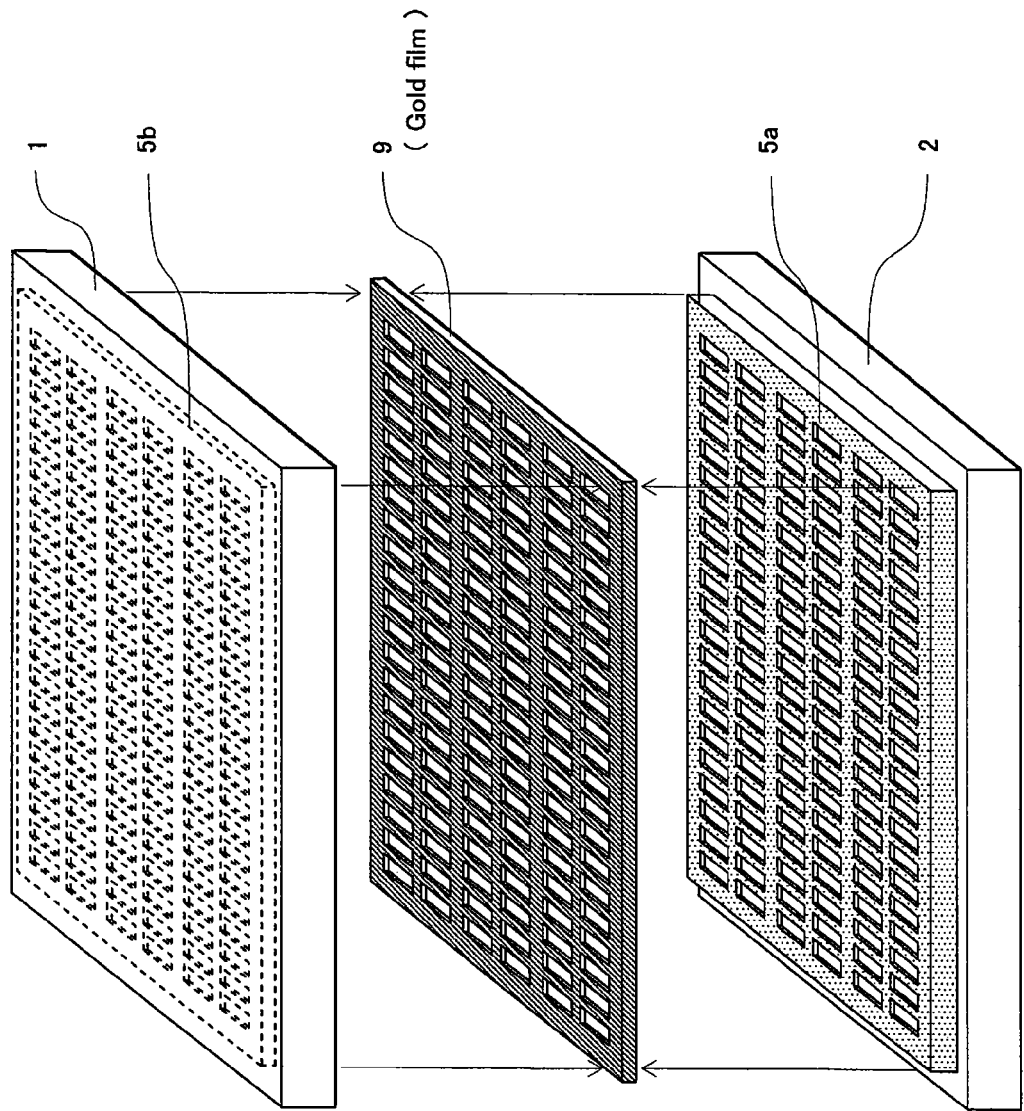
FIG. 13 is a perspective view illustrating the method of assembling the display panel according to Example 2.

FIG. 13 is a perspective view illustrating the method of assembling the display panel according to Example 2.

As shown in FIG. 13, the display panel is assembled by appropriately positioning the gold film mesh, which forms the second electrode 9, to sandwich the gold film mesh between the front substrate 1 formed through the upper partition walls 5b and the back substrate 2 formed through the lower partition walls 5a.

With this method, the second electrode 9 is accurately formed to project 5 μm towards the center of the pixel from the side of the partition walls 5.

Embodiment 1-3

Figure 14:
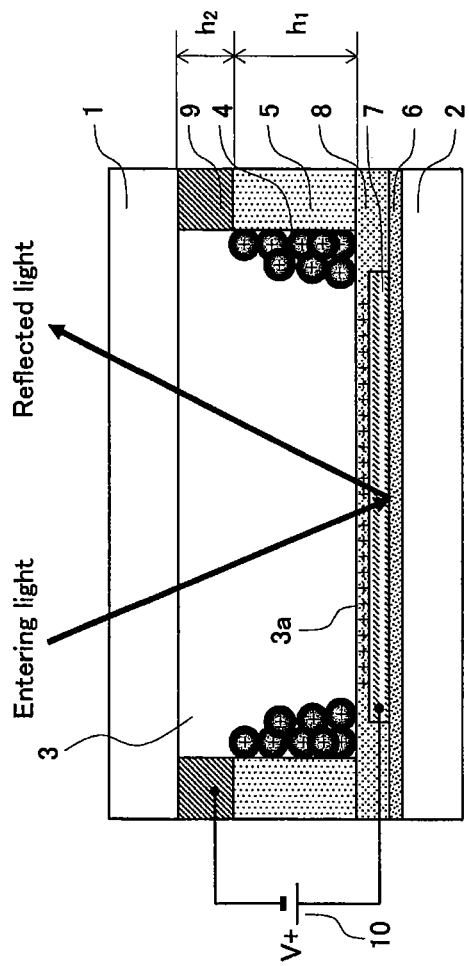

FIG. 14 is a partial cross-section diagram showing a pixel unit in a display device according to Embodiment 1-3, illustrating a white display state.

The display panel according to the present embodiment differs from Embodiment 1-1 in that no upper partition wall 5b is provided along the front substrate 1, and that the height of the second electrode 9 is increased.

In the present embodiment as well, as in Embodiment 1-1, the distribution of the electric energy density formed by applying voltage between the first electrode 7 and the second electrode 9 is nearly uniform along the side of the partition walls 5, and therefore the colored particles 4 attach evenly to the side of the partition walls 5.

Example 3a

The pixel size in the display panel of Example 3a is set the same as in the display panel of Example 1. The separation distance h1 in the Z direction between the first electrode 7 and the second electrode 9 is 20 μm, and the height h2 of the second electrode 9 is 10 μM. For the second electrode 9, a gold film mesh similar to Example 2 is used. This display panel was driven with a driving voltage of ±40 V, as in Example 1.

Figure 15:
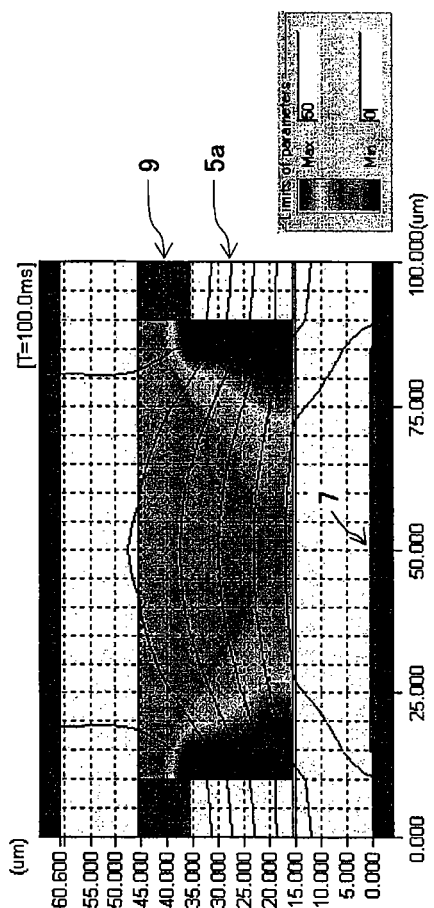
FIG. 15 shows a distribution of electric energy density when the display panel according to Example 3a displays white.

FIG. 15 shows equipotential lines and a distribution of electric energy density when the display panel of Example 3a displays white.

In Example 3a, the maximum value of the electric energy density when applying +100 V to the first electrode 7 was 55.5 N/m$^2$, a value slightly smaller but nearly equivalent to 58.3 N/m$^2$, the maximum value of the electric energy density when driving the display panel of Example 1 under the same conditions.

Note that with the rest of the structure being the same, when the width h2 of the second electrode 9 was reduced to 5 μm, the maximum value of the electric energy density under the same conditions was 40.3 N/m$^2$, and the display panel could be driven with a driving voltage of ±50 V. When the width h2 of the second electrode 9 was reduced to 1 μm, however, the maximum value of the electric energy density under the same conditions was 13.6 N/m$^2$, and the display panel could not be driven even with a driving voltage of ±100 V.

The method of manufacturing the display panel of Example 3a is similar to Example 2, but does not require formation of the upper partition walls 5b on the front substrate 1. The display panel is assembled by appropriately positioning the gold film mesh, which forms the second electrode 9, to sandwich the gold film mesh between the front substrate 1 and the back substrate 2 formed through the lower partition walls 5a.

Example 3b

Figure 16:
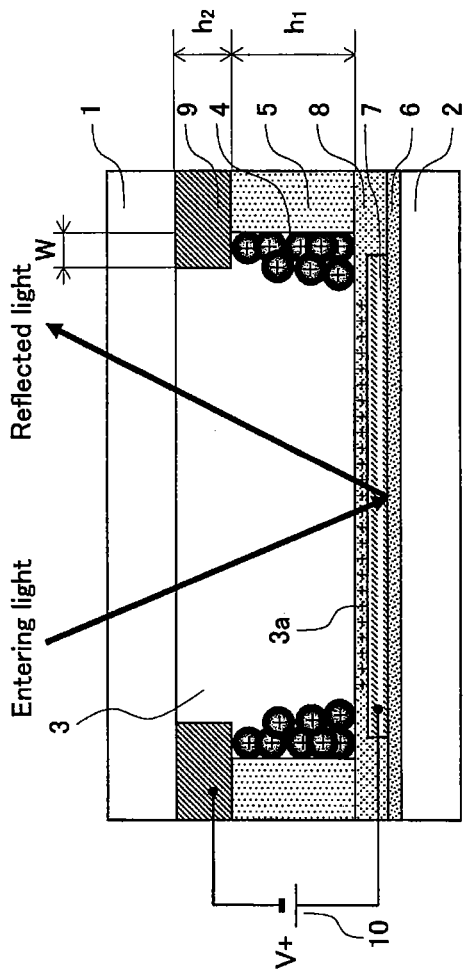
FIG. 16 is a partial cross-section diagram showing a white display state of the display panel according to Example 3b.

FIG. 16 is a partial cross-section diagram showing a pixel unit in a display device according to Example 3b, illustrating a white display state.

In Example 3b, as in Example 3a, the separation distance h1 in the Z direction between the first electrode 7 and the second electrode 9 is 20 μm, and the height h2 of the second electrode 9 is 10 μm. On the other hand, as in Example 2, the second electrode 9 projects towards the center of the pixel from the side of the lower partition walls 5a, and the projection amount W is 5 μm.

In Example 3b as well, by applying voltage between the first electrode 7 and the second electrode 9, a uniform electrical field forms in the Z direction along the side of the partition walls 5. The colored particles 4 therefore attach evenly to the side of the partition walls 5.

Figure 17:
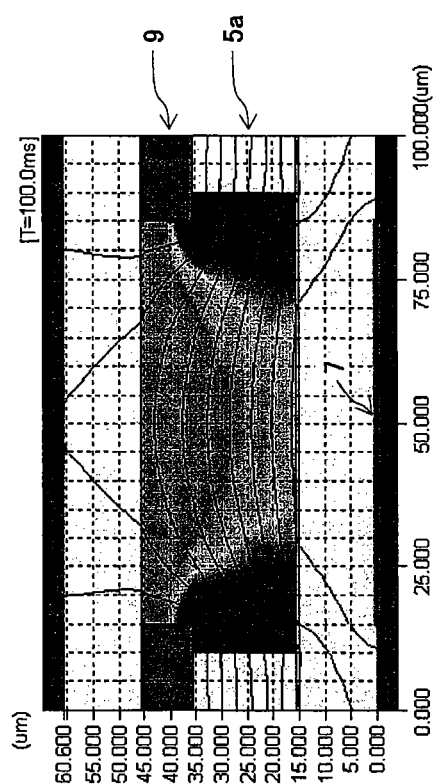
FIG. 17 shows a distribution of electric energy density when the display device according to Example 3b displays white.

FIG. 17 shows equipotential lines and a distribution of electric energy density when the display panel of Example 3b displays white.

In the present example, the maximum value of the electric energy density when applying +100 V to the first electrode 7 was 90.2 N/m$^2$, a value over 1.6 times the maximum value of 55.5 N/m$^2$ for the electric energy density in Example 3a of FIG. 14 under the same conditions. The driving voltage of ±40 V necessary in Example 3a was reduced to ±30 V.

Furthermore, as compared to the display panel in Example 2, the maximum value of the electric energy density under the same conditions was slightly smaller yet nearly equivalent.

Embodiment 1-4

Figure 18:
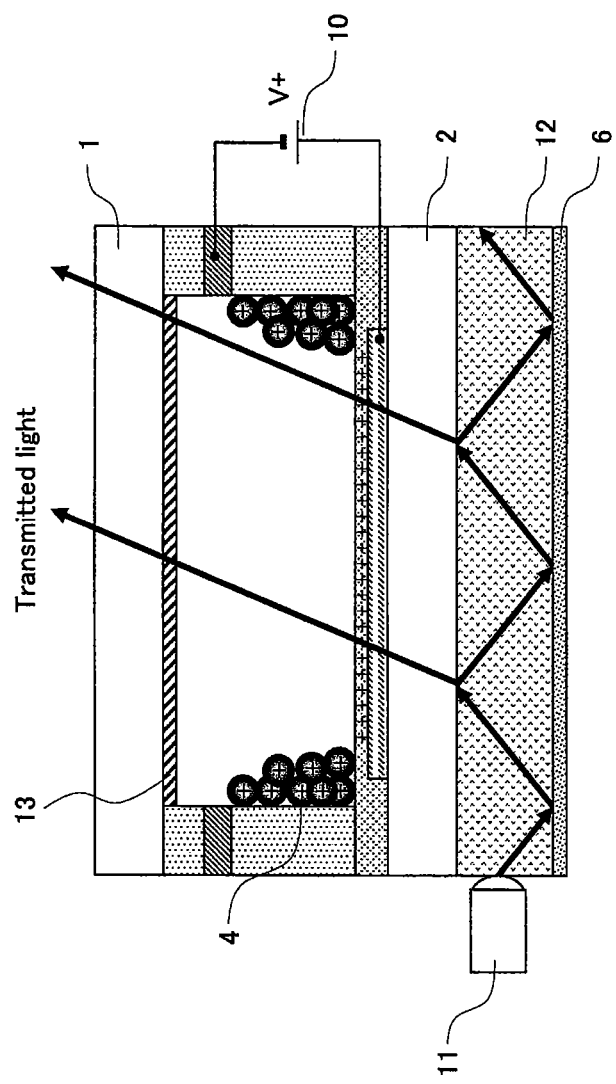
FIG. 18 is a partial cross-section diagram showing a white display state of the display panel according to Embodiment 1-4.

FIG. 18 is a partial cross-section diagram showing a pixel unit in a display device according to Embodiment 1-4.

The differences between the present Embodiment and Embodiment 1-1 are adoption of a transparent structure using a backlight, and formation of a color filter 13 on the back surface of the front substrate 1.

Specifically, in the display panel of the present embodiment, the structure of the front substrate 1, the back substrate 2, the first electrode 7, the second electrodes 9, the colored particles 4, and the like are the same as in Embodiment 1-1, whereas a backlight unit 30 is provided under the back substrate 2. This backlight unit 30 is composed of a lightguide 31, a light source 32, and a reflector 33 provided at the bottom of the lightguide 31. Light emitted from the light source 32 enters the lightguide 31 from an edge thereof and is repeatedly reflected between the reflector 33 and the back substrate 2. A portion of the light passes through the back substrate 2, the cell space 3, and the color filter 13 and is emitted from the front of the panel.

The color filter 13 is divided into three types, red (R), green (G), and blue (B), and is provided for each cell space. The shape of the sub-pixel of each color is, for example, a rectangle measuring 100 μm horizontally by 300 μm vertically. A combination of three sub-pixels, R, G, and B, is a rectangle measuring 300 μm both horizontally and vertically.

In such a display panel, the driving unit 10 applies voltage between the first electrode 7 and the second electrode 9 in accordance with a video signal, and in response to the voltage, the colored particles 4 behave in the same way as described in Embodiment 1-1, acting as a light shutter to adjust the amount of R, G, and B light.

Accordingly, the sub-pixels display gradations of the colors R, G, and B in accordance with image signals, thus achieving full-color display.

The transparent display device of the present embodiment also increases the pixel aperture ratio, thus achieving a bright display. Furthermore, the colored particles 4 move within a gas, allowing for a full-color video display with a fast response speed.

Note that the transparent display device of the present embodiment may be similarly embodied when adopting a structure for the second electrode 9 similar to Embodiment 1-2 or Embodiment 1-3.

Embodiment 1-5

The present embodiment is an example of applying the present invention to a display device that can switch between a first, light-emitting display element and a second, reflective display element.

Figure 19:
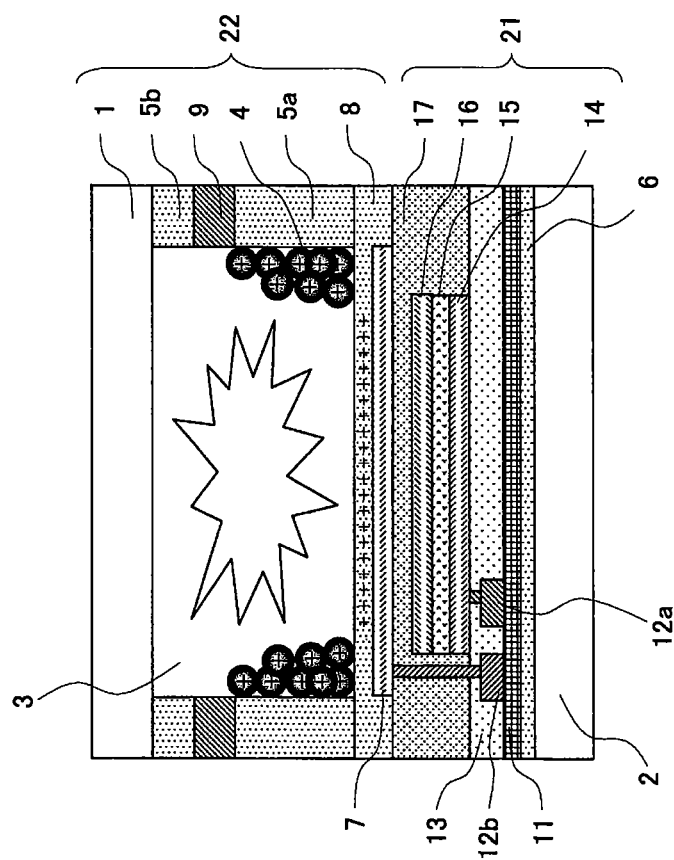
FIG. 19 is a partial cross-section diagram showing a light-emitting display mode of the display panel according to Embodiment 1-5.

FIG. 19 is a partial cross-section diagram showing the device structure of the display panel in the display device of the present embodiment, illustrating one pixel.

Each pixel in this display panel is provided with both a light-emitting display element 21 and a reflective display element 22. A display switching means (not shown in the figures) allows for switching between a mode that displays video with the light-emitting display element 21 and a mode that displays video with the reflective display element 22.

This structure takes advantage of both the characteristics of the light-emitting display element and the reflective display element to achieve display with excellent visibility both indoors and outdoors, with low power consumption.

In this display panel, the front substrate 1 and the back substrate 2 are disposed to face each other with a space therebetween. As shown in FIG. 19, in the space in each pixel, the light-emitting display element 21 is provided towards the back, with the reflective display element 22 stacked thereon towards the front.

By driving either the light-emitting display element 21 or the reflective display element 22, an image is displayed toward the front (in the Z direction) of the display panel. Note that FIG. 19 shows the display panel in light-emitting display mode.

As shown in FIG. 19, the white reflective layer 6 is formed on the back substrate 2, and a first insulating layer 11 is formed thereabove.

Semiconductor switching elements 12a and 12b, and a second insulating layer 13, are formed on the first insulating layer 11.

In addition to a low-temperature polysilicon TFT, a microcrystal silicon TFT or amorphous silicon TFT may be used as the semiconductor switching elements 12a and 12b. A transparent oxide semiconductor TFT such as ZnO, In—Ga—Zn—O (IGZO), or the like may be used as the semiconductor switching element 12a.

The components constituting the light-emitting display element 21 are a pixel electrode 14 located on the second insulating layer 13 and electrically connected to the semiconductor switching element 12a, a light-emitting layer 15, a counter electrode 16, and a sealing layer 17 that seals these components. The main components from the first insulating layer 11 through the sealing layer 17 form a transparent film that allows visible light to pass through.

The pixel electrode 14 corresponds to an anode, and the counter electrode 16 to a cathode. The pixel electrode 14 and the counter electrode 16 are both formed from transparent electrode material such as Indium Tin Oxide (ITO), Indium Zinc Oxide (IZO), or the like, and are both provided separately for each pixel. The light-emitting layer 15 sandwiched between the pixel electrode 14 and the counter electrode 16 is an organic EL layer formed from transparent, light-emitting material. When voltage is applied between the electrodes, the light-emitting layer 15 emits light of a color in accordance with the light-emitting material. This light-emitting layer 15 is extremely fragile with respect to moisture but is protected by being covered by the sealing layer 17. It is preferable for the sealing layer 17 to be dense and highly insulating, and it is preferable to use a silicon nitride film, or a silicon oxynitride film, with high light transmission.

On the other hand, the components constituting the reflective display element 22 are a first electrode 7, located on the sealing layer 17 and electrically connected to the semiconductor switching element 12a, and a third insulating layer 8. The first electrode 7 and the third insulating layer 8 are formed from a transparent material.

The structure from the first electrode 7 upwards is the same in as the display panel described in Embodiment 1-1. In combination with the white reflective layer 6, this structure yields the reflective display element 22.

The light-emitting display element 21 uses the semiconductor switching element 12a, and the reflective display element 22 uses the semiconductor switching element 12b, so that the display elements can be actively driven independently.

Specifically, the display device of the present embodiment includes a similar driving unit as the driving unit 10 described in Embodiment 1-1 to display an image by driving the reflective display element 22 based on a reflective image signal.

The display device of the present embodiment is also provided with a driving unit for driving the light-emitting display element 21, mainly to display video. The structure and operating principle of the driving unit are similar to a regular top-emission organic EL display.

However, when the light-emitting display mode is selected, a reset voltage is applied to the reflective display element 22, so that as shown in FIG. 19, the colored particles 4 collect by the side of the partition walls 5. As a result, the light from the light-emitting display element 21 passes through the reflective display element 22 and is emitted from the front of the panel.

Figure 20:
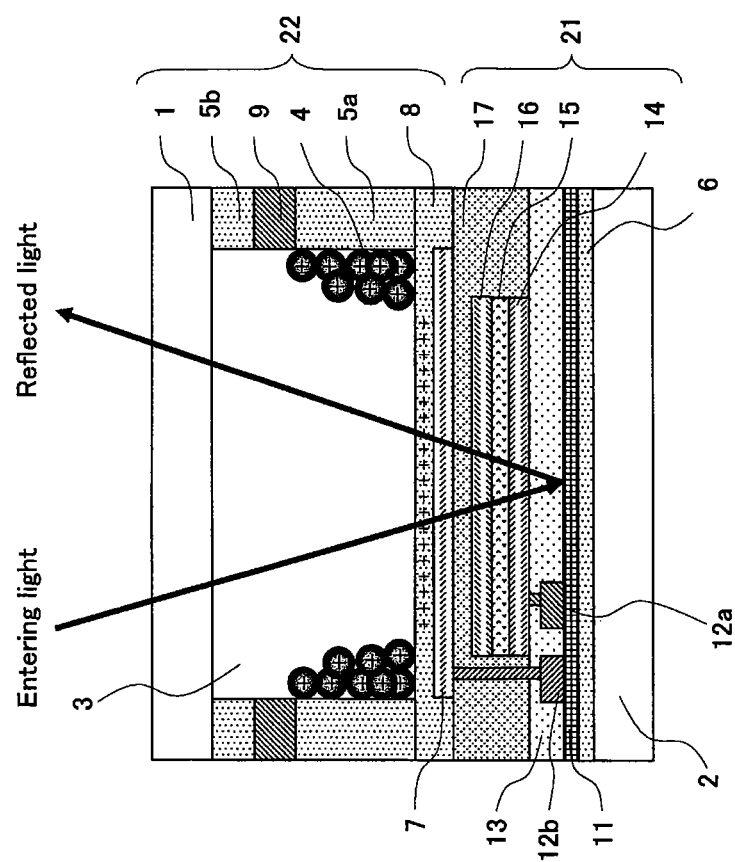
FIG. 20 is a partial cross-section diagram showing a reflective display mode of the display panel according to Embodiment 1-5.

FIG. 20 is a partial cross-section diagram showing a pixel unit in the display panel during reflective display mode.

When the reflective display mode is selected, the reflective display element 22 is driven by an operating principle similar to that described in Embodiment 1-1. During this mode, however, since driving voltage is not applied to the light-emitting display element 21, the light-emitting display element 21 is transparent. Accordingly, the white reflective layer 6 at the back of the light-emitting display element 21 can be used as a white reflective layer for the reflective display element 22.

In other words, in a pixel displaying white, a positive voltage V+ is applied to the first electrode 7, causing the colored particles 4 to collect by the side of the partition walls 5, so that light that enters through the front substrate 1 is reflected by the white reflective layer 6. The reflected light is emitted through the front of the panel to achieve white display. Black display and halftone display are also achieved by the same principles as described in Embodiment 1-1.

The main advantageous effect of the display device according to the present embodiment is that in each pixel, by providing the reflective display element 22 on top of the light-emitting display element 21 composed of the pixel electrode 14, the light-emitting layer 15, and the counter electrode 16, the area occupied by the light-emitting display element 21 and the reflective display element 22 in the pixel increases.

During reflective display mode, as described in Embodiment 1-1, white is displayed well, thus achieving a display with a high degree of reflection and high contrast.

In light-emitting display mode as well, the colored particles 4 remaining on the first electrode 7 are greatly decreased, thus increasing the aperture ratio of the reflective display element 22 and successfully emitting light from the light-emitting display element 21 towards the front of the panel. This achieves video display performance similar to a regular top-emission organic EL display.

In this way, the display device of the present embodiment achieves good image display with almost no reduction in image quality during both reflective display and light-emitting display.

Embodiment 2-1

The following describes a display device according to Embodiment 2-1.

This display device is composed of a driving unit and a display panel 220 in which a matrix of a plurality of pixels is arranged as a grid along the horizontal direction (X direction) and the vertical direction (Y direction).

Each pixel is, for example, a rectangle measuring 100 µm in the horizontal direction by 300 µm in the vertical direction.

Figure 22:
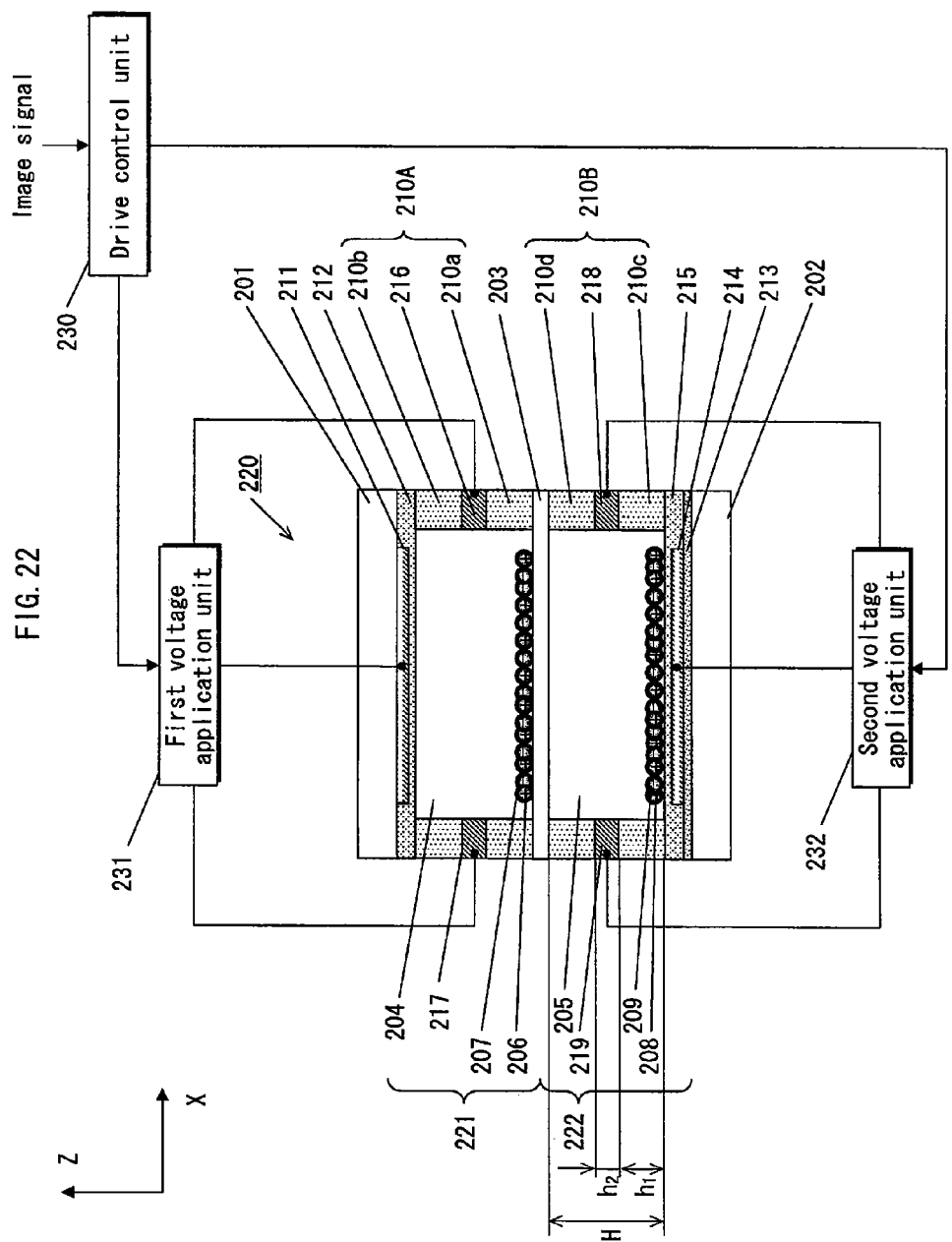
FIG. 22 shows the structure of a display device according to Embodiment 2-1.

FIG. 22 shows the structure of a display device according to Embodiment 2-1, representatively illustrating a partial cross-section of one pixel (unit of display) in the display panel 220. Also shown are a drive control unit 230, a first voltage application unit 231, a second voltage application unit 232, and the like, which constitute the driving unit.

FIGS. 23-29 show the state of a pixel unit in the display panel 220 during each of the following: white display, black display, blue display, red display, green display, green halftone display, and blue halftone display.

<Structure of Display Panel>

The following describes the device structure of the display panel 220.

As shown in FIG. 22, the display panel 220 is provided with a front substrate 201 and a back substrate 202 disposed to face each other with a space therebetween, and with an intermediate substrate 203 inserted in the space. In each pixel unit, a first display element 221 and a second display element 222 are layered in the direction of thickness of the substrate (Z direction) so as to display an image toward the front (Z direction) of the front substrate 201.

In the first display element 221, first partition walls 210A are provided in a space between the front substrate 201 and the intermediate substrate 203 to partition adjacent pixels. Two types of colored particles having different colors and electrostatic characteristics (red particles 206 with a positive electrostatic charge and green particles 207 with a negative electrostatic charge) are injected in each first space 204 partitioned by the first partition walls 210A. In order to drive the colored particles (red particles 206, green particles 207), a first display electrode 211 and a pair of first focusing electrodes 216 and 217 are provided along the inside wall of each first space 204.

The first partition walls 210A are each formed by a partition wall 210a provided along the intermediate substrate 203 and a partition wall 210b provided along the front substrate 201. So as to enclose each first space 204, the first partition walls 210A extend in a criss-crossed fashion in the vertical direction (Y direction) and the horizontal direction (X direction).

The first display electrode 211 is provided at the bottom of the front substrate 201 and is a rectangular electrode formed to have a slightly smaller area than a region partitioned by the walls 210A. An insulating layer 212 is formed to cover the first display electrode 211.

The first focusing electrodes 216 and 217 are provided in the X-Y plane at positions in the first partition walls 210A so as to sandwich the first space 204 horizontally. The first focusing electrodes 216 and 217 are provided between the partition wall 210a and the partition wall 210b that form the first partition wall 210A, separated from the insulating layer 212 by the height of the partition wall 210b in the direction of thickness of the substrate (Z direction). It is preferable that this separation distance (the height of the partition wall 210b) be at least 5 μm.

In the second display element 222, second partition walls 210B are provided in a space between the back substrate 202 and the intermediate substrate 203 to partition adjacent pixels. Two types of colored particles having different colors and electrostatic characteristics (black particles 208 with a positive electrostatic charge and blue particles 209 with a negative electrostatic charge) are injected in each second space 205 partitioned by the second partition walls 210B. In order to drive the colored particles 208 and 209, a second display electrode 214 and a pair of second focusing electrodes 218 and 219 are provided along the inside wall of each second space 205.

The second partition walls 210B are each formed by a partition wall 210c provided along the back substrate 202 and a partition wall 210b provided along the intermediate substrate 203. So as to enclose each second space 205, the second partition walls 210B extend in a criss-crossed fashion in the vertical direction (Y direction) and the horizontal direction (X direction).

The second focusing electrodes 218 and 219 are provided in the X-Y plane at positions in the second partition walls 210B so as to sandwich the second space 205 horizontally. The second focusing electrodes 218 and 219 are provided between the partition wall 210c and the partition wall 210d that form the second partition wall 210B, separated from an insulating layer 215 by the height of the partition wall 210c in the direction of thickness of the substrate (Z direction). It is preferable that this separation distance (the height of the partition wall 210c) also be at least 5 μm.

Figure 23A:
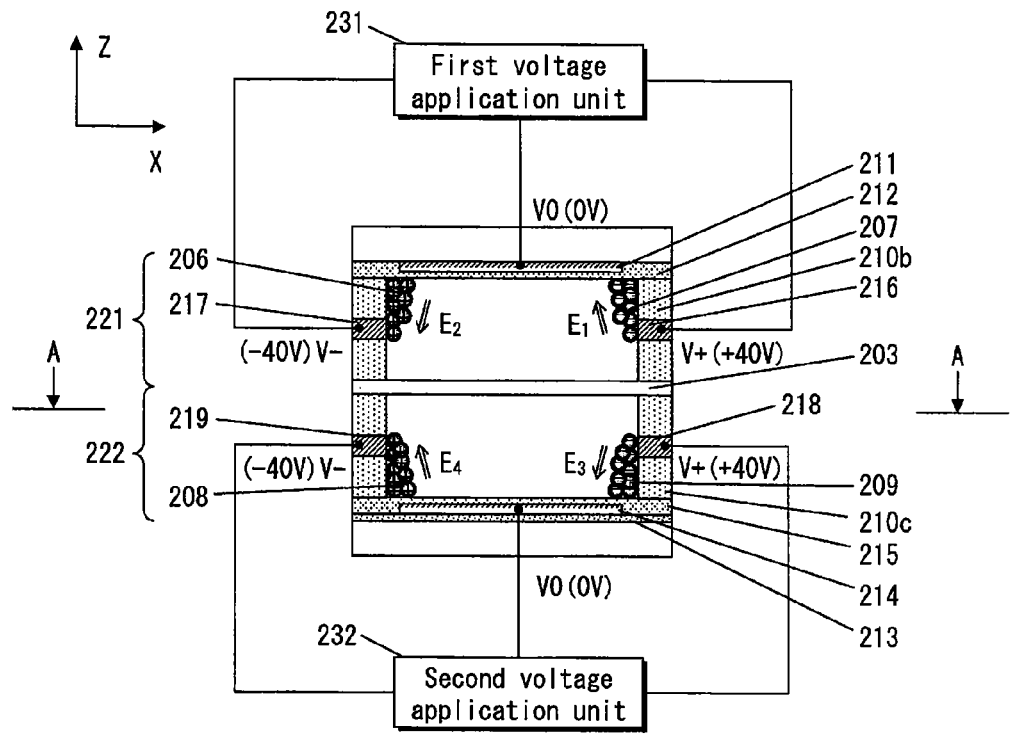
FIG. 23A is a partial cross-section diagram when the above display device displays white.
Figure 23B:
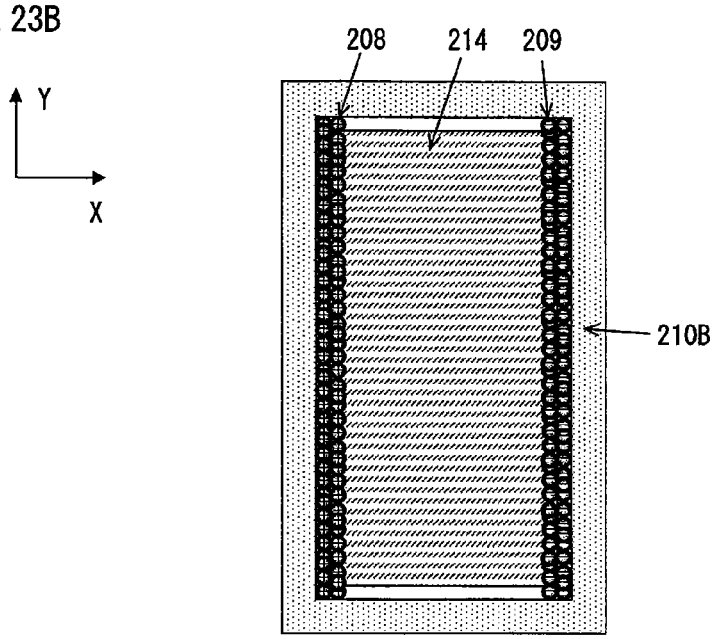
FIG. 23B is a plan view of an A-A cross-section.

FIG. 23B shows an A-A cross-section in FIG. 23A of a pixel unit in the display panel 220. As shown in FIG. 23B, each pixel unit (region partitioned by the second partition walls 210B) in the display panel 220 is rectangular.

The second display electrode 214 is formed on a white reflective layer 213 provided on the upper surface of the back substrate 202 and is a rectangular electrode formed to have a slightly smaller area than a region partitioned by the second partition walls 210B. The insulating layer 215 is formed to cover the second display electrode 214.

The second focusing electrodes 218 and 219 are provided so as to sandwich the first display electrode 211 horizontally and, in the direction of thickness of the substrate (Z direction), are provided between the partition wall 210c and the partition wall 210d that form the first partition wall 210A.

The first voltage application unit 231, which is for applying voltage to drive the red particles 206 and the green particles 207, is connected to the first display electrode 211 and the first focusing electrodes 216 and 217 in the first display element 221. The second voltage application unit 232, which is for applying voltage to drive the black particles 208 and the blue particles 209, is connected to the second display electrode 214 and the second focusing electrodes 218 and 219 in the second display element 222.

By changing the voltage application pattern between the first display electrode 211 and the first focusing electrodes 216 and 217, the first voltage application unit 231 causes the red particles 206 and the green particles 207 to cover the front substrate 201, or causes the red particles 206 and the green particles 207 to attach to the first partition walls 210A, thus driving the particles away from the front substrate 201. By changing the voltage application pattern between the second display electrode 214 and the second focusing electrodes 218 and 219, the second voltage application unit 232 causes the black particles 208 and the blue particles 209 to cover the back substrate 202, or causes the particles to attach to the second partition walls 210B, thus driving the particles away from the back substrate 202. With this structure, in each pixel, the tone of the light that enters through the front of the panel, is reflected, and is then emitted from the front of the panel is changed in order to display images in color.

Material for Forming the Display Panel

Since it is necessary to extract light from the front substrate 201, it is preferable to form the front substrate 201 from a transparent glass material such as borosilicate alkali glass, soda-lime glass, or the like, or to use a transparent resin film such as PEN, PES, PET, or the like.

The back substrate 202 may be formed from a glass material such as borosilicate alkali glass, soda-lime glass, or the like. A resin film such as PEN, PES, PET, or the like, or a gold film of stainless steel may also be used.

The first display electrodes 211 and the second display electrodes 214 are formed from a transparent electrode material such as Indium Tin Oxide (ITO), Indium Zinc Oxide (IZO), or the like.

Preferably, the insulating layer 212 and the insulating layer 215 are formed from a polycarbonate charge transport material used for electrophotographic photoreceptors and are formed from a colorless, transparent resin material that allows visible light to pass through.

The partition walls 210a-210c in the first partition walls 210A and the second partition walls 210B are formed from a polymer resin.

The first focusing electrodes 216 and 217 and the second focusing electrodes 218 and 219 are formed from a conductive metal such as Cr/Al/Cr, Cr/Cu/Cr, Ti/Al/Ti, or the like. The reason for adopting a sandwich structure with Al or Cu between Cr or Ti is that using Al or Cu, which are low-resistance materials, as the core material increases conductivity of the electrodes, and using Cr and Ti both increases adhesion between the partition walls 210a-210c and the Al or Cu and prevents a reduction in contrast by acting as an anti-reflective film.

<Colored Particles and Insulating Layer>

Among the red particles 206 and the green particles 207 enclosed in the first space 204, and the black particles 208 and the blue particles 209 enclosed in the second space 205, the black particles 208 are described first.

The black particles 208 have a similar structure to the colored particles 4 described in Embodiment 1-1 with reference to FIG. 2, being composite particles formed by a core particle covered by surface particles and having a positive electrostatic charge.

The core particles are formed by a base of a spherical particle polymer MBX-5 (average particle diameter of 5 μm), produced by Sekisui Plastics Co., Ltd., or of Chemisnow MX-5 (average particle diameter of 5 μm), produced by Soken Chemical and Engineering Co., Ltd. The base is colored with black pigment or the like. The surface particles are monodisperse silica particles electrostatically treated to have a positive charge and having an average diameter of 16 nm, thus endowing the black particles 208 with a positive electrostatic charge property.

Using the hybridization system or the like, the surface particles, which are monodisperse silica particles, are caused to impact and fix to the core particles, which are polymer particles, in a high-speed air flow. This allows for production of composite particles in which the surface of the polymer particles is covered nearly evenly with monodisperse silica particles. Details such as the proportion of surface particles covering the entire surface of the core particles are as described with respect to the colored particles 4 in Embodiment 1-1.

The manufactured black particles 208 have a positive electrostatic charge, and in order to maintain the charge amount constant, it is preferable to store the black particles 208 in an atmosphere of dry air, dry nitrogen gas, or the like having a constant amount of moisture.

Next, the blue particles 209 having a negative electrostatic charge are particles of acrylic resin colored with blue pigment or the like, but the blue particles 209 are not covered with silica surface particles to achieve the negative electrostatic charge.

Nearly the same amount of the black particles 208 with a positive electrostatic charge and the blue particles 209 manufactured as above are placed in the same plastic container and agitated by being rotated for a predetermined amount of time, at a predetermined rotational speed. The blue particles 209 are electrostatically treated to have a negative charge by this so-called friction method.

The necessary amount of electrostatic charge for each particle is achieved by controlling the rotational speed and the duration of rotation.

In addition to this friction method, a method such as a corona discharge method, an electrode injection method, or the like may be used to provide the particles with an electrostatic charge property.

The red particles 206 having a positive electrostatic charge may be manufactured by composite particle treatment with a similar method as the black particles 208, and the green particles 207 having a negative electrostatic charge may be manufactured by a similar method as the blue particles 209.

The insulating layer 212 changes electrostatic state based on the relationship between the voltage applied to the first display electrode 211 and the voltage applied to the focusing electrodes 216 and 217. In response to the change in electrostatic state, the red particles 206 with a positive electrostatic charge and the green particles 207 with a negative electrostatic charge move to the left or right above the insulating layer 212. The proportion of the red particles 206 and the green particles 207 covering the insulating layer 212 thus changes.

The insulating layer 215 also changes electrostatic state based on the relationship between the voltage applied to the second display electrode 214 and the voltage applied to the focusing electrodes 218 and 219. In response to the change in electrostatic state, the black particles 208 with a positive electrostatic charge and the blue particles 209 with a negative electrostatic charge move to the left or right above the insulating layer 215.

The proportion of the black particles 208 and the blue particles 209 covering the insulating layer 215 (i.e. the proportion of the black particles 208 and the blue particles 209 covering the white reflective layer 213) thus changes.

Providing a surface-treated layer having minute protrusions formed on the surface thereof (a layer similar to the surface-treated layer 8b shown in FIG. 2 in Embodiment 1-1) on the surface portion of the insulating layer 215 reduces the van der Waals forces operating between the insulating layer 215 on the one hand and the black particles 208 and blue particles 209 on the other. This allows for the black particles 208 and the blue particles 209 to be moved with a low applied voltage.

Furthermore, as in the first display element 221, it is preferable to form the surface-treated layer on the insulating layer 212 and on the surface of the first partition walls 210A.

<Method of Manufacturing Display Panel>

The following describes a method of manufacturing the display panel according to the present embodiment.

1. Manufacturing the Back Substrate 202 Side of the Panel

The white reflective layer 213, which is formed from a titanium oxide (titania, $TiO_2$) film, is coated, printed, cold sprayed, or the like on the back substrate 202, which is formed from alkalifree glass. The white reflective layer 213 is formed on the surface necessary for image display, i.e. almost the entire surface of the substrate except for the peripheral portion thereof.

Next, the second display electrode 214 is formed from ITO, which is a transparent conductive material, by sputtering, vapor deposition, or the like, and a predetermined rectangular shape is patterned by a process such as lithography or etching.

Finally, the insulating layer 215 is formed by a method such as coating or printing of polycarbonate charge transport material that is dissolved in a solvent to form the insulating layer 215 on the surface necessary for image display, i.e. almost the entire surface of the substrate except for the peripheral portion thereof. A surface-treated layer, having protrusions on the surface thereof, is formed on the surface of the insulating layer 215, as indicated below.

Formation of the Surface-Treated Layer on the Surface of the Insulating Layer 215

The method of forming the surface-treated layer is similar to the method of forming the surface-treated layer 8b described in Embodiment 1-1 with reference to FIG. 2. A coating agent formed by dispersing $TiO_2$ particles in a medium is coated on the surface of the insulating layer 215 to form the surface-treated layer.

This surface-treated layer is formed by a $TiO_2$ particle layer and a polycarbonate insulating layer that is exposed on the uppermost surface.

The surface-treated layer thus formed is firm and has a high degree of transparency, and is a uniform layer, with agglomerations of $TiO_2$ particles being relatively rare, and layered particles having an even particle diameter distribution. The layer is approximately 100 nm thick.

Depending on the type or amount of $TiO_2$ particles used in the coating agent, conductivity of the surface-treated layer that is formed can be adjusted.

By thus forming the surface-treated layer on the surface of the insulating layer 215, the van der Waals forces operating between the insulating layer 215 and the colored particles are reduced, thus allowing for the colored particles to be removed from the insulating layer 215 with a low applied voltage.

The $TiO_2$ particles used for the coating agent are 30 nm in diameter, smaller than the colored particles that are 5 μm in diameter. The reason for adopting this size is that if particles having a larger diameter than the colored particles are used to form the surface-treated layer, the protrusions formed on the surface-treated layer become large, and the colored particles end up attaching between the protrusions, thus eliminating the advantageous effect of reducing the van der Waals forces. By using particles with a smaller diameter than the colored particles, the average interval between protrusions on the surface-treated layer is smaller than the average particle diameter of the colored particles. The van der Waals forces that act between the colored particles and the insulating layer 215 are thus reliably reduced, allowing for the colored particles to be removed from the insulating layer 215 with a low applied voltage. For the same reason, it is preferable that the protrusions on the surface-treated layer be formed evenly across the entire surface of the layer. Specifically, it is preferable to form the surface-treated layer to have no gaps larger than the diameter (5 μm) of the colored particles.

The thickness of the insulating layer 215 in the present embodiment is set to 15 μm to prevent dielectric breakdown from occurring when applying voltage.

This surface treatment may be applied not only to the insulating layer 215, but also to the surface of the partition walls 210c and 210d in the second partition walls 210B, and of the second focusing electrodes 218 and 219. By doing so, conditions such as electric resistance, electrostatic charge property, and shape are uniform across the entire surface of the second space 205, yielding nearly the same voltage characteristics as the colored particles attached to the surface-treated layer and achieving good display characteristics during driving.

Next, using a method such as photolithography, the partition walls 210c are formed to a height of 10 μm in a criss-cross fashion in accordance with pixel size.

The partition walls 210c are formed in a criss-cross fashion to a horizontal pitch of 100 μm, a vertical pitch of 300 μm, and a width of 20 μm, and to a height of 10 μm.

Next, by screen printing, an inkjet method, a dispenser method, or the like, the partition walls 210c are coated with a paste having Ag as a primary component, and are then dried and burned to form the second electrodes 218 and 219 to a film thickness of 10 μm.

Furthermore, the partition walls 210d are formed by the same method as the partition walls 210c, in the same shape, at the same pitch, and to the same height. In this way, the white reflective layer 213, the second display electrode 214, and the insulating layer 215, as well as the second partition walls 210B composed of the partition walls 210c, the partition walls 210d, and the second focusing electrodes 218 and 219, are formed on the back substrate 202 to a height of 30 μm.

This height is set so that all of the colored particles 208 and 209 enclosed in the second space 205 can attach to the side of the second partition walls 210B.

2. Manufacturing the Front Substrate 201 Side of the Panel

The front substrate 201 side of the panel differs from the back substrate 202 side of the panel only in that the white reflective layer 213 is not formed therein. Accordingly, the front substrate 201 side of the panel is manufactured with a similar method as the back substrate 202 side of the panel by forming the first display electrode 211 and the insulating layer 212, as well as the partition walls 210b, the first focusing electrodes 216 and 217, and the partition walls 210a, on the front substrate 201.

3. Panel Assembly Process

At the back substrate 202 side of the panel manufactured as above, black particles 208 and blue particles 209 are evenly distributed in the spaces partitioned by the second partition walls 210B. Similarly, at the front substrate 201 side of the panel, red particles 206 and green particles 207 are evenly dispersed in the spaces partitioned by the first partition walls 210A. The intermediate substrate 203, formed from alkalifree glass, is placed so as to act as a lid for the front substrate 201 that has colored particles dispersed therein. It is preferable to coat the top of the partition walls 210b with adhesive in advance and to fix the intermediate substrate 203 thereto. In this way, the first space 204 is formed between the front substrate 201 and the intermediate substrate 203 to a height of 30 μm, and the red particles 206 and the green particles 207 are enclosed in the first space 204.

The front substrate 201 and the intermediate substrate 203 are then overlaid as a lid on the back substrate 202, which has colored particles dispersed therein. The second space 205 is thus formed between the back substrate 202 and the intermediate substrate 203 to a height of 30 μm, and the black particles 208 and the blue particles 209 are enclosed in the second space 205.

The periphery of the back substrate 2 is coated with an epoxy-based UV adhesive. The front substrate 201 and the back substrate 202 are aligned and exposed to UV light. The adhesive thereby hardens to complete assembly of the display panel.

It is preferable to assemble the display panel in a dry gas atmosphere (such as dry nitrogen) that has been desiccated to severely reduce moisture. By doing so, dry gas from which moisture has been removed is enclosed in the first space 204 and the second space 205 with the colored particles 206, 207, 208, and 209, and the amount of electrostatic charge of the colored particles enclosed therein is maintained constant.

<Operations of Display Device>

Operations of the display device with the above structure are described with reference to FIGS. 23-28.

In this display device, one frame of an image is displayed by the pixels composing the display panel 220 each displaying either gradations or a halftone of one of the colors of white, black, red, green, and blue.

An image signal for one frame is data indicating the color and gradation of each pixel composing the frame. When this image signal is transmitted to the drive control unit 230, the drive control unit 230 transmits a control signal to the first voltage application unit 231 and the second voltage application unit 232 based on the received image signal. Based on the control signal, the first voltage application unit 231 and the second voltage application unit 232 change the pattern of voltage applied to the electrodes of the first display element 221 and the second display element 222, thus causing the position of the colored particles 206 and 207 in the first space 204 and the colored particles 208 and 209 in the second space 205 to change, thereby displaying an image by changing the color tone of light reflected towards the front of the panel in each pixel.

Note that before such writing, it is preferable for the first voltage application unit 231 and the second voltage application unit 232 to apply a reset voltage, which is 10%-20% larger than the driving voltage for regular white display, between the first display electrode 211 and the first focusing electrodes 216 and 217, and between the second display electrode 214 and the second focusing electrodes 218 and 219, in every pixel.

The following describes patterns for applying voltage to the electrodes in the first voltage application unit 231 and the second voltage application unit 232.

The voltage that the first voltage application unit 231 applies to the first display electrode 211 and the first focusing electrodes 216 and 217 in the first display element 221 (polarity and magnitude), and the voltage that the second voltage application unit 232 applies to the second display electrode 214 and the second focusing electrodes 218 and 219 in the second display element 222 (polarity and magnitude), are determined to be the polarity and magnitude necessary to change the position of the colored particles 206 and 207 in the first space 204, and of the colored particles 208 and 209 in the second space 205, from a reset state in which the colored particles are attached to the partition walls 210A and 210B to positions appropriate for display of each color. Table 1 below provides an example.

Below, the voltage application pattern and operations of colored particles are described for each of the following: 1. white display, 2. black display, 3. red display, 4. green display, 5. blue display, and 6. halftone display in each color.

1. White Display

FIGS. 23A and 23B show a pixel unit during white display.

In a pixel that is to display white, the voltage application unit 231 sets the potential of the first display electrode 211 to 0 V, applies a positive voltage V+ (+40 V) to the first focusing electrode 216, and applies a negative voltage V− (−40 V) to the first focusing electrode 217. The voltage application unit 232 sets the potential of the second display electrode 214 to 0 V, applies a positive voltage V+ (+40 V) to the second focusing electrode 218, and applies a negative voltage V− (−40 V) to the second focusing electrode 219.

In this way, in the first display element 221, a positive electrical field distribution forms from the first display electrode 211 to the first focusing electrode 216, and the green particles 207 with a negative electrostatic charge are attracted to the first focusing electrode 216. At the same time, a negative electrical field distribution forms from the first display electrode 211 to the second focusing electrode 217, and the red particles 206 with a positive electrostatic charge are attracted to the second focusing electrode 217.

Specifically, between the edge of the first display electrode 211 and the first focusing electrodes 216 and 217, an electrical field E1 forms from the first focusing electrode 216 towards the first display electrode 211, and an electrical field E2 forms from the first display electrode 211 towards the second focusing electrode 217, the electrical fields E1 and E2 being strong and uniform. Since the electric energy density grows high in this region, the red particles 206 and the green particles 207 gather on the side of the partition walls 210b without remaining in the central region of the pixel, as shown in FIG. 23.

Similarly, in the second display element 222, a positive electrical field distribution forms from the second display electrode 214 to the second focusing electrode 218, and the blue particles 209 with a negative electrostatic charge are attracted to the second focusing electrode 218, to which positive voltage has been applied. At the same time, a negative electrical field distribution forms from the second display electrode 214 to the second focusing electrode 219, and the black particles 208 with a positive electrostatic charge are

TABLE 1

| | First voltage application unit 231 First display element 221 | | | Second voltage application unit 232 Second display element 222 | | |
| --- | --- | --- | --- | --- | --- | --- |
| | First display electrode 211 | First focusing electrode 216 | First focusing electrode 217 | Second display electrode 214 | Second focusing electrode 218 | Second focusing electrode 219 |
| White display | 0 V | +40 V | −40 V | 0 V | +40 V | −40 V |
| Black display | 0 V | +40 V | −40 V | −40 V | −40 V | −40 V |
| Blue display | 0 V | +40 V | −40 V | +40 V | −40 V | −40 V |
| Red display | −40 V | +40 V | +40 V | 0 V | +40 V | −40 V |
| Green display | +40 V | −40 V | −40 V | 0 V | +40 V | −40 V |
| Green halftone | +25 V | +25 V | −50 V | −25 V | +50 V | −25 V |
| Red halftone | −25 V | −25 V | +50 V | −25 V | +50 V | −25 V |
| Blue halftone | 0 V | +40 V | −40 V | 0 V | +25 V | −25 V | attracted to the second focusing electrode 219, to which negative voltage has been applied. Between the edge of the second display electrode 214 and the second focusing electrodes 218 and 219, an electrical field E3 forms from the second focusing electrode 218 towards the second display electrode 214, and an electrical field E4 forms from the second display electrode 214 towards the second focusing electrode 219, the electrical fields E3 and E4 being strong and uniform. Since the electric energy density grows high in this region, the black particles 208 and the blue particles 209 gather on the side of the partition walls 210c without remaining in the central region of the pixel.

In this way, in the central region of the pixel unit (in a region easily seen from the front of the panel), the surfaces of the insulating layer 212, the intermediate substrate 203, and the insulating layer 215 are exposed, without being blocked by the colored particles. Therefore, light entering from the front of the panel passes through the first display electrode 211, the insulating layer 212, the intermediate substrate 203, the insulating layer 215, and the second display electrode 214, which are made from transparent material, is reflected by the white reflective layer 213, and is emitted from the front of the panel. With this structure, an excellent white color with a high degree of whiteness is displayed by the pixels.

2. Black Display

Figure 24:
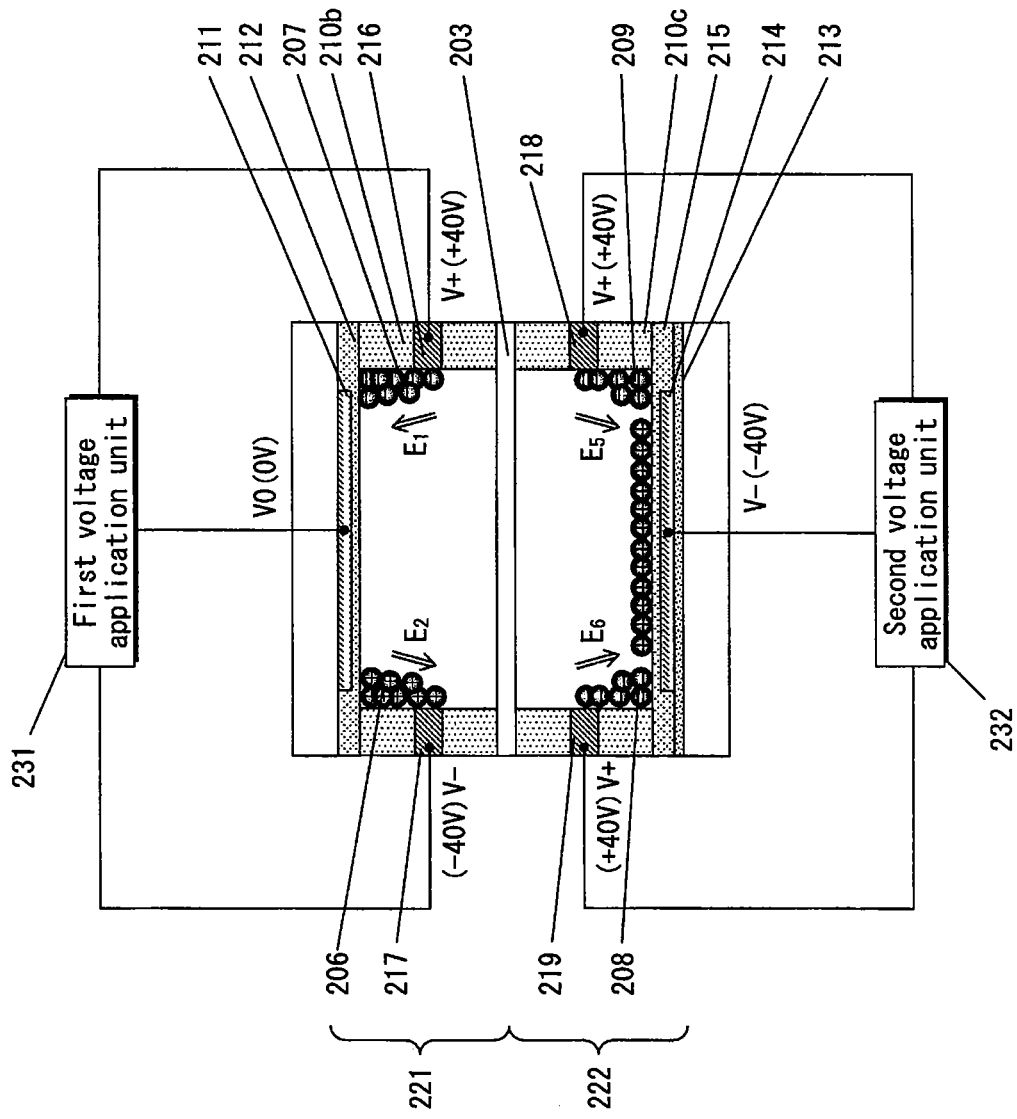
FIG. 24 is a partial cross-section diagram showing a pixel unit when the display device displays black.

As shown in FIG. 24, in a pixel that is to display black, the voltage application unit 231 sets the potential of the first display electrode 211 to 0 V, applies a positive voltage V+ (+40 V) to the first focusing electrode 216, and applies a negative voltage V− (−40 V) to the first focusing electrode 217, as during white display. On the other hand, the voltage application unit 232 applies a negative voltage V− (−40 V) to the second display electrode 214, and applies a positive voltage V+ (+40 V) to the second focusing electrodes 218 and 219.

With this structure, in the first display element 221, as during white display, the green particles 207 with a negative electrostatic charge are attracted to the first focusing electrode 216, and the red particles 206 with a positive electrostatic charge are attracted to the second focusing electrode 217. The red particles 206 and the green particles 207 gather on the side of the partition walls 210b without remaining in the central region of the pixel due to the electrical field E1 formed between the edge of the first focusing electrode 216 and the first display electrode 211, and the electrical field E2 formed between the edge of the first display electrode 211 and the second focusing electrode 217.

On the other hand, in the second display element 222, the blue particles 209 with a negative electrostatic charge are attracted to the focusing electrodes 216 and 217, to which positive voltage has been applied, and gather on the side of the partition walls 210a due to the electrical fields E5 and E6 formed between the focusing electrodes 216 and 217 and the edge of the second display electrode 214.

The black particles 208 with a positive electrostatic charge are attracted to the second display electrode 214, to which negative voltage has been applied, and thus spread to form a layer on the surface of the second display electrode 214.

Accordingly, the first display element 221 is exposed, whereas in the second display element 222, the black particles 208 occupy a space above the back substrate 202.

Accordingly, light that enters from the front of the panel passes through the front substrate 201, the first display electrode 211, the insulating layer 212, the intermediate substrate 203, and the second display electrode 214, which are made from transparent material, without being blocked by the colored particles, is reflected by the layer of black particles 208, and is then emitted from the front of the panel. An excellent black color is thus displayed by the pixel.

3. Blue Display

Figure 25:
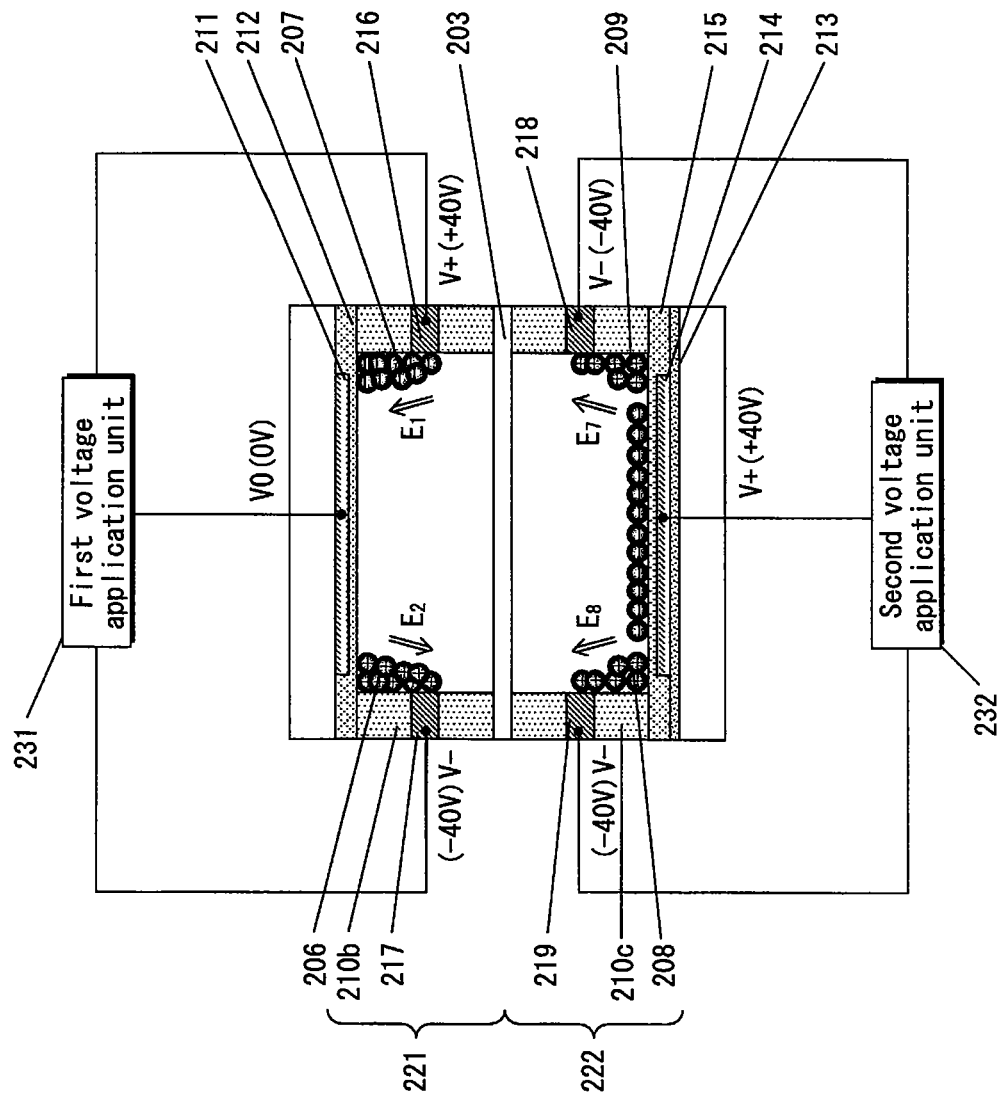
FIG. 25 is a partial cross-section diagram showing a pixel unit when the display device displays blue.

As shown in FIG. 25, in a pixel that is to display blue, the voltage application unit 231 sets the potential of the first display electrode 211 to 0 V, applies a positive voltage V+ (+40 V) to the first focusing electrode 216, and applies a negative voltage V− (−40 V) to the first focusing electrode 217, as during both white and black display. On the other hand, the voltage application unit 232 applies voltage with the opposite polarity as when displaying black. Specifically, the voltage application unit 232 applies a positive voltage V+ (+40 V) to the second display electrode 214, and applies a negative voltage V− (−40 V) to the focusing electrodes 218 and 219.

In this way, in the first display element 221, the red particles 206 and the green particles 207 behave in the same way as when displaying black, i.e. by gathering on the side of the partition walls 210b.

On the other hand, in the second display element 222, since voltage of the opposite polarity as when displaying black is applied to the second display electrode 214 and the second focusing electrodes 218 and 219, the black particles 208 and the blue particles 209 switch their respective behaviors.

Specifically, the black particles 208 with a positive electrostatic charge are attracted to the first focusing electrodes 216 and 217, to which negative voltage has been applied, and gather on the side of the partition walls 210c due to electrical fields E7 and E8 formed between the edge of the second display electrode 214 and the second focusing electrodes 218 and 219. The blue particles 209 with a negative electrostatic charge spread to form a layer on the second display electrode 214, to which positive voltage has been applied, along the positive electrical field distribution formed across the second display electrode 214.

Accordingly, the first display element 221 is exposed, whereas in the second display element 222, the blue particles 209 occupy a space above the back substrate 202.

Therefore, light that enters from the front of the panel passes, without being blocked by the colored particles, through the first display electrode 211, the insulating layer 212, and the intermediate substrate 203, which are made from transparent material. The light is then reflected by the layer of blue particles 209 and is emitted from the front of the panel. An excellent blue color is thus displayed by the pixel.

4. Red Display

Figure 26:
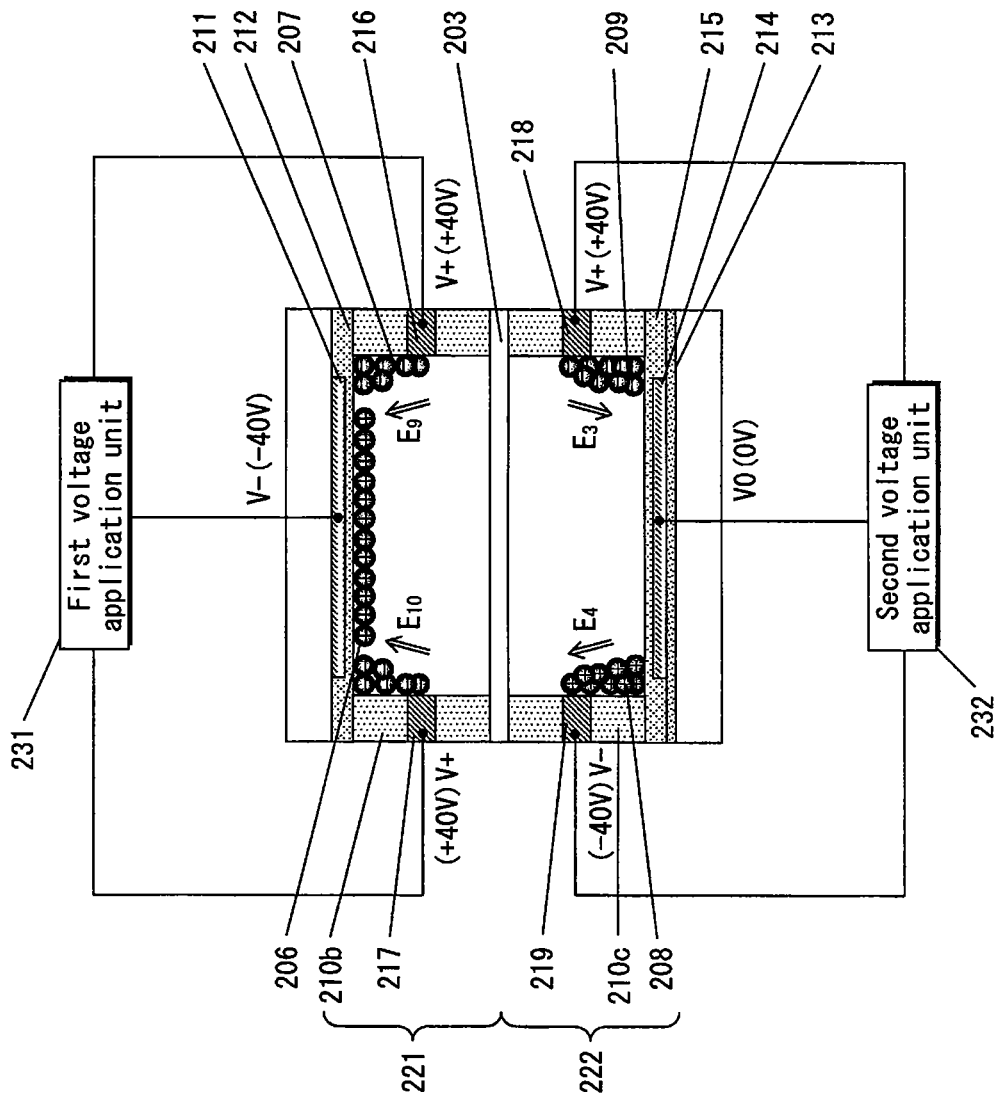
FIG. 26 is a partial cross-section diagram showing a pixel unit when the display device displays red.

In a pixel that is to display red, the voltage application unit 231 applies a negative voltage V− (−40 V) to the first display electrode 211 and applies a positive voltage V+ (+40 V) to the first focusing electrodes 216 and 217, as shown in FIG. 26. On the other hand, the voltage application unit 232 sets the potential of the second display electrode 214 to 0 V, applies a positive voltage V+ (+40 V) to the second focusing electrode 218, and applies a negative voltage V− (−40 V) to the second focusing electrode 219.

In this way, in the first display element 221, the green particles 207 with a negative electrostatic charge are attracted to the first focusing electrodes 216 and 217, to which positive voltage has been applied, and gather on the side of the partition walls 210b due to electrical fields E9 and E10 formed between the first focusing electrodes 216 and 217 and the edge of the first display electrode 211. The red particles 206 with a positive electrostatic charge are attracted to the first display electrode 211, to which negative voltage has been applied, and thus spread to form a layer on the surface of the first display electrode 211.

On the other hand, in the second display element 222, as when displaying white, a positive electrical field distribution forms from the second display electrode 214 to the second focusing electrode 218, and the blue particles 209 with a negative electrostatic charge are attracted to the second focusing electrode 218, to which positive voltage has been applied. At the same time, a negative electrical field distribution forms from the second display electrode 214 to the second focusing electrode 219, and the black particles 208 with a positive electrostatic charge are attracted to the second focusing electrode 219, to which negative voltage has been applied.

Accordingly, in the first display element 221, the red particles 206 occupy a space along the front substrate 201, whereas the second display element 222 is exposed.

Therefore, light that enters from the front of the panel is reflected by the layer of red particles 206 and emitted from the front of the panel, thus yielding a red display state. Even if light were to enter through a location not covered by the red particles 206, the light would pass through the first display electrode 211, the insulating layer 212, and the intermediate substrate 203, which are made from transparent material, be reflected by the white reflective layer 213, and be emitted from the front of the panel. In other words, the light would not be reflected by the blue particles 209 to yield a mixed color.

5. Green Display

Figure 27:
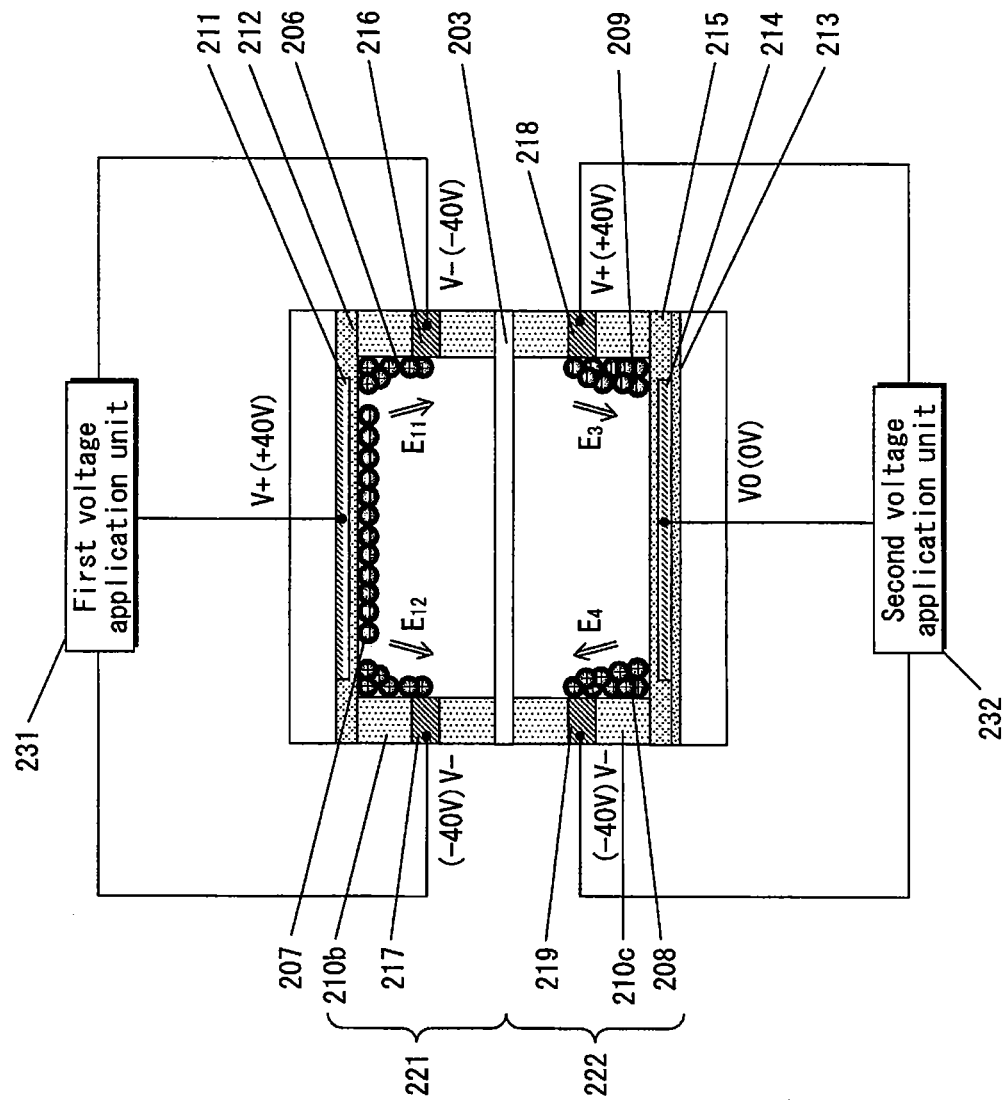
FIG. 27 is a partial cross-section diagram showing a pixel unit when the display device displays green.

In a pixel that is to display green, as shown in FIG. 27, the voltage application unit 231 applies voltage with the opposite polarity as when displaying black. Specifically, the voltage application unit 231 applies a positive voltage V+ (+40 V) to the first display electrode 211 and applies a negative voltage V− (−40 V) to the first focusing electrodes 216 and 217. The voltage application unit 232 sets the potential of the second display electrode 214 to 0 V, applies a positive voltage V+ (+40 V) to the second focusing electrode 218, and applies a negative voltage V− (−40 V) to the second focusing electrode 219.

In this way, in the first display element 221, since voltage of the opposite polarity as when displaying red is applied to the first display electrode 211 and the first focusing electrodes 216 and 217, the red particles 206 and the green particles 207 switch their respective behaviors. Specifically, the red particles 206 with a positive electrostatic charge are attracted to the first focusing electrodes 216 and 217, to which negative voltage has been applied, and gather on the side of the partition walls 210*b* due to electrical fields E11 and E12 formed between the edge of the first display electrode 211 and the first focusing electrodes 216 and 217. The green particles 207 with a negative electrostatic charge are attracted to the first display electrode 211, to which positive voltage has been applied, and thus spread to form a layer on the surface of the first display electrode 211.

On the other hand, in the second display element 222, since the voltage application state is the same as when displaying red, the black particles 208 and the blue particles 209 behave the same way as when displaying red.

Accordingly, in the first display element 221, the green particles 207 occupy a space along the front substrate 201, whereas the second display element 222 is exposed.

Therefore, light that enters from the front of the panel is reflected by the layer of green particles 207 and emitted from the front of the panel, thus yielding a green display state. Even if light were to enter through a location not covered by the green particles 207, the light would pass through the first display electrode 211, the insulating layer 212, and the intermediate substrate 203, which are made from transparent material, be reflected by the white reflective layer 213, and be emitted from the front of the panel. In other words, the light would not be reflected by the blue particles 209 to yield a mixed color.

Note that as described above, before image display, applying a reset voltage that is large as compared to voltage during white display to all of the pixels has the highly advantageous effect of removing colored particles remaining in the central region of each pixel, forcing the colored pixels to the side of the partition walls 210A and 210B. This allows for display with a continually high degree of reflection and high contrast over a long period of time. This structure also prevents burn-in whereby colored particles remain attached to the insulating layer 215.

6. Display of a Halftone of Each Color 6-1 Green Halftone Display

Figure 28:
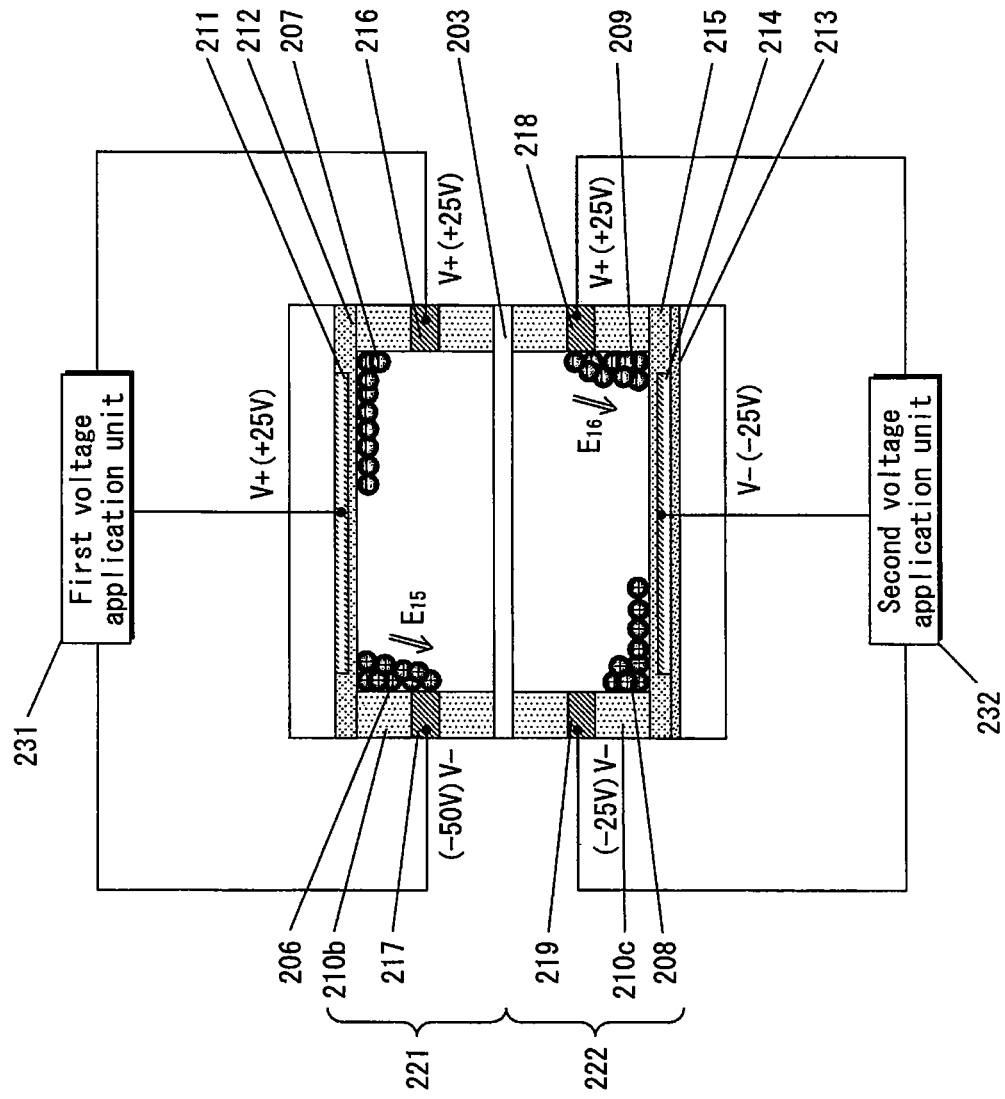
FIG. 28 is a partial cross-section diagram showing a pixel unit when the display device displays a green halftone.

The following describes display of a halftone of each color, starting by describing the display of a green halftone with reference to FIG. 28.

The voltage application unit 231 applies a positive voltage V+ (+25 V) to the first display electrode 211 and the first focusing electrode 216 and applies a negative voltage V− (−50 V) to the first focusing electrode 217. The voltage application unit 232 applies V− (−25 V) to the second display electrode 214 and the second focusing electrode 219 and applies a positive voltage V+ (+50 V) to the second focusing electrode 218.

In this way, in the first display element 221, the red particles 206 with a positive electrostatic charge are attracted to the first focusing electrode 217 to which negative voltage has been applied and gather on the side of the partition walls 210*b* due to an electrical field E15 formed between the edge of the first display electrode 211 and the first focusing electrode 217.

The green particles 207 with a negative electrostatic charge are attracted to the first display electrode 211 and the first focusing electrode 216 to which positive voltage has been applied. However, since the first display electrode 211 and the first focusing electrode 216 are at the same electric potential, the green particles 207 do not gather between the two electrodes, but rather spread to form a layer on the first display electrode 211 in a region close to the first focusing electrode 216 (the right half in the figure).

On the other hand, in the second display element 222, the blue particles 209 with a negative electrostatic charge are attracted to the second focusing electrode 218, to which positive voltage has been applied, and gather on the side of the partition walls 210*c* due to an electrical field E16 formed between the second focusing electrode 218 and the edge of the second display electrode 214. The black particles 208 with a positive electrostatic charge are attracted to the second display electrode 214 and the second focusing electrode 219 to which negative voltage has been applied. However, since the second display electrode 214 and the second focusing electrode 219 are at the same electric potential, the black particles 208 do not gather between the two electrodes, but rather form a layer on the second display electrode 214 in a region close to the second focusing electrode 219 (the left half in the figure).

Accordingly, in the first display element 221, the layer of the green particles 207 occupies the region to the right along the front substrate 201, with the left half thereof being exposed, whereas in the second display element 222, the layer of the black particles 208 occupies the region to the left along the back substrate 202, with the right half thereof being open.

As a result, the layer of green particles 207, the layer of black particles 208, and a fraction of the white reflective layer 213 can be observed from the front of the panel, yielding display of a green halftone.

The coverage ratio and the aperture ratio of the green particles 207 in the first display element 221, as well as the coverage ratio and the aperture ratio of the black particles 208 in the second display element 222, vary by adjusting the magnitude of the voltage applied to each electrode.

For example, when applying a negative voltage V− of −50 V to the first focusing electrode 217, and a positive voltage V+ of +25 V to the first display electrode 211 and the first focusing electrode 216, as described above, the difference between the voltages is 75 V. By setting this difference to be larger, the coverage ratio of the green particles 207 decreases.

Accordingly, if the magnitude of the voltage applied to each electrode is set to change in a stepwise manner, gradations of green halftones can be displayed.

6-2 Red Halftone Display

In order to display a red halftone, the polarity of the voltage applied to each electrode in the first display element 221 is reversed as compared to the above-described display of a green halftone.

Specifically, the voltage application unit 231 applies a negative voltage V− (−25 V) to the first display electrode 211 and the first focusing electrode 216 and applies a positive voltage V+ (+50 V) to the first focusing electrode 217. As when displaying a green halftone, the voltage application unit 232 applies V− (−25 V) to the second display electrode 214 and the second focusing electrode 219 and applies a positive voltage V+ (+50 V) to the second focusing electrode 218.

In this way, in the first display element 221, the behavior of the red particles 206 and the green particles 207 is reversed: the green particles 207 with a negative electrostatic charge are attracted to the first focusing electrode 217 to which positive voltage has been applied and gather on the side of the partition walls 210b due to an electrical field formed between the edge of the first display electrode 211 and the first focusing electrode 217. The red particles 206 with a positive electrostatic charge are attracted to the first display electrode 211 and the first focusing electrode 216 to which negative voltage has been applied, forming a layer on the first display electrode 211 in a region close to the first focusing electrode 216 (the right half in the figure).

In the second display element 222, as when displaying green, the blue particles 209 with a negative electrostatic charge are attracted to the second focusing electrode 218, to which positive voltage has been applied, and gather on the side of the partition walls 210c. The black particles 208 with a positive electrostatic charge are attracted to the second display electrode 214 and the second focusing electrode 219 to which negative voltage has been applied, forming a layer on the second display electrode 214 in a region close to the second focusing electrode 219 (the left half in the figure).

Accordingly, in the first display element 221, the layer of the red particles 206 occupies the region to the right along the front substrate 201, with the left half thereof being exposed, whereas in the second display element 222, the layer of the black particles 208 occupies the region to the left along the back substrate 202, with the right half thereof being open. As a result, the layer of red particles 206, the layer of black particles 208, and a fraction of the white reflective layer 213 can be observed from the front of the panel, yielding display of a red halftone.

The coverage ratio and the aperture ratio of the red particles 206 in the first display element 221, as well as the coverage ratio and the aperture ratio of the black particles 208 in the second display element 222, vary by adjusting the magnitude of the voltage applied to each electrode. Therefore, by changing the magnitude of the voltage applied to each electrode in a stepwise manner, gradations of red halftones can be displayed.

6-3 Blue Halftone Display

Figure 29:
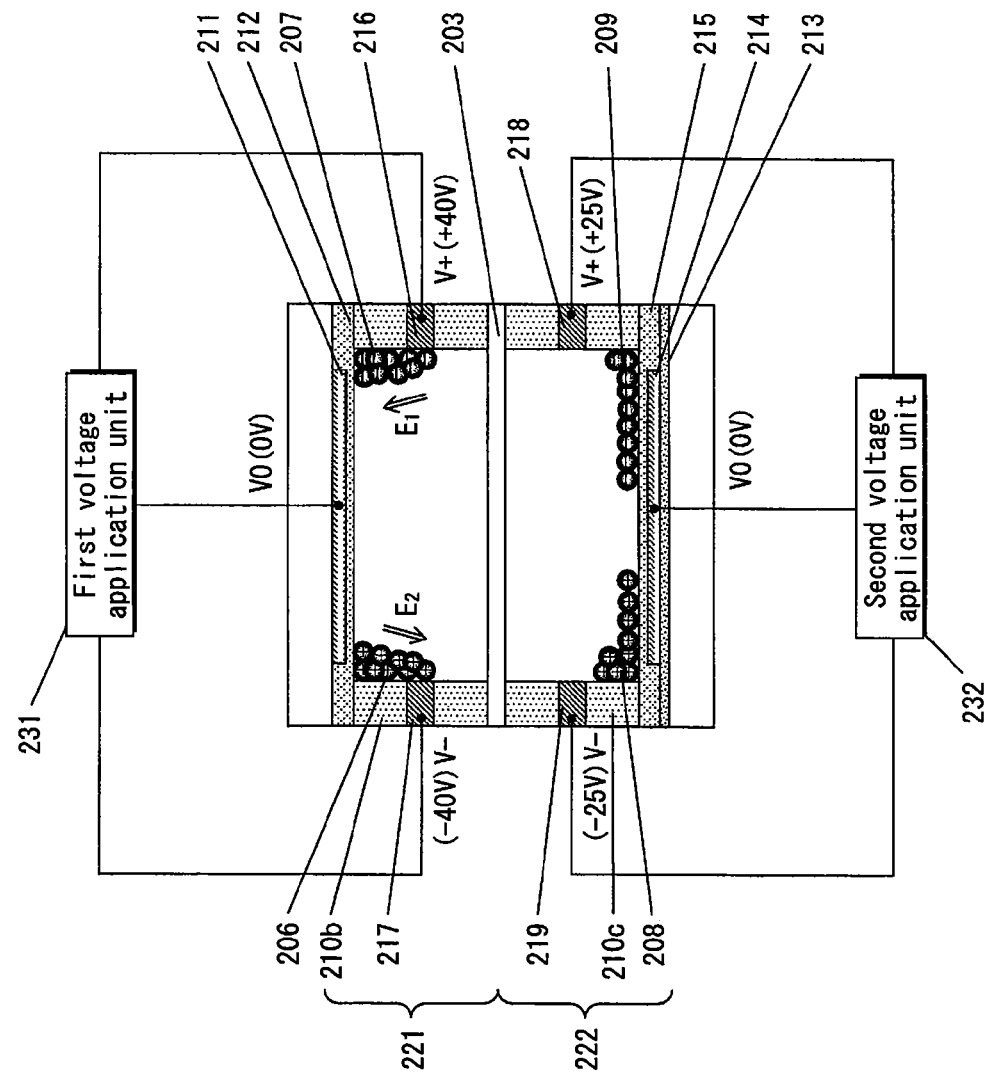
FIG. 29 is a partial cross-section diagram showing a pixel unit when the display device displays a blue halftone.

As shown in FIG. 29, in a pixel that is to display a blue halftone, the voltage application unit 231 sets the potential of the first display electrode 211 to 0 V, applies a positive voltage V+ (+40 V) to the first focusing electrode 216, and applies a negative voltage V− (−40 V) to the first focusing electrode 217, as during white display. This results in the first display element 221 being exposed.

Conversely, the magnitude of the voltage applied to each of the electrodes in the second display element 222 is set to be smaller than during white display. For example, the potential of the second display electrode 214 is set to 0 V, a positive voltage V+ of +25 V is applied to the second focusing electrode 218, and a negative voltage V− of −25 V is applied to the second focusing electrode 219.

In this way, in the second display element 222, the black particles 208 with a positive electrostatic charge are attracted to the second focusing electrode 219, to which negative voltage has been applied, and the blue particles 209 with a negative electrostatic charge are attracted to the second focusing electrode 218, to which positive voltage has been applied. The magnitude of the voltage applied between the second display electrode 214 and the second focusing electrodes 218 and 219 is smaller, however, than during white display, and therefore the force that gathers the black particles 208 and the blue particles 209 along the side of the partition walls 210c is weaker, causing these particles to spread out to some degree above the second display electrode 214.

Accordingly, in the second display element 222, a layer of the black particles 208 occupies the region to the left along the back substrate 202, and a layer of the blue particles 209 occupies the region to the right.

As a result, the layer of blue particles 209, the layer of black particles 208, and a fraction of the white reflective layer 213 can be observed from the front of the panel, yielding display of a blue halftone.

The coverage ratio and the aperture ratio of the black particles 208 and the blue particles 209 in the second display element 222 vary by adjusting the magnitude of the voltage applied to each electrode. Therefore, by changing the magnitude of the voltage applied to each electrode in a stepwise manner, gradations of blue halftones can be displayed.

6-4 Black Halftone Display

For display of a black halftone, the magnitude of the negative voltage V− applied to the second focusing electrode 219 during the white display shown in FIG. 23 is set smaller (for example, to −25 V), weakening the electrical field E4 between the edge of the second display electrode 214 and the second focusing electrode 219. As a result, the force that gathers the black particles 208 on the side of the partition walls 210c weakens, and the black particles 208 spread out to some degree above the second display electrode 214. Therefore, the layer of black particles 208 and the white reflective layer 213 can be observed from the front of the panel, yielding display of a black halftone.

In this way, in the display device according to the present embodiment, the voltage application units 231 and 232 apply voltage to the electrodes in each pixel unit to drive the colored particles 206-209 in the spaces 204 and 205 in the pixels, thus displaying red, blue, green, or black in each pixel in order to display one frame of an image.

<Advantageous Effects of the Display Device According to the Present Embodiment>

The display device according to the present embodiment can display red, blue, green and black in each pixel, and can also display gradations of each of these colors. Therefore, the display device achieves full-color display by additive color mixing.

After writing, even if the voltage application units 231 and 232 stop applying voltage to the electrodes, an adhesive force, mainly due to van der Waals forces, is produced between the colored particles 206-209 and the inner walls of the spaces 204 and 205 (the side of the partition walls 210A and 210B, and the insulating layers 212 and 215), thereby maintaining the state of the colored particles 206-209 as is. As a result, the image display state is maintained until the next writing.

Accordingly, not only the text screen of an electronic book, but also contents such as a full color image or the like can be displayed over an extended time with little power consumption.

Furthermore, in the display panel according to the present embodiment, since the colored particles are enclosed in a gas, while a voltage of a certain magnitude is necessary to begin movement, the colored particles move more quickly after movement begins than in an electrophoretic display device in which colored particles move within a liquid.

Therefore, the colored particles remain stably at rest when driving voltage is not applied and yet rapidly when driving voltage is applied, thus achieving display that is both stable and rapid.

Since red particles 206 and green particles 207 having an electrostatic charge of opposite polarity are enclosed in the first space 204, the amount of electrostatic charge of the red particles 206 and the green particles 207 is easily maintained over a long period of time. Similarly, since black particles 208 and blue particles 209 having an electrostatic charge of opposite polarity are enclosed in the second space 205, the amount of electrostatic charge of the black particles 208 and the blue particles 209 is easily maintained over a long period of time.

Next, the advantageous effects of using composite particles for the colored particles are described, using the black particles 208 as a representative example.

Adopting a structure for the black particles 208 in which the entire surface of the core particles is covered by surface particles reduces the van der Waals forces produced between the black particles 208 on the one hand and the insulating layer 215 and partition walls 210 on the other. This not only reduces the voltage necessary for pulling the black particles 208 away from the surface to which they have attached, but also improves anti-humidity characteristics. Specifically, when the humidity was raised from 50% to 90% at an atmospheric temperature of 45° C., the amount of electrostatic charge decreased 55% as compared to the initial value for acrylic polymerized toner not covered by surface particles, whereas the composite particles of the present embodiment only exhibited a reduction of approximately 15%.

Furthermore, providing the surface-treated layer with minute protrusions on the surface of the insulating layer 215 and of the partition walls 210, as described above, yields the advantageous effect of further reducing the van der Waals forces operating between these surfaces and the black particles 208.

<Discussion of Position of Focusing Electrodes>

The position of the first focusing electrodes 216 and 217 in the partition walls 210A in the direction of height thereof is preferably set between the front substrate 201 side and the intermediate substrate 203 side of the first space 204, separated from the front substrate 201 side in the direction of height of the partition walls. The position of the second focusing electrodes 218 and 219 in the partition walls 210B in the direction of height thereof is also preferably set between the back substrate 202 side and the intermediate substrate 203 side of the second space 205, separated from the back substrate 202 side of the second space 205 in the direction of height of the partition walls.

As shown in FIG. 22, the ratio h1/H of the height h1 of the partition walls 210c to the total height H of the second partition walls 210B including the second focusing electrodes 218 and 219 is preferably set to be at least $1/5$.

This is because if the ratio h1/H is small, the position of the second focusing electrodes 218 and 219 in the direction of height of the partition walls 210B approaches the second display electrode 214, the electrical field becomes concentrated in the narrow space between the second display electrode 214 and the second focusing electrodes 218 and 219, and the electric energy density increases. Therefore, although the colored particles 208 and 209 attempt to agglomerate in this narrow region, not all of the colored particles can attach to the side of the partition walls 210b, and thus colored particles remain in the central region of the pixel unit. As a result, the degree of reflection and the contrast decrease.

Conversely, if the ratio h1/H nears 1, the height of the second focusing electrodes 218 and 219 can no longer be guaranteed, and a high driving voltage becomes necessary.

Therefore, the ratio h1/H is preferably in a range from $1/5$ to $4/5$ inclusive.

Similarly, the ratio of the height of the partition walls 210b to the height of the entire partition walls 210A is preferably set in a range from $1/5$ to $4/5$ inclusive.

In particular, the first focusing electrodes 216 and 217 and the second focusing electrodes 218 and 219 are preferably positioned near the center of the partition walls 210A and 210B, respectively.

With such focusing electrodes, the display device of the present embodiment achieves excellent contrast, as explained below with reference to the electric energy density distribution diagrams in FIGS. 30-32.

Figure 30:
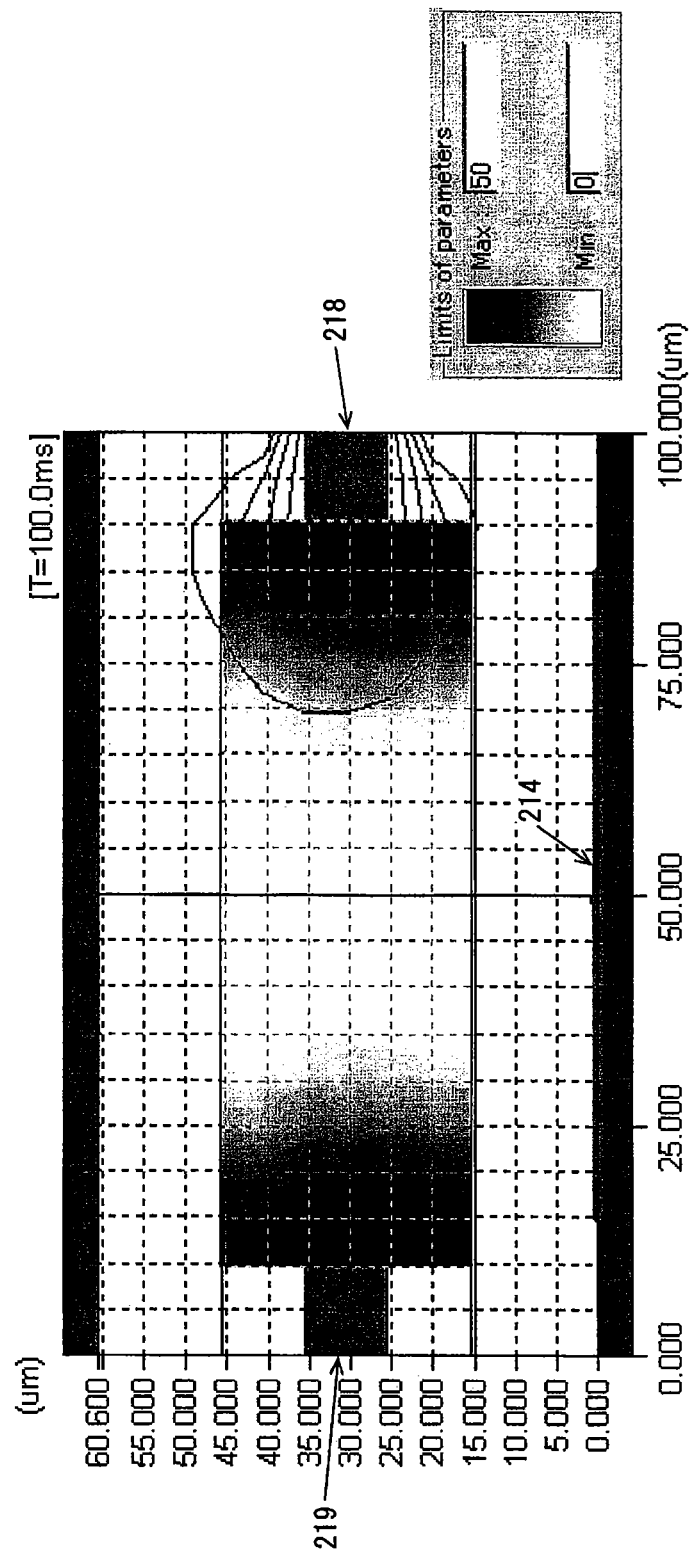
FIG. 30 shows a distribution of electric energy density for the second display element when displaying white.

FIG. 30 shows equipotential lines and a distribution of electric energy density for the second display element 222 when displaying white (FIG. 23).

The second focusing electrodes 218 and 219 are formed to a thickness of 10 μm near the center, in the direction of height, of the partition walls 210B. Therefore, when displaying white, a uniform distribution of a large electric energy density forms along the side of the partition walls 210c between the second display electrode 214 and the second focusing electrodes 218 and 219, as shown in FIG. 30.

Therefore, the voltage necessary for driving the colored particles is reduced, and the black particles 208 that move to near the second focusing electrode 219, as well as the blue particles 209 that move to near the second focusing electrode 218, are caused to evenly attach to the side of the partition walls 210c.

Figure 31:
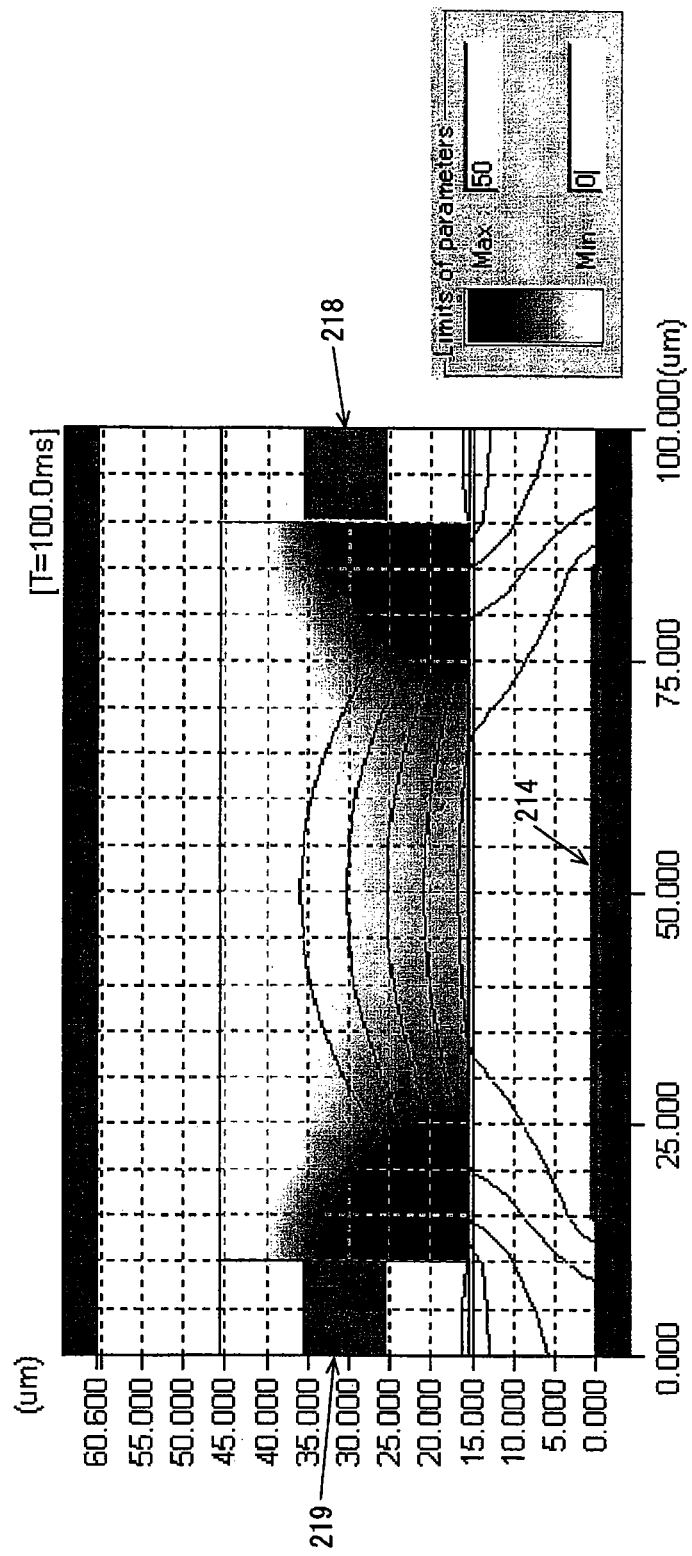
FIG. 31 shows a distribution of electric energy density for the second display element when displaying black.

FIG. 31 shows equipotential lines and a distribution of electric energy density for the second display element 222 when displaying black (FIG. 24).

The second focusing electrodes 218 and 219 are formed thickly near the center, in the direction of height, of the partition walls 210B. Therefore, when displaying black as well, a uniform distribution of electric energy density forms along the side of the partition walls 210c, as shown in FIG. 31. A large electric energy density of 120.6 N/m² forms along the side of the partition walls 210c near the second focusing electrodes 218 and 219.

Therefore, the voltage necessary for driving the colored particles is reduced, and the blue particles 209 that move to near the second focusing electrodes 218 and 219, are caused to evenly attach to the side of the partition walls 210c.

Conversely, the black particles 208 with a positive electrostatic charge are caused to evenly attach above the second display electrode 214, to which negative voltage has been applied, in order to cover the second display electrode 214.

Therefore, display with a highly pure black color and high contrast is achieved.

Figure 32:
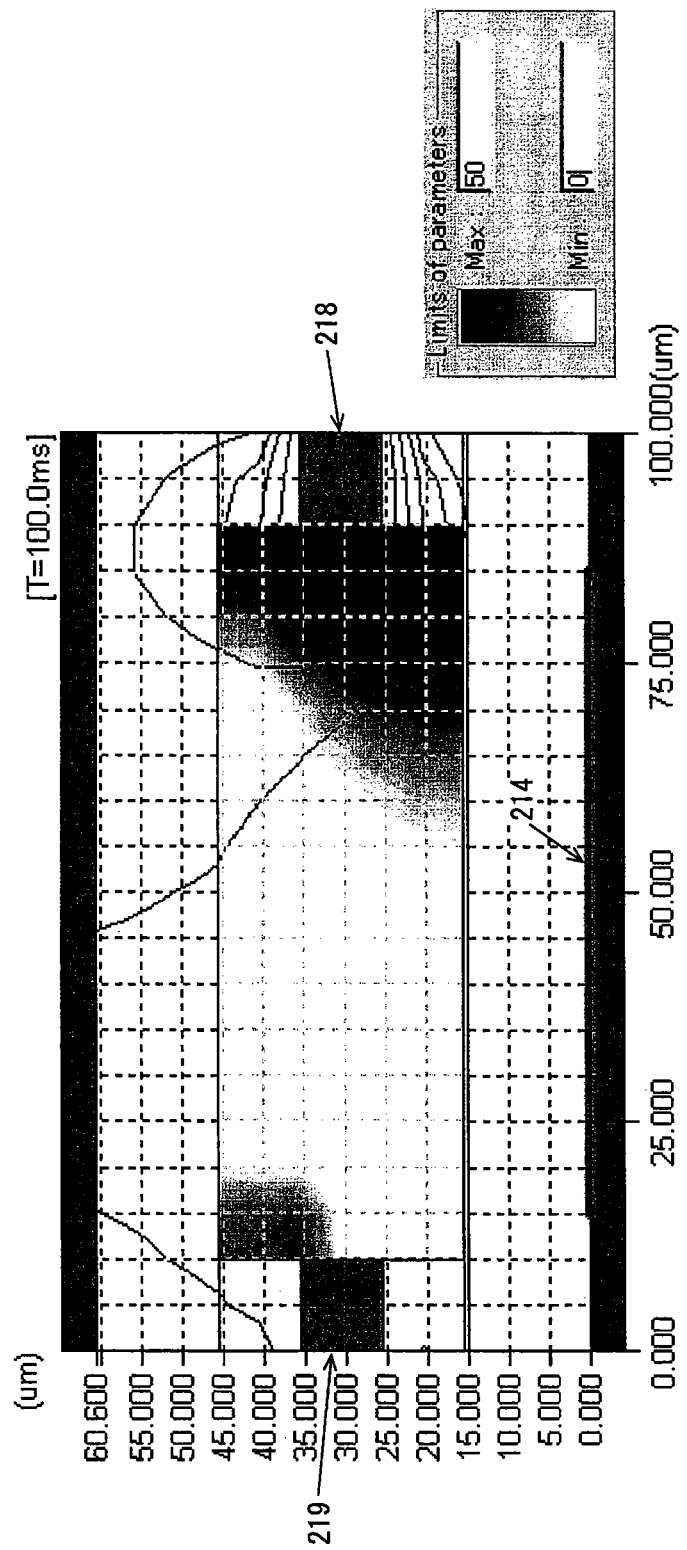
FIG. 32 shows a distribution of electric energy density for the second display element when displaying a green halftone.

FIG. 32 shows equipotential lines and a distribution of electric energy density for the second display element 222 when displaying a green halftone (FIG. 28).

The second focusing electrodes 218 and 219 are formed thickly near the center, in the direction of height, of the partition walls 210. Therefore, when displaying a green halftone as well, a strong, uniform distribution of electric energy density forms along the side of the partition walls 210c between the second focusing electrode 218 and the second display electrode 214, as shown in FIG. 32. The electric energy density is large, measuring 87.6 N/m². Therefore, the blue particles 209 do not remain in the central region of the pixel unit, but rather gather along the side of the partition walls 210c, evenly attaching thereto.

Furthermore, since a smooth distribution of electric energy density forms in the region above the second display electrode 214 near the second focusing electrode 219, as shown in FIG. 32, the black particles 208 with a positive electrostatic charge attach so as to cover a portion of the second display electrode 214 near the second focusing electrode 219.

Similarly, in the first display element 221, the red particles 206 attach evenly along the side of the partition walls 210b, and the green particles 207 attach so as to cover a portion of the first display electrode 211 near the first focusing electrode 216, resulting in display of a highly pure green halftone.

Embodiment 2-2

Figure 33:
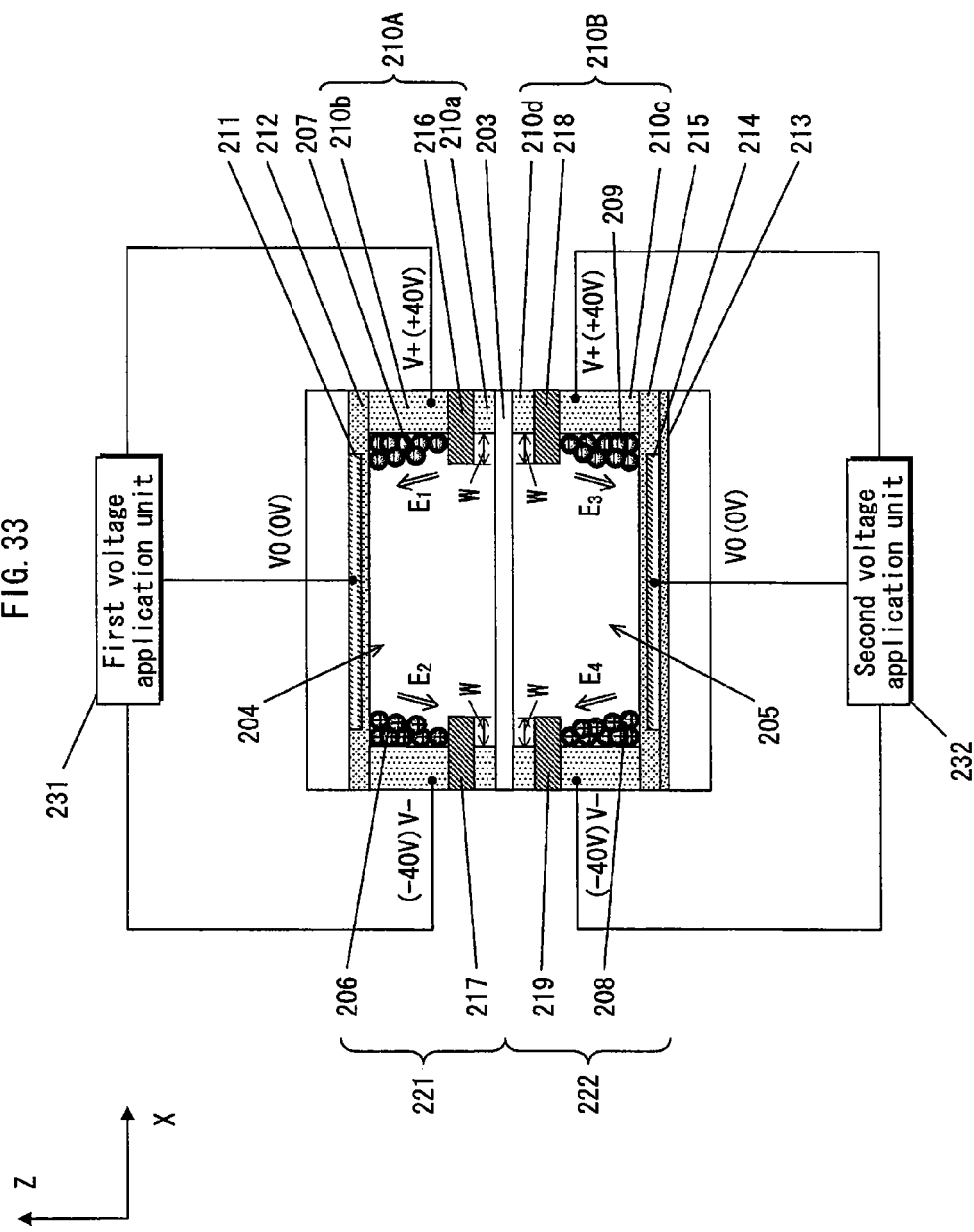
FIG. 33 is a partial cross-section diagram showing a pixel unit in a display device according to Embodiment 2-2.

FIG. 33 is a partial cross-section diagram showing a pixel unit in a display device according to Embodiment 2-2, illustrating a white display state.

The display panel according to the present embodiment is similar to Embodiment 2-1, except that the first focusing electrodes 216 and 217 are formed to project from the side of the first partition walls 210A towards the center of the first space 204, and the second focusing electrodes 218 and 219 are also formed to project from the side of the second partition walls 210B towards the center of the second space 205.

The advantageous effects of the display panel according to the present embodiment are basically similar to Embodiment 2-1. By applying voltage between the first display electrode 211 and the first focusing electrodes 216 and 217, or between the second display electrode 214 and the second focusing electrodes 218 and 219, a uniform distribution of electric energy density forms along the side of the partition walls 210b or the partition walls 210c, and therefore the colored particles 206 and 207, or the colored particles 208 and 209, attach evenly to the side of the partition walls 210b or the partition walls 210c. In the present embodiment, a higher electric energy density than in Embodiment 2-1 forms along the side of the partition walls 210b and the partition walls 210c, resulting in a better white color when displaying white.

Embodiment 2-3

Figure 34:
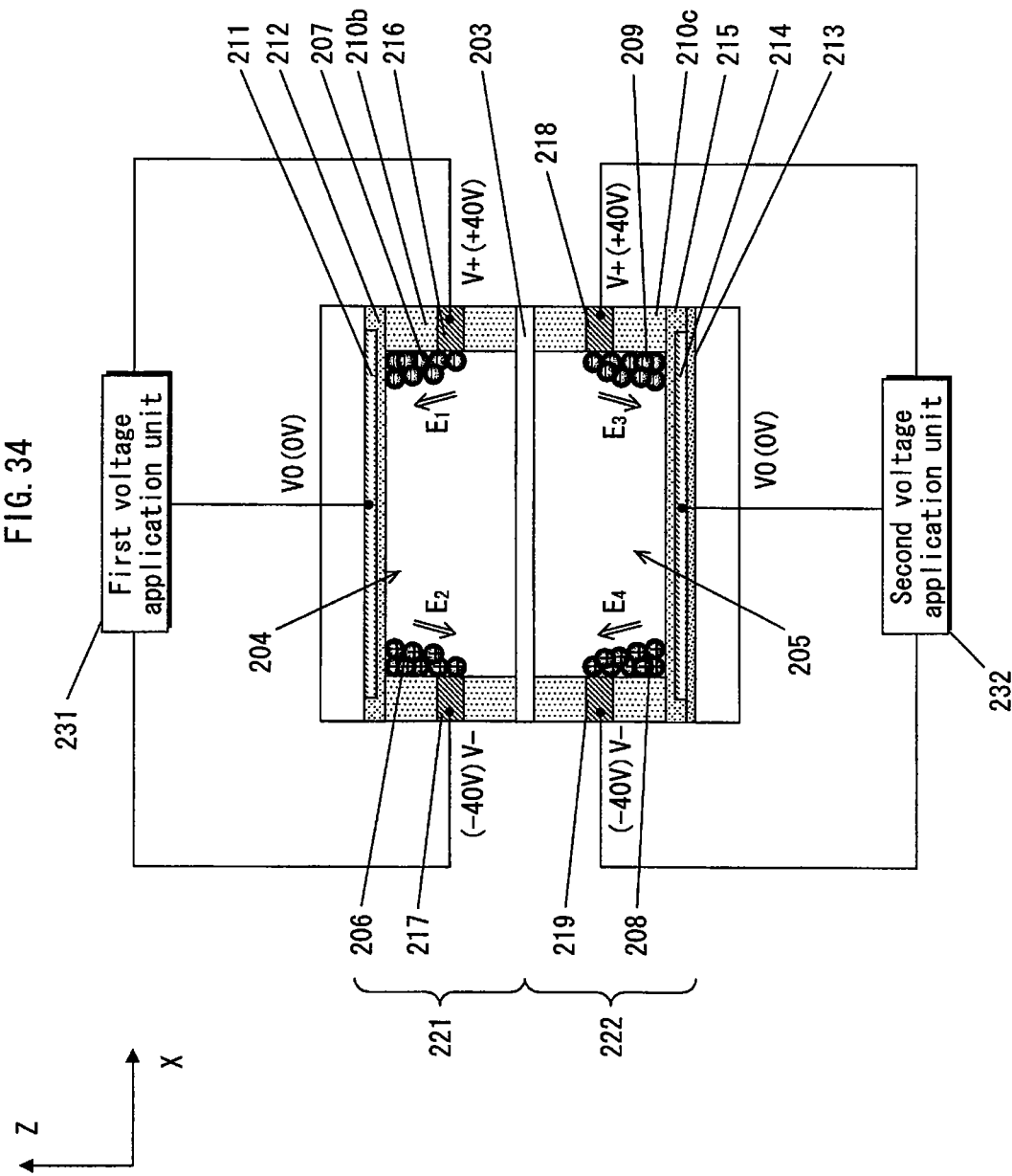
FIG. 34 is a partial cross-section diagram showing a pixel unit in a display device according to Embodiment 2-3.

In Embodiment 2-1 shown in FIG. 22, the dimensions of the first display electrode 211 are set to fit within the region of the cell space 204 on the inner side of the first partition walls 210A. In the present embodiment, however, as shown in FIG. 34, the first display electrode 211 is formed to extend beyond the region of the first space 204, so that in plan view from the front of the panel, the outer periphery of the first display electrode 211 overlaps the first focusing electrodes 216 and 217.

The second display electrode 214 as well is formed to extend beyond the region of the second space 205, so that in plan view from the front of the panel, the outer periphery of the second display electrode 214 overlaps the second focusing electrodes 218 and 219.

The present embodiment achieves similar advantageous effects as Embodiment 2-2. Specifically, by applying voltage between the first display electrode 211 and the first focusing electrodes 216 and 217, or between the second display electrode 214 and the second focusing electrodes 218 and 219, a uniform distribution of electric energy density forms along the side of the partition walls 210b or the partition walls 210c, and therefore the colored particles 206 and 207, or the colored particles 208 and 209, attach evenly to the side of the partition walls 210b or the partition walls 210c. In the present embodiment, a higher electric energy density than in Embodiment 2-1 forms along the side of the partition walls 210b and the partition walls 210c, resulting in a better white color when displaying white.

<Discussion of Types of Colored Particles Enclosed in First and Second Spaces>

* In the above embodiments, the green particles 207 and the blue particles 209 have a negative electrostatic charge property, and the green particles 207 and the black particles 208 have a positive electrostatic charge property. The polarity of the electrostatic charge of the colored particles may, however, be reversed in these embodiments.

Furthermore, with regards to the combination of colored particles enclosed in the first space 204 and in the second space 205, gradations of green, red, black, and blue may be similarly displayed by enclosing, in the first space 204, particles of any two of the colors green, red, black, and blue, and enclosing particles of the remaining two colors in the second space 205.

* In the above embodiments, black particles 208 and blue particles 209 are enclosed in the second space 205 of the second display element 222, yet only blue particles 209 may be enclosed in the second space 205, without use of black particles. In this case, gradations of colors can be displayed with colored particles of three colors: red, green, and blue.

Furthermore, when using colored particles of three colors, i.e. green, red, and blue, gradations of green, red, and blue can be similarly displayed by enclosing colored particles of any one of the colors in the second space 205 and enclosing colored particles of the remaining two colors in the first space 204. In this way, when only using colored particles of one type in the second display element 222, as long as the second display electrode 214 is driven separately, it is not necessary to drive the pair of second focusing electrodes 218 and 219 separately. Instead, the second focusing electrodes 218 and 219 may be made a common electrode.

Furthermore, when using colored particles of three colors, i.e. green, red, and blue, gradations of green, red, and blue can be similarly displayed by enclosing colored particles of any one of the colors in the first space 204 and enclosing colored particles of the remaining two colors in the second space 205. In this case, the first display electrode 211 may be driven independently and the first focusing electrodes 216 and 217 made into a common electrode.

* In the above embodiments, out of consideration for full-color display of images based on additive color mixing, each pixel displays green, red, blue, black, or a halftone thereof. However, in the case of full-color display of images based on subtractive color mixing, instead of green, red, blue, and black, colored pixels that are cyan, magenta, yellow, and black may be used, and each pixel may display cyan, magenta, yellow, black, or a halftone thereof.

In this case, translucent colored particles may be used in the first display element 221, and a mixed color yielded by the colored particles disposed to cover the first display electrode 211 and the colored particles disposed to cover the second display electrode 214 may be displayed.

* One type of colored particles may be enclosed in each of the first space 204 and the second space 205, in which case gradations of each of the two colored particles are displayed.

<Display Method when Reflecting and Transmitting Light>

In the above embodiments, the white reflective layer 213 is provided above the back substrate 202, and color display is achieved by allowing light to enter from the front of the panel and using the colored particles to change the amount of R, G, and B in the light reflected toward the front of the panel. Alternatively, display may be achieved by providing a backlight behind the back substrate 202 to adjust the amount of R, G, and B light that is allowed to pass through the front of the panel.

Embodiment 3

Overall Structure of Display Device

First, the overall structure of a display device according to the present embodiment is described.

Figure 35:
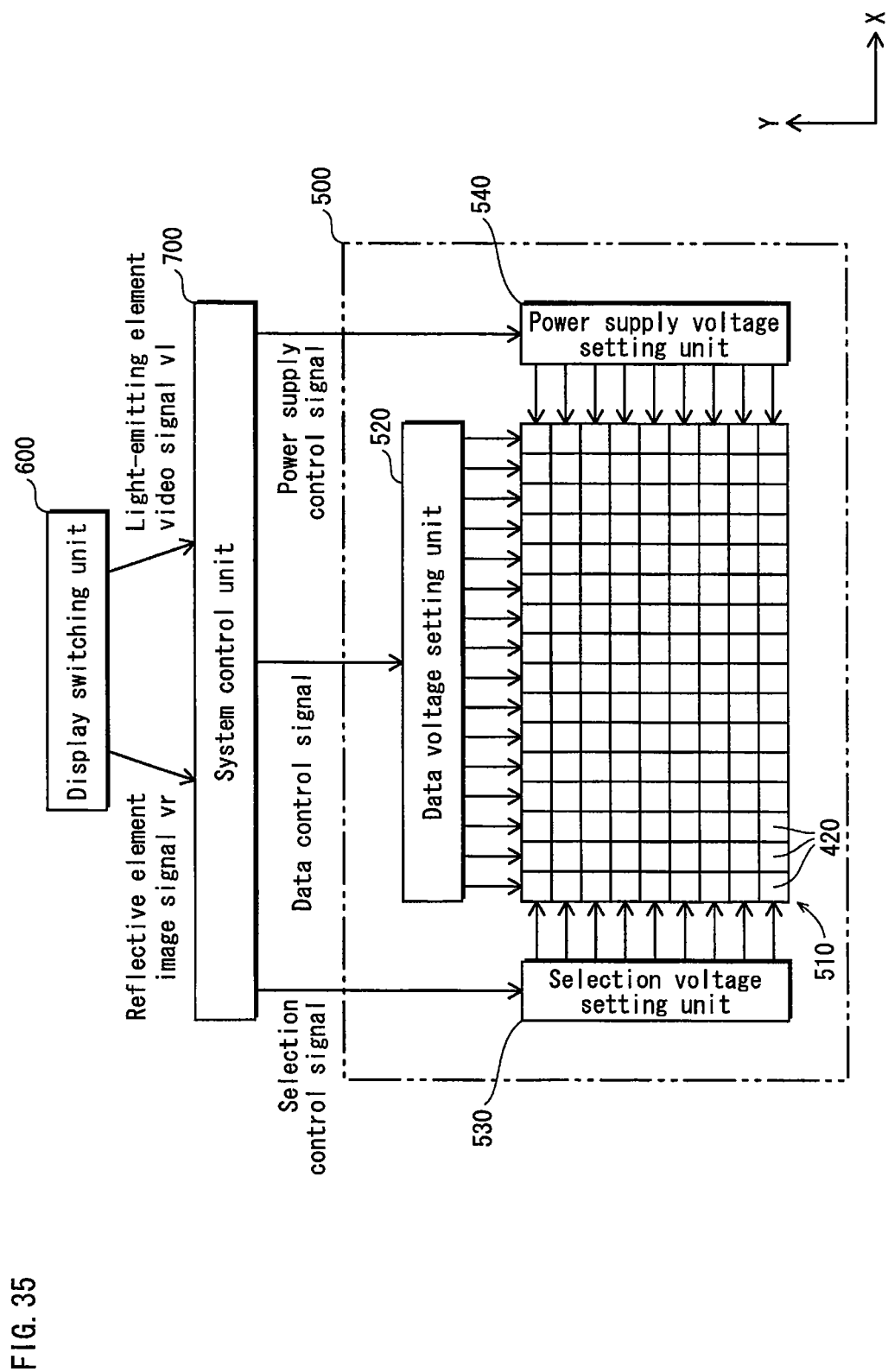
FIG. 35 is a block diagram showing the structure of a display device according to Embodiment 3.

FIG. 35 is a block diagram showing the structure of a display device according to Embodiment 3.

This display device is provided with a display unit 500, a display switching unit 600, and a system control unit 700. In a display panel 510 of the display unit 500, a plurality of pixels 420 are arranged in a matrix along the horizontal direction (X direction) and the vertical direction (Y direction).

Each pixel 420 is provided with both a reflective display element and a light-emitting display element. The display switching unit 600 switches between image display with the reflective display element and image display with the light-emitting display element.

Accordingly, this structure takes advantage of both the characteristics of the light-emitting display element and the reflective display element to achieve display with excellent visibility both indoors and outdoors, with low power consumption.

(Device Structure of Display Panel 510)

The following describes the device structure of the display panel 510. In the present embodiment, a light-emitting display element and a reflective display element are stacked one on top of the other in each pixel 420.

Figure 36:
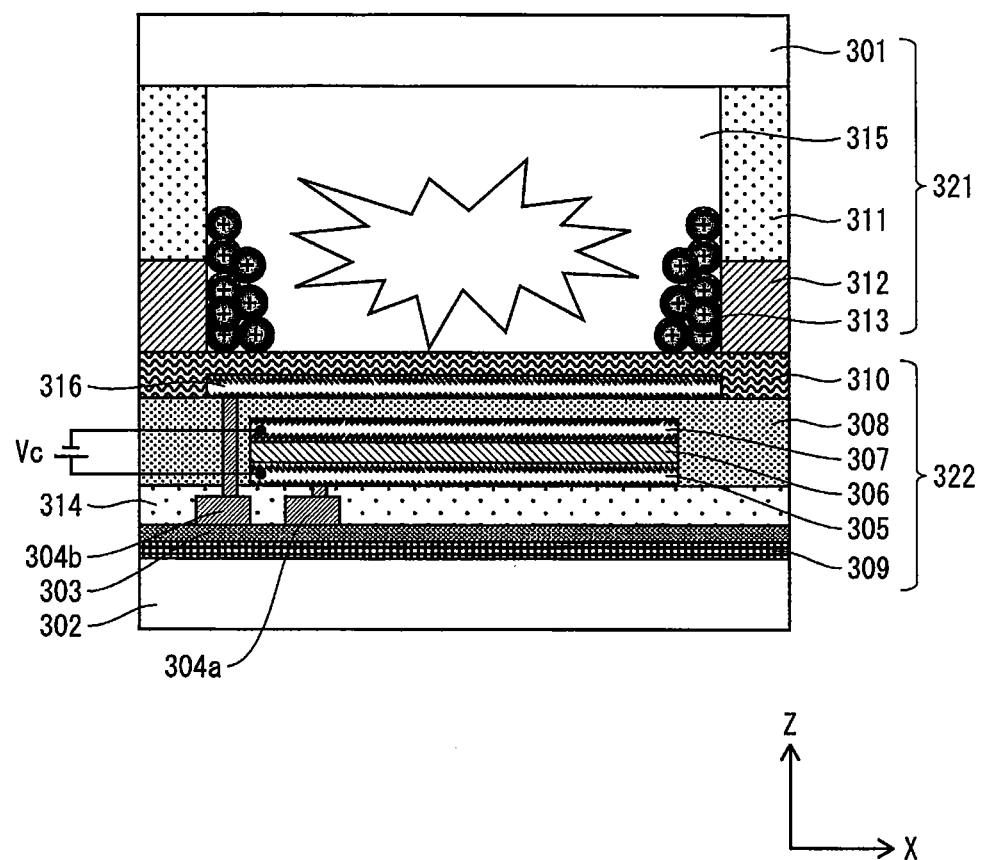
FIG. 36 is a cross-section diagram schematically showing the structure of a pixel unit in the display panel, illustrating light-emitting display.

FIG. 36 is a partial cross-section diagram showing the device structure of the display panel 510, illustrating one pixel 420.

In the display panel 510, a front substrate 301 and a back substrate 302 are disposed to face each other with a space therebetween, and in the space, a light-emitting display element and a reflective display element are provided one above the other in each pixel 420.

An image is displayed towards the front (Z direction) of the display panel 510.

As shown in FIG. 36, a white reflective layer 309 is formed at the lowest position above the inner surface of the back substrate 302, and a first insulating layer 303 is formed thereabove.

Semiconductor switching elements 304a and 304b and a second insulating layer 314 are formed above the first insulating layer 303. A first electrode 305 electrically connected to the semiconductor switching element 304a, a light-emitting layer 306, and a counter electrode 307 are formed above the second insulating layer 314. A sealing layer 308 seals these components. The first electrode 305 and the counter electrode 307 are independently formed for each pixel and are used for light-emitting display.

A pixel electrode 316 electrically connected to the semiconductor switching element 304b and a light-conducting layer 310 are formed above the sealing layer 308.

Above the light-conducting layer 310, partition walls 311 that partition pixels are formed in a criss-crossed fashion in the vertical direction (Y direction) and the horizontal direction (X direction). Along the partition walls 311 partition wall electrodes 312 are formed in the vertical direction (Y direction). Adjacent partition walls 311 enclose a cell space 315 in which black-colored particles 313 are enclosed. The partition wall electrodes 312 are provided as a pair that sandwiches the cell space 315 on the left and right sides thereof.

A front substrate 301 is bonded to the top of the partition walls 311. The cell space 315 is enclosed by the front substrate 301, the light-conducting layer 310, and the partition walls 311.

The constituent elements of the light-emitting display element in this display panel 510 are the first electrode 305, the light-emitting layer 306, the counter electrode 307, and the like.

On the other hand, in addition to the pixel electrode 316, the constituent elements of the reflective display element are the light-conducting layer 310, the partition walls 311, the partition wall electrodes 312, the colored particles 313, the cell space 315, and the like. The reflective display element is located in front of the light-emitting display element. In the reflective display element, the partition wall electrodes 312 are located along the inner wall at either side of the cell space 315, and the pixel electrode 316 is located on the bottom wall of the cell space 315. The partition wall electrodes 312 and the pixel electrode 316 form an in-plane electrode.

The semiconductor switching elements 304a and 304b are used for independent, active driving of either the light-emitting display element or the reflective display element.

The back substrate 302 may be formed from a glass material such as borosilicate alkali glass, soda-lime glass, or the like. A resin film such as PEN, PES, PET, or the like, or a gold film of stainless steel may also be used.

Since it is necessary to extract light from the front substrate 301, the front substrate 301 may be formed from a transparent glass material such as borosilicate alkali glass, soda-lime glass, or the like. A transparent resin film such as PEN, PES, PET, or the like may also be used.

In addition to a low-temperature polysilicon TFT, a microcrystal silicon TFT or amorphous silicon TFT may be used as the semiconductor switching elements 304a and 304b.

The first electrode 305, the counter electrode 307, and the pixel electrode 316 are formed from a transparent electrode material such as Indium Tin Oxide (ITO), Indium Zinc Oxide (IZO), or the like.

The light-emitting layer 306 sandwiched between the first electrode 305, which corresponds to an anode, and the counter electrode 307, which corresponds to a cathode, is an organic EL layer formed from transparent, light-emitting material. When voltage is applied between the electrodes, the light-emitting layer 306 emits light of a color in accordance with the light-emitting material. This light-emitting layer 306 is extremely fragile with respect to moisture but is protected by being covered by the sealing layer 308. It is preferable for the sealing layer 308 to be dense and highly insulating, and it is preferable to use a silicon nitride film, or a silicon oxynitride film, with high light transmission.

The light-conducting layer 310 is formed from a transparent material such as polyvinyl carbazole (PVK), phthalocyanine, or the like.

The partition wall electrodes 312 are formed from a conductive metal such as Cr/Al/Cr, Cr/Cu/Cr, Ti/Al/Ti, or the like. The reason for adopting a sandwich structure with Al or Cu between Cr or Ti is that using Al or Cu, which are low-resistance materials, as the core material increases conductivity of the electrodes, and using Cr and Ti both increases adhesion between the partition walls 311 and the Al or Cu and prevents a reduction in contrast.

The colored particles 313 have a similar structure to the colored particles 4 described in Embodiment 1-1 with reference to FIG. 2, being composite particles formed by a core particle covered by surface particles and having a positive electrostatic charge. Note that the following describes the case of the colored particles 313 having a positive electrostatic charge, but the present invention may be similarly embodied when the colored particles have a negative electrostatic charge.

The core particles are formed by a base of a spherical particle polymer MBX-5 (average particle diameter of 5 μm), produced by Sekisui Plastics Co., Ltd., or of Chemisnow MX-5 (average particle diameter of 5 μm), produced by Soken Chemical and Engineering Co., Ltd. The base is colored with black pigment or the like. The surface particles are monodisperse silica particles electrostatically treated and having an average diameter of 16 nm, thus endowing the colored particles 313 with an electrostatic charge property.

A styrenic, melamine, or other resin material may also be used for the core particles. Silica is used for the surface particles because it allows for stable electrostatic treatment with a silane coupling agent to obtain a large electrostatic charge.

The light-conducting layer 310 has the property of producing carriers when light of a predetermined wavelength range is shone thereupon. The light-conducting layer 310 changes electrostatic state based on the relationship between a reference voltage Vo (=Vgnd) applied to the partition wall electrodes 312 and a positive or negative voltage applied to the pixel electrode 316. In response to this electrostatic state, the positively charged colored particles 313 move to the left or right above the light-conducting layer 310, resulting in a change in the proportion of colored particles 313 covering the light-conducting layer 310 (i.e. the proportion of the colored particles 313 covering the white reflective layer 309).

On the surface of the light-conducting layer 310, it is preferable to provide a surface-treated layer having minute protrusions formed thereon, similar to the surface-treated layer 8b described in Embodiment 1-1 with reference to FIG. 2.

Note that an insulating layer may be provided instead of the light-conducting layer 310, but the colored particles 313 can be moved more stably by providing the light-conducting layer 310 between the partition wall electrodes 312 and the counter electrode 307 as described above.

The front substrate 301, the light-conducting layer 310, the sealing layer 308, the pixel electrode 316, the counter electrode 307, the light-emitting layer 306, the first electrode 305, and the like are all transparent with respect to visible light, as explained above. Therefore, the white reflective layer 309 can be seen from the front of the panel through regions of the light-conducting layer 310 not covered by the colored particles 313.

Furthermore, the light emitted by the light-emitting display element (organic EL element) can be seen from the front of the panel.

(Means for Driving Display Panel 510)

In order to control driving of the display elements in each pixel 420, the display unit 500 is provided with a data voltage setting unit 520, a selection voltage setting unit 530, and a power supply voltage setting unit 540. The system control unit 700 is provided external to the display unit 500.

The system control unit 700 transmits a data control signal, indicating an image signal and the time at which to apply data voltage, to the data voltage setting unit 520, transmits a selection control signal, indicating the time at which to apply selection voltage, to the selection voltage setting unit 530, and transmits a power supply control signal, indicating the time at which to apply power supply voltage, to the power supply voltage setting unit 540.

Based on the data control signal, the selection control signal, and the power supply control signal transmitted by the system control unit 700, the data voltage setting unit 520, the selection voltage setting unit 530, and the power supply voltage setting unit 540 apply data voltage, selection voltage, and power supply voltage to the display elements of the display panel 510 in order to perform light-emitting operations or reflective display operations.

The display device of the present embodiment is provided with a drive circuit that drives the light-emitting element and a drive circuit that drives the reflective element. Each drive circuit is provided with a data voltage setting unit, a selection voltage setting unit, and a power supply voltage setting unit. In other words, the data voltage setting unit 520, the selection voltage setting unit 530, and the power supply voltage setting unit 540 shown in FIG. 35 correspond to a combination of a first data voltage setting unit 521, a first selection voltage setting unit 531, and a first power supply voltage setting unit 541 shown in FIG. 37, and a second data voltage setting unit 525, a second selection voltage setting unit 535, and a second power supply voltage setting unit 545 shown in FIG. 38.

Figure 37:
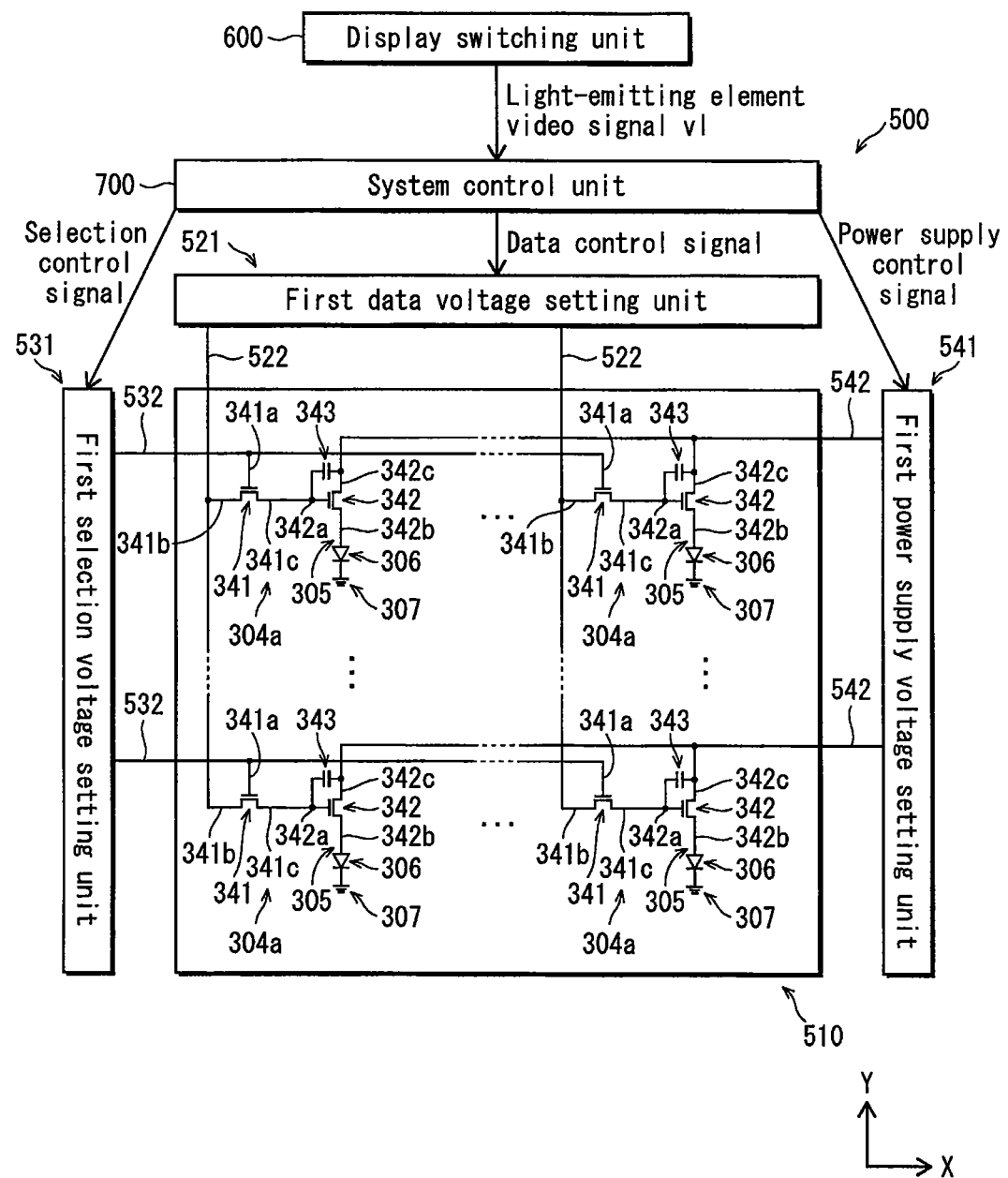
FIG. 37 shows the structure of the drive circuit that drives the light-emitting element.

FIG. 37 shows the structure of the drive circuit that drives the light-emitting element.

As described above, a semiconductor switching element 304a for the light-emitting element is provided in each pixel 420 of the pixel matrix in the display panel 510.

A plurality of data lines 522 extend in the vertical direction (Y direction) from the first data voltage setting unit 521 in order to apply data voltage to each semiconductor switching element 304a. A plurality of selection lines 532 extend in the horizontal direction (X direction) from the first selection voltage setting unit 531 in order to apply selection voltage to each semiconductor switching element 304a, whereas a plurality of power source lines 542 extend in the horizontal direction (X direction) from the first power supply voltage setting unit 541 to provide power supply voltage to each semiconductor switching element 304a.

While not shown in FIG. 36, these lines 522, 532, and 542 are formed along the surface of the back substrate 302. Through the semiconductor switching element 304a, driving voltage is thus applied to the pixel electrode 316 in the light-emitting element.

Structure of the Semiconductor Switching Element 304a

As shown in FIG. 37, each semiconductor switching element 304a includes a first TFT 341, a second TFT 342, and a capacitor 343.

A gate electrode 341a of the first TFT 341 is connected to the selection line 532, a gate electrode 341b of the first TFT 341 is connected to the data line 522, and an electrode 341c is connected to a gate electrode 342a of the second TFT 342.

An electrode 342c of the second TFT 342 is connected to the power line 542, and an electrode 342b is connected to the first electrode 305.

The capacitor 343 is connected between the gate electrode 342a of the second TFT 342 and the power line 542.

Figure 38:
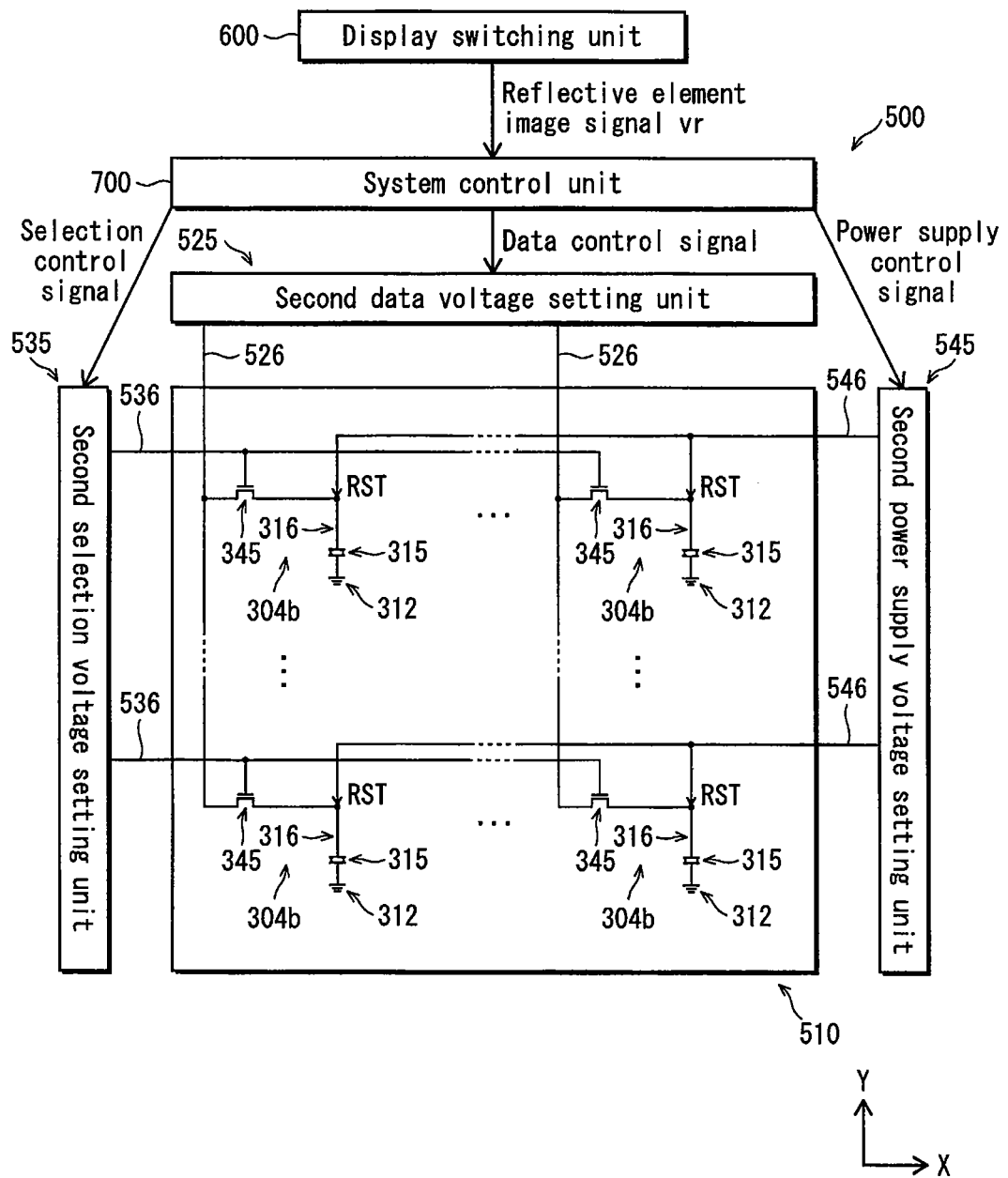
FIG. 38 shows the structure of the drive circuit that drives the reflective element.

FIG. 38 shows the structure of the drive circuit that drives the reflective element.

A semiconductor switching element 304b for the reflective element is provided in each pixel 420 of the pixel matrix in the display panel 510.

A plurality of data lines 526 extend in the vertical direction (Y direction) from the second data voltage setting unit 525 in order to apply data voltage to each semiconductor switching element 304b, whereas a plurality of selection lines 536 extend in the horizontal direction (X direction) from the second selection voltage setting unit 535 in order to apply selection voltage to each semiconductor switching element 304b.

A reset voltage Vrst can be applied by the second power supply voltage setting unit 545 to the pixel electrode 316 in each pixel. This reset voltage Vrst may be applied from the data voltage setting unit 520 to the pixel electrodes 316 via a plurality of data lines 522 and the first TFT 341; however, in the present embodiment, a plurality of power supply lines 546 are shown extending in the horizontal direction (X direction) from the second power supply voltage setting unit 545 to the location indicated by the arrow RST in FIG. 38.

These lines 526, 536, and 546 are also formed along the surface of the back substrate 302.

Structure of the Semiconductor Switching Element 304b

As shown in FIG. 38, each semiconductor switching element 304b has a TFT 345. A gate electrode 345a of the TFT 345 is connected to the selection line 536, an electrode 345b of the TFT 345 is connected to the data line 526, and an electrode 345c is connected to the pixel electrode 316, so that driving voltage can be applied to the pixel electrode 316.

Note that each partition wall electrode 312 that extends along the partition walls 311 in the vertical direction (Y direction), as described above, faces the pixel on either side. All of the partition wall electrodes 312 are connected at a constant standard potential Vo (=Vgnd).

(Operations of Display Device)

Operations of the display device with the above structure are described with reference to FIGS. 35-41.

When the display switching unit 600 selects display by the light-emitting elements, a light-emitting element video signal vl is transmitted to the system control unit 700, whereas when the display switching unit 600 selects reflective display, a reflective element image signal vr is transmitted to the system control unit 700.

The light-emitting element video signal vl is a video signal mainly for displaying video and is composed of image signals for a plurality of frames transmitted sequentially.

The reflective element image signal vr is an image signal for displaying a still image. An image signal for one frame is composed of luminance signals for all of the pixels 420 in the display panel 510.

Upon receiving the light-emitting element video signal vl, the system control unit 700 first performs a reset operation, and then, based on the light-emitting element video signal vl, transmits a data control signal to the first data voltage setting unit 521, a selection control signal to the first selection voltage setting unit 531, and a power supply control signal to the first power supply voltage setting unit 541, thus driving the light-emitting display element in each pixel 420 via the setting units 521, 531, and 541 in order to display one frame of an image. When displaying video, such display of one frame of an image is repeated. During this time, the reflective display element is in an off state.

On the other hand, upon receiving the reflective element image signal vr, the system control unit 700 first performs a reset operation, and then, based on the reflective element image signal vr, transmits a data control signal to the second data voltage setting unit 525, a selection control signal to the second selection voltage setting unit 535, and a power supply control signal to the second power supply voltage setting unit 545, thus driving the reflective display element in each pixel 420 via the setting units 525, 535, and 545 in order to display an image. During this time, the light-emitting display element is in an off state.

The following describes 1. the reset operation, 2. image display by the light-emitting elements, and 3. image display by the reflective elements.

1. Reset Operation

At the time of a reset, the system control unit 700 applies a positive reset voltage Vrst (+40 V) from the second power supply voltage setting unit 545 to the pixel electrode 316 (the location of the arrow RST in FIG. 38) in all of the pixels 420 at once.

Figure 39:
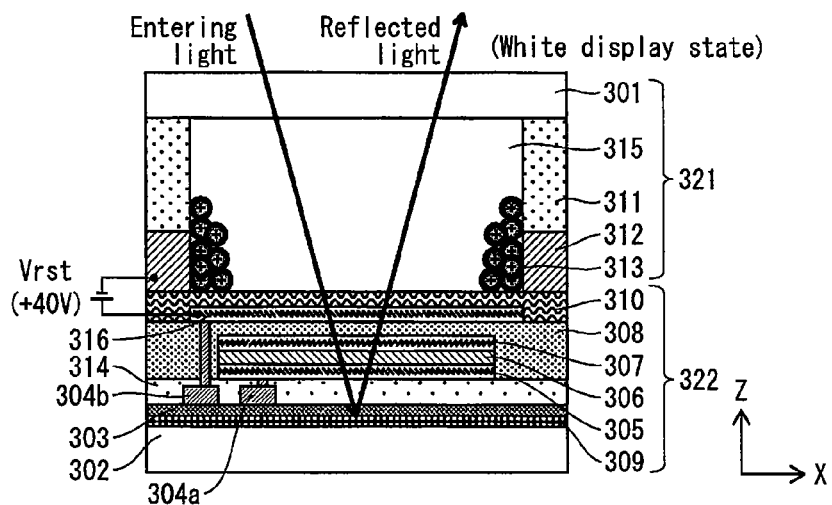
FIG. 39 is a cross-section diagram schematically showing the structure of a pixel unit in the display panel, illustrating white display.

Via this reset operation, an electrical field forms in the reflective display element from the pixel electrode 316 to the partition wall electrodes 312. Therefore, as shown in FIG. 39, the colored particles 313 (with a positive electrostatic charge) located above the light-conducting layer 310 are forced towards the partition walls 311 (towards the partition wall electrodes 312), exposing the light-conducting layer 310. Accordingly, light that enters from the front of the panel traverses the light-conducting layer 310 without being blocked by the colored particles 313, reflects off the white reflective layer 309, and is emitted from the front of the panel, thus yielding a white display state.

With such a reset operation, all of the pixels in the display panel 510 enter a white display state, thus preventing burn-in whereby colored particles 313 remain attached to the light-conducting layer 310.

The cell space 315 encloses a gas, and it is necessary to apply a voltage of a certain magnitude for the colored particles 313 to begin movement. Therefore, this white display state (initial state) is maintained until driving voltage is next applied to the pixel electrode 316.

2. Image Display by Light-Emitting Elements

For image display by the light-emitting elements, the system control unit 700 turns the drive circuit of the reflective elements to an off state, and using the semiconductor switching elements 304a of the light-emitting elements, drives the light-emitting element in each pixel 420 similarly to how a regular active organic EL display is driven.

In other words, a selection voltage Vs is applied from the first selection voltage setting unit 531 consecutively to a plurality of lines 532, and a data pulse of a magnitude corresponding to the display luminance to be displayed in the corresponding pixel is applied from the first data voltage setting unit 521 to each of a plurality of lines 522. In this way, in each pixel 420, a charge corresponding to the display luminance is maintained in the capacitor 343 via the first TFT 341.

By applying a positive driving voltage Vc uniformly from the first power supply voltage setting unit 541 to each power supply line 542, the conductance of the second TFT 342 in the semiconductor switching element 304a of each pixel 420 changes in accordance with the charge stored in the capacitor 343. Therefore, in the organic EL element of each pixel 420, the power supplied by the first power supply voltage setting unit 541 is controlled by the second TFT 342, yielding a light-emitting display in accordance with a light-emitting element video signal vl for one frame.

Video display is achieved by repeating such light-emitting display of one frame.

The front substrate 301, the light-conducting layer 310, the pixel electrode 316, the sealing layer 308, the counter electrode 307, the first electrode 305, and the like are all transparent with respect to visible light. Therefore, light from the light-emitting elements is emitted from the front of the panel through regions of the light-conducting layer 310 not covered by the colored particles 313. Light that is emitted from the light-emitting elements towards the back is reflected by the white reflective layer 309 and emitted from the front of the panel.

3. Image Display by Reflective Elements

For image display by reflective elements, the system control unit 700 turns the drive circuit of the light-emitting elements to an off state, and using the semiconductor switching elements 304b of the reflective elements, drives the reflective element in each pixel 420.

In other words, while applying a selection voltage Vs from the second selection voltage setting unit 535 consecutively to a plurality of selection lines 536, the system control unit 700 applies a negative data voltage VD from the second data voltage setting unit 525 to each of a plurality of data lines 526, the data voltage VD having a magnitude corresponding to a display luminance based on a reflective element image signal yr.

In this way, in each pixel 420 along the selection line 526 to which the selection voltage Vs is applied, the data voltage VD is applied to the pixel electrode 316, and each pixel 420 is written based on the reflective element image signal yr.

This data voltage VD is determined to be a magnitude appropriate for changing a pixel in a white display state to a black display or a halftone display.

The value that is appropriate for the data voltage VD differs according to the colored particles 313 that are used, the type of front substrate 301, and other such factors. In the present embodiment, the data voltage VD for a pixel that is to display black is −30 V, and the data voltage VD for a pixel that is to display a halftone is −10 V to −20 V. On the other hand, no data voltage VD is applied to pixels that are to display white.

During the above writing operation, since no voltage is applied to the first electrode 305, the light-emitting layer 306 does not emit light.

During this writing operation, since no voltage is applied to the pixel electrode 316 in pixels that are to display white, the colored particles 313 in these pixels do not move. Accordingly, the colored particles 313 remain in the initial state shown in FIG. 39, wherein the positively charged colored particles 313 have been forced to attach to the partition walls 311. Light that enters from the front of the panel traverses the light-conducting layer 310 without being blocked by the colored particles 313, reflects off the white reflective layer 309, and is emitted from the front of the panel, thus yielding a white display state.

Figure 40:
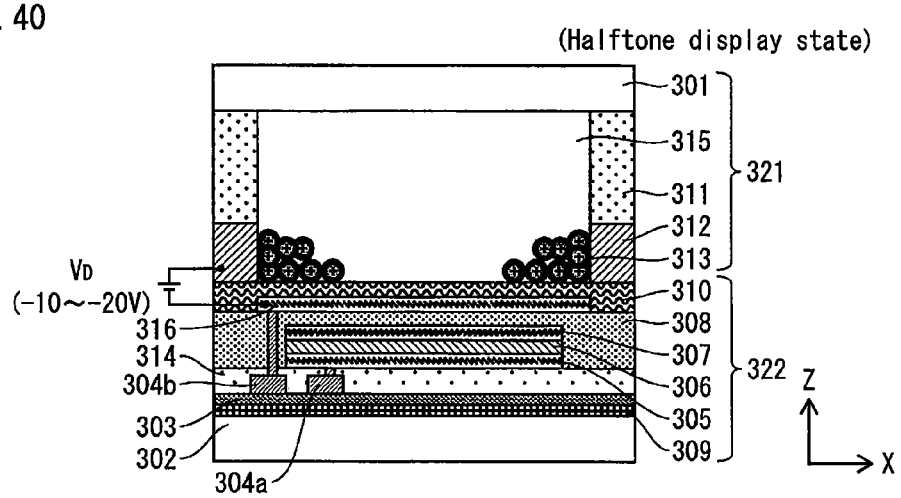
FIG. 40 is a cross-section diagram schematically showing the structure of a pixel unit in the display panel, illustrating halftone display.

In pixels that are to display a halftone, a negative voltage of −10 V to −20 V is applied to the pixel electrode 316, and therefore an electrical field forms from the partition wall electrodes 312 towards the pixel electrode 316, yielding a negative electrical charge near the surface of the light-conducting layer 310. As a result, as shown in FIG. 40, a portion of the positively charged colored particles 313 is attracted towards the pixel electrode 316, so that a portion of the light-conducting layer 310 is covered by the black-colored particles 313. This yields a halftone display that combines the white reflective layer 309 with the black-colored particles 313.

Figure 41:
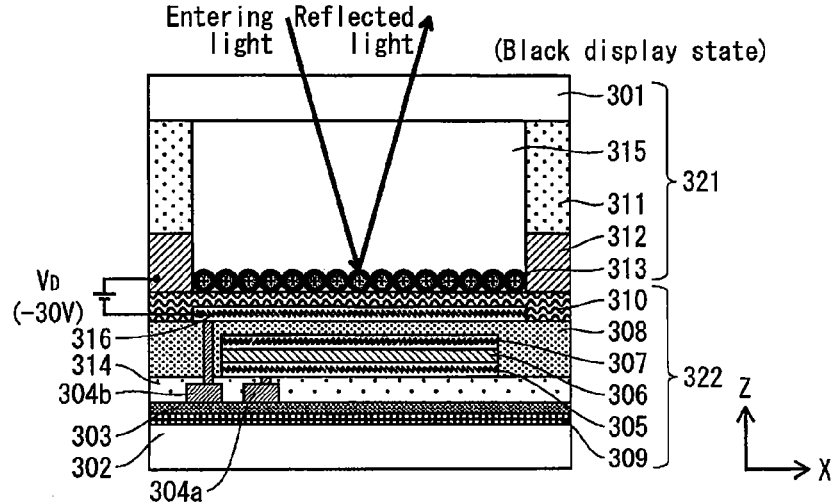
FIG. 41 is a cross-section diagram schematically showing the structure of a pixel unit in the display panel, illustrating black display.

A negative voltage of −30 V is applied to the pixel electrode 316 of pixels displaying black. As a result, the negative charge near the surface of the light-conducting layer 310 prevails even more, and as shown in FIG. 41, the positively charged colored particles 313 are forced towards the pixel electrode 316, thus spreading so as to cover the light-conducting layer 310. In this pixel, the entire white reflective layer 309 is thereby covered by the black-colored particles 313, thus yielding a black display state.

In this way, based on the reflective element image signal vr, the reflective element in each pixel in the display panel 510 displays white, a halftone, or black, thereby displaying one frame of an image.

After writing, the colored particles 313 remain attached to the surface layer of the light-conducting layer 310, even if no voltage is applied to the pixel electrode 316, due to van der Waals forces. Therefore, image display is maintained without consuming power.

Accordingly, the text screen or still image of an electronic book can be displayed over an extended time with little power consumption.

Next, when a reflective element image signal vr for displaying new contents is transmitted from the display switching unit 600, the system control unit 700 performs a reset operation and a writing operation, as above.

(Method of Manufacturing Display Panel 510)

Manufacturing Array Substrate 322

The white reflective layer 309, which is formed from a titanium oxide (titania) film, is coated, printed, cold sprayed, or the like on the back substrate 302, which is formed from alkalifree glass.

Next, the transparent first insulating layer 303 is formed from $SiO_2$ by a method such as vapor deposition, CVD, or the like. It is necessary for the thickness of the first insulating layer 303 to be sufficient to eliminate protrusions on the white reflective layer 309, yielding a smooth surface. In the present embodiment, the thickness is 1 μm-2 μm.

The semiconductor switching elements 304a and 304b are then formed from an amorphous TFT. This step may be performed using the same formation method as for general amorphous TFT used in liquid crystal displays and organic EL displays.

Subsequently, the first electrodes 305, the light-emitting layers 306, and the counter electrodes 307 are formed after forming the second insulating layer 314. This step is performed by the same method as for forming electrodes and light-emitting layers in an organic EL display. The first electrodes 305 and the counter electrodes 307 are formed from ITO, which is a transparent conductive material.

The sealing layer 308 is formed by ICP-CVD from a silicon nitride film with a thickness of 100 nm-200 nm. ICP stands for Inductively Coupled Plasma and allows for thicker film formation at a lower temperature than other types of CVD. Use of ICP-CVD reduces the damage caused to the light-emitting layer 306, which is formed from organic EL material, by heat during film formation, thus achieving a dense silicon nitride film with an even higher visible light transmission of 95% and high moisture resistance.

Next, the transparent pixel electrodes 316 are formed from ITO, and finally, the light-conducting layer 310 is formed from polyvinyl carbazole (PVK), phthalocyanine, or the like by a method such as coating or printing. A surface-treated layer, having protrusions on the surface thereof, is formed on the surface of the light-conducting layer 310, as indicated below.

Through the above process, the array substrate 322 is manufactured to have the layers from the white reflective layer 309 through the light-conducting layer 310 formed on the back substrate 302.

Note that the array substrate 322 is similar to an array substrate used in a conventional organic EL display, yet differs by including the white reflective layer 309, the light-conducting layer 310, and the pixel electrodes 316 for reflective display.

Formation of the Surface-Treated Layer on the Light-Conducting Layer 310

A coating agent formed by dispersing $TiO_2$ particles in a medium is applied to the surface of the light-conducting layer 310 to form a surface-treated layer.

Specifically, a surface-treated layer is formed on the surface layer of the light-conducting layer 310, like the surface-treated layer 8b on the insulating layer 8 as described in Embodiment 1-1 and shown in FIG. 2. This surface-treated layer is formed by a $TiO_2$ particle layer and a polycarbonate insulating layer that is exposed on the uppermost surface.

The surface-treated layer thus formed is firm, has a high degree of transparency, and is a uniform layer, with agglomerations of $TiO_2$ particles being relatively rare, and layered particles having an even particle diameter distribution. The layer is approximately 100 nm thick.

Depending on the type or amount of $TiO_2$ particles used in the coating agent, conductivity of the surface-treated layer that is formed can be adjusted.

Thus forming the surface-treated layer on the surface of the light-conducting layer 310 reduces the van der Waals forces operating between the light-conducting layer 310 and the colored particles 313, thereby allowing for smooth movement of the colored particles 313 during driving.

The $TiO_2$ particles used for the coating agent are 30 nm in diameter, smaller than the colored particles 313 that are 5 μm in diameter. The reason for adopting this size is that if particles having a larger diameter than the colored particles 313 are used to form the surface-treated layer, the protrusions formed on the surface-treated layer become large, and the colored particles 313 end up attaching between the protrusions, thus eliminating the advantageous effect of reducing the van der Waals forces.

This sort of surface-treated layer may be formed not only on the light-conducting layer 310, but also on the surface of the partition walls 311 and the partition wall electrodes 312. By doing so, conditions such as electric resistance, electrostatic charge property, and shape are uniform across the entire surface of the cell space 315, yielding nearly the same voltage characteristics as the colored particles 313 attached to the surface-treated layer and achieving good display characteristics during driving.

Manufacturing Counter Substrate 321

The partition walls 311 are formed in a criss-cross fashion on the front substrate 301, which is formed from alkalifree glass, by a method such as photolithography. Next, after forming a film of conductive metal along the partition walls 311 by a method such as sputtering or vapor deposition, the partition wall electrodes 312 are formed by a method such as dry etching.

The counter substrate 321 is thus manufactured to have the partition walls 311 and the partition wall electrodes 312 formed on the front substrate 301.

Method of Manufacturing Colored Particles

The method of manufacturing the colored particles 313 uses the hybridization system, like the method for the colored particles 4 described in Embodiment 1-1. Details such as the proportion of surface particles covering the entire surface of the core particles are similar to the description of the colored particles 4 in Embodiment 1-1.

The manufactured colored particles 313 have a positive electrostatic charge, and in order to maintain the charge amount constant, it is preferable to store the colored particles 313 in an atmosphere of dry air, dry nitrogen gas, or the like having a constant amount of moisture.

Panel Assembly Process

The colored particles 313 are spread nearly evenly in the spaces partitioned by the partition walls 311 for each pixel in the counter substrate 321 manufactured as above. The counter substrate 321 is then overlaid on the array substrate 322. The periphery of the front substrate 301 is coated with an epoxy-based UV adhesive.

Subsequently, the elements formed by the counter substrate 321 and the array substrate 322 are aligned, and the counter substrate 321 and the array substrate 322 are exposed to UV light. The adhesive thereby hardens to complete assembly of the display panel 510.

It is preferable to assemble the display panel in a dry gas atmosphere (such as dry nitrogen) that has been desiccated to severely reduce moisture. By doing so, dry gas from which moisture has been removed is enclosed in the cell space 315 with the colored particles 313, and the amount of electrostatic charge of the colored particles 313 is maintained constant.

(Advantageous Effects of the Display Device According to the Present Embodiment)

The main advantageous effect of the display panel 510 is that in each pixel 420, by providing the cell space 315 of the reflective display element on top of the light-emitting display element composed of the first electrode 305, the light-emitting layer 306, and the counter electrode 307, the area occupied by the light-emitting display element and the reflective display element in the pixel 420 increases.

Furthermore, the reflective display element is provided with in-plane electrodes 312 and 316 along the cell space 315, in which the colored particles 313 are enclosed, and voltage is applied between the electrodes 312 and 316 from the voltage setting units 520-540. Display is achieved through changing the amount of light that is reflected after entering from the front of the display panel 510 by causing the colored particles 313 to shift between being gathered by the partition wall electrodes 312 and being spread along the pixel electrode 316. Therefore, when driving the light-emitting display element for light-emitting display, the colored particles 313 are caused to gather by the partition wall electrodes 312, as shown in FIG. 36, in order to increase the aperture ratio of the reflective display element and allow light from the light-emitting display element to be emitted well from the front of the panel. This achieves video display performance similar to a regular top-emission organic EL display.

In this way, the display device of the present embodiment achieves good image display with almost no reduction in image quality during both reflective display and light-emitting display.

The light-emitting display element is formed from material transparent with respect to visible light, and the white reflective layer 309 is provided behind the light-emitting display element. Therefore, the white reflective layer 309 is not only used for display by the reflective display element, but also has the function of reflecting light emitted by the light-emitting display element forwards.

In the reflective display element, the colored particles 313 are enclosed in a gas in the cell space 315, the refractive index of which is approximately one. Therefore, good optical characteristics are obtained as compared to when the particles are enclosed in an insulating transparent liquid used in an electrophoretic system, such as silicon oil (refractive index of 1.4). Furthermore, since the colored particles 313 are enclosed in a gas, a voltage of a certain magnitude is necessary to begin movement, but the colored particles move quickly after movement begins.

Therefore, the colored particles remain stably at rest in the cell space 315 when driving voltage is not applied to the reflective display element yet move rapidly when driving voltage is applied, thus achieving display that is both stable and rapid.

Next, the advantageous effects of the composite particles are described.

As explained above, adopting a structure for the colored particles 313 in which the entire surface of the core particles is covered by surface particles reduces the van der Waals forces produced between the colored particles 313 on the one hand and the light-conducting layer 310, the partition walls 311, and the partition wall electrodes 312 on the other. This not only reduces the voltage necessary for pulling the colored particles 313 away from the surface to which they have attached, but also improves anti-humidity characteristics. Specifically, when the humidity was raised from 50% to 90% at an atmospheric temperature of 45° C., the amount of electrostatic charge decreased 55% as compared to the initial value for acrylic polymerized toner not covered by surface particles, whereas the composite particles of the present embodiment only exhibited a reduction of approximately 15%.

Furthermore, providing the surface-treated layer with minute protrusions on the surface of the light-conducting layer 310, the partition walls 311, and the partition wall electrodes 312, as described above, yields the advantageous effect of further reducing the van der Waals forces operating between these surfaces and the colored particles 313.

(Experiments)

1. Experiments were performed to assess the voltage characteristics of a variety of combinations of material quality for the colored particles 313 and material quality for the surface-treated layer of the light-conducting layer 310, focusing on the triboelectric series.

In the triboelectric series, polycarbonate is positioned relatively close to acrylic resin (PMMA), the compositional material of the colored particles 313. The experiments revealed that using polycarbonate for the surface-treated layer of the light-conducting layer 310 yielded good voltage characteristics when applying voltage to the pixel electrode 316. This is considered to be because the homogenous electrostatic characteristics of the colored particles 313 and the surface-treated layer of the light-conducting layer 310 led to a small electrostatic force therebetween.

2. The voltage necessary for changing from a black display state to a white display state was measured for when the light-conducting layer 310 was and was not provided with a surface-treated layer.

Figure 42:
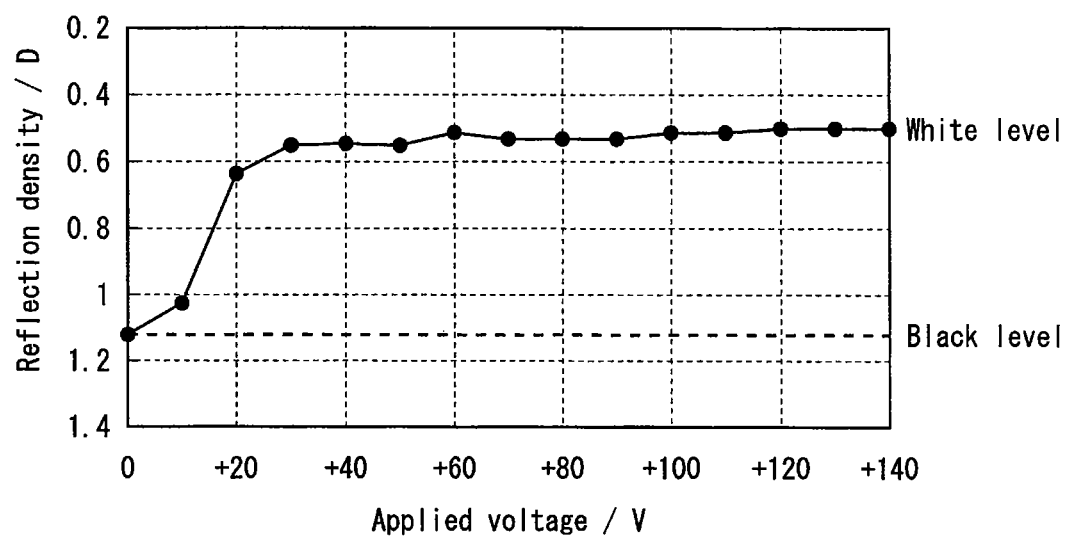
FIG. 42 is a graph showing voltage characteristics in the display device of an embodiment.

FIG. 42 is a graph showing the result of measuring voltage characteristics when providing a surface-treated layer on the surface of the light-conducting layer 310 in the display device of the present embodiment. FIG. 42 shows the relationship between (i) the voltage applied between the partition wall electrodes 312 and the pixel electrode 316 and (ii) reflection density.

As shown in FIG. 42, during the black display state, little voltage was necessary to move the colored particles 313, and the minimum necessary applied voltage (saturation voltage) for changing to white display was 30 V, a low value.

On the other hand, similar observation when no surface-treated layer was provided on the surface of the light-conducting layer 310 in this display device revealed a high saturation voltage of 150 V.

This is considered to be because of a reduction in the van der Waals forces operating between the colored particles 313 and the inner surface of the cell space 315, caused by a drastic reduction of the contact therebetween due to provision of the surface-treated layer. The good relationship between the electrostatic charge property of the surface-treated layer and the colored particles 313 is also considered to be another reason.

<Modifications and the Like>

In the display device of the present embodiment, one pair of a reflective display element overlaid on a light-emitting display element is provided in each pixel. Alternatively, a display device capable of full-color display may be achieved by providing a plurality of pairs of a reflective display element overlaid on a light-emitting display element and displaying gradations of colors such as R, G, and B.

Embodiment 4-1

Overall Structure of Display Device

First, the overall structure of a display device according to Embodiment 4-1 is described.

The structure of the display device according to Embodiment 4-1 is similar to the structure shown in the block diagram of FIG. 35 in Embodiment 3. The display device is provided with a display unit 500, a display switching unit 600, and a system control unit 700. In a display panel 510 of the display unit 500, a plurality of pixels 420 are arranged in a matrix along the horizontal direction (X direction) and the vertical direction (Y direction).

Each pixel 420 is provided with both a reflective display element and a light-emitting display element. The display switching unit 600 switches between image display with the reflective display element and image display with the light-emitting display element.

Accordingly, this structure takes advantage of both the characteristics of the light-emitting display element and the reflective display element to achieve display with excellent visibility both indoors and outdoors, with low power consumption.

(Device Structure of Display Panel 510)

The following describes the device structure of the display panel 510. In the present embodiment, a light-emitting display element and a reflective display element are stacked one on top of the other in each pixel 420.

Figure 43:
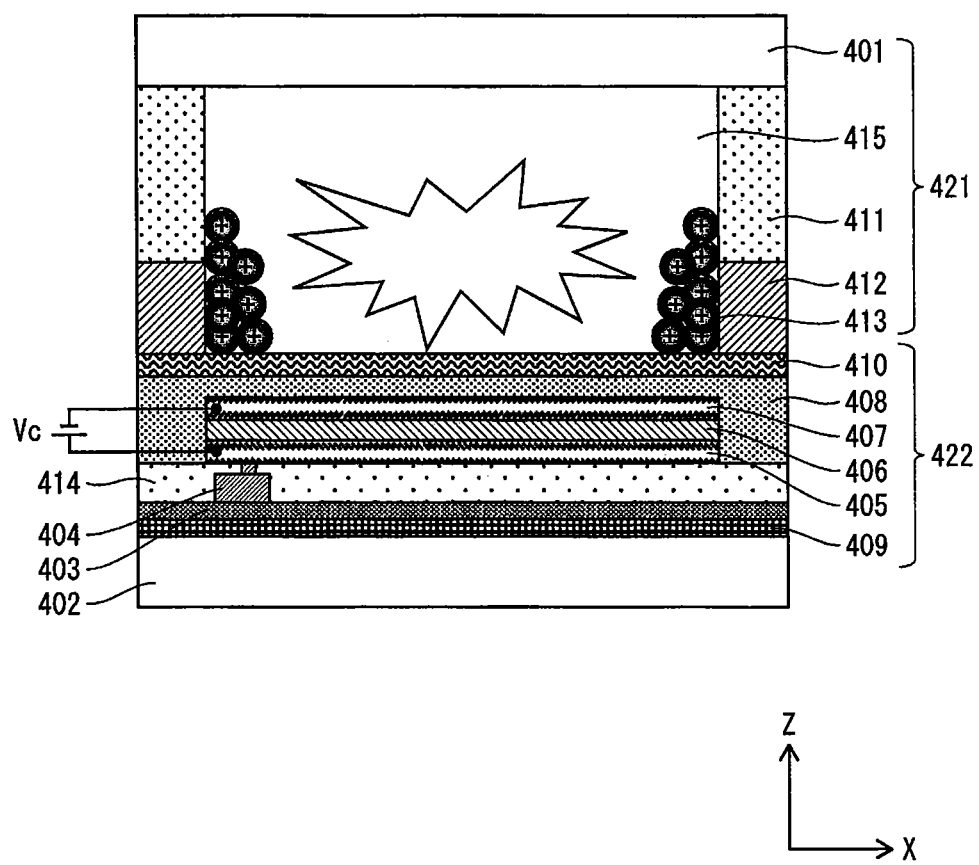
FIG. 43 is a cross-section diagram schematically showing the structure of a pixel unit in the display panel according to Embodiment 4-1, illustrating light-emitting display.

FIG. 43 is a partial cross-section diagram showing the device structure of the display panel 510, illustrating one pixel 420.

In the display panel 510, a front substrate 401 and a back substrate 402 are disposed to face each other with a space therebetween, and in the space, a light-emitting display element and a reflective display element are provided one above the other in each pixel 420. An image is displayed towards the front (Z direction) of the display panel 510.

As shown in FIG. 43, a white reflective layer 409 is formed at the lowest position above the inner surface of the back substrate 402, and a first insulating layer 403 is formed thereabove.

A semiconductor switching element 404 and a second insulating layer 414 are formed above the first insulating layer 403. A first electrode 405 electrically connected to the semiconductor switching element 404, a light-emitting layer 406, and a counter electrode 407 are formed above the second insulating layer 414. A sealing layer 408 seals these components. A light-conducting layer 410 is formed above the sealing layer 408.

Above the light-conducting layer 410, partition walls 411 that partition pixels are formed in a criss-crossed fashion in the vertical direction (Y direction) and the horizontal direction (X direction). Along the partition walls 411, partition wall electrodes 412 are formed in the vertical direction (Y direction). Black-colored particles 413 are enclosed in a cell space 415 located between the partition walls 411 of each pixel. The partition wall electrodes 412 are provided in a pair to the left and the right.

A front substrate 401 is bonded to the top of the partition walls 411. The cell space 415 is enclosed by the front substrate 401, the light-conducting layer 410, and the partition walls 411.

The constituent elements of the light-emitting display element in this display panel 510 are the first electrode 405, the light-emitting layer 406, the counter electrode 407, and the like.

On the other hand, in addition to sharing use of the counter electrode 407 as part of an in-plane electrode, the constituent elements of the reflective display element are the white reflective layer 409, the light-conducting layer 410, the partition walls 411, the partition wall electrodes 412, the colored particles 413 in the cell space 415, and the like. The reflective display element is located in front of the light-emitting display element.

In the reflective display element, the partition wall electrodes 412 are located along both inner side walls of the cell space 415, and the counter electrode 407 is located along the bottom of the cell space 415. The counter electrode 407 and the pair of partition wall electrodes 412 form an in-plane electrode.

In the present embodiment, the first electrode 405 and the counter electrode 407 are pixel electrodes provided independently for each pixel. The semiconductor switching element 404 and the counter electrode 407 are used to actively drive the light-emitting display element and the reflective display element independently.

The back substrate 402 may be formed from a glass material such as borosilicate alkali glass, soda-lime glass, or the like. A resin film such as PEN, PES, PET, or the like, or a gold film of stainless steel may also be used.

Since it is necessary to extract light from the front substrate 401, the front substrate 401 may be formed from a transparent glass material such as borosilicate alkali glass, soda-lime glass, or the like. A transparent resin film such as PEN, PES, PET, or the like may also be used.

In addition to a low-temperature polysilicon TFT, a microcrystal silicon TFT or amorphous silicon TFT may be used as the semiconductor switching element 404.

The first electrode 405 and the counter electrode 407 are formed from a transparent electrode material such as Indium Tin Oxide (ITO), Indium Zinc Oxide (IZO), or the like.

The light-emitting layer 406 sandwiched between the first electrode 405, which corresponds to an anode, and the counter electrode 407, which corresponds to a cathode, is an organic EL layer formed from transparent, light-emitting material. When voltage is applied between the electrodes, the light-emitting layer 406 emits light of a color in accordance with the light-emitting material. Since the light-emitting layer 406 is extremely fragile with respect to moisture, it is preferable for the sealing layer 408 to be dense and highly insulating, and it is preferable to use a silicon nitride film, or a silicon oxynitride film, with high light transmission.

The light-conducting layer 410 is formed from a transparent material such as polyvinyl carbazole (PVK), phthalocyanine, or the like.

The partition wall electrodes 412 are formed from a conductive metal such as Cr/Al/Cr, Cr/Cu/Cr, Ti/Al/Ti, or the like. The reason for adopting a sandwich structure with Al or Cu between Cr or Ti is that using Al or Cu, which are low-resistance materials, as the core material increases conductivity of the electrodes, and using Cr and Ti both increases adhesion between the partition walls 411 and the Al or Cu and prevents a reduction in contrast.

Like the colored particles 4 described in Embodiment 1-1 with reference to FIG. 2, the colored particles 413 are composite particles, in which core particles are covered by surface particles, and have a positive electrostatic charge.

The core particles are formed by a base of a spherical particle polymer MBX-5 (average particle diameter of 5 µm), produced by Sekisui Plastics Co., Ltd., or Chemisnow MX-5 (average particle diameter of 5 µm), produced by Soken Chemical and Engineering Co., Ltd. The base is colored with black pigment or the like. The surface particles are electrostatically treated monodisperse silica particles having an average diameter of 16 nm, thus endowing the colored particles 413 with an electrostatic charge property.

The light-conducting layer 410 has the property of producing carriers when light of a predetermined wavelength range is shone thereupon. The light-conducting layer 410 changes electrostatic state based on the relationship between a reference voltage Vo (=Vgnd) applied to the partition wall electrodes 412 and a positive or negative voltage applied to the first electrode 405. In response to this electrostatic state, the positively charged colored particles 413 move to the left or right above the light-conducting layer 410, resulting in a change in the proportion of colored particles 413 covering the light-conducting layer 410 (i.e. the proportion of the colored particles 413 covering the white reflective layer 409).

Like the surface-treated layer 8b of the insulating layer 8 shown in FIG. 2, it is preferable to provide a surface-treated layer having minute protrusions formed thereon on the surface of the light-conducting layer 410. Note that an insulating layer may be provided instead of the light-conducting layer 410, but the colored particles 413 can be moved more stably by providing the light-conducting layer 410 between the partition wall electrodes 412 and the counter electrode 407 as described above.

The front substrate 401, the light-conducting layer 410, the sealing layer 408, the counter electrode 407, the light-emitting layer 406, the first electrode 405, and the like are all transparent with respect to visible light, as explained above. Therefore, the white reflective layer 409 can be seen from the front of the panel through regions of the light-conducting layer 410 not covered by the colored particles 413.

Furthermore, the light emitted by the light-emitting display element (organic EL element) can be seen from the front of the panel.

(Means for Driving Display Panel 510)

In order to control driving of the display elements in each pixel 420, the display unit 500 is provided with a data voltage setting unit 520, a selection voltage setting unit 530, and a power supply voltage setting unit 540. The system control unit 700 is provided external to the display unit 500.

The system control unit 700 transmits a data control signal, indicating an image signal and the time at which to apply data voltage, to the data voltage setting unit 520, transmits a selection control signal, indicating the time at which to apply selection voltage, to the selection voltage setting unit 530, and transmits a power supply control signal, indicating the time at which to apply power supply voltage, to the power supply voltage setting unit 540.

Based on the data control signal, the selection control signal, and the power supply control signal transmitted by the system control unit 700, the data voltage setting unit 520, the selection voltage setting unit 530, and the power supply voltage setting unit 540 apply data voltage, selection voltage, and power supply voltage to the display elements of the display panel 510 in order to perform light-emitting operations or reflective display operations.

In the display device of the present embodiment, the light-emitting element and the reflective element in each pixel 420 are driven by a common semiconductor switching element 404.

Figure 44:
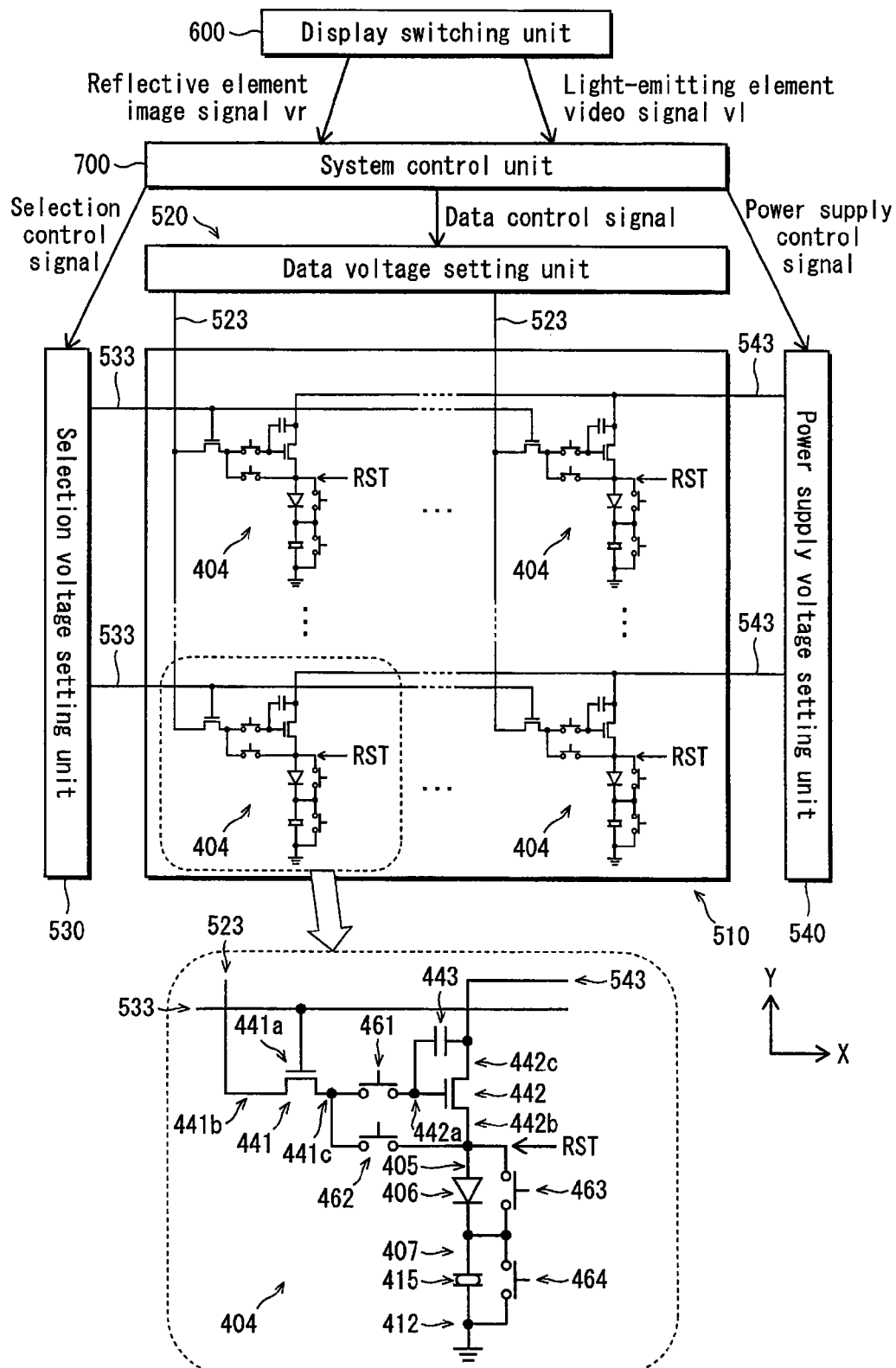
FIG. 44 shows the structure of the drive circuit that drives the light-emitting element and the reflective element according to Embodiment 4-1.

FIG. 44 shows the structure of the drive circuit that drives the light-emitting element and the reflective element.

As described above, a semiconductor switching element 404 is provided in each pixel 420 of the pixel matrix in the display panel 510.

A plurality of data lines 523 extend in the vertical direction (Y direction) from the data voltage setting unit 520 in order to apply data voltage to each semiconductor switching element 404, a plurality of selection lines 533 extend in the horizontal direction (X direction) from the selection voltage setting unit 530 in order to apply selection voltage to each semiconductor switching element 404, and a plurality of power source lines 543 extend in the horizontal direction (X direction) from the power supply voltage setting unit 540 to provide power supply voltage to each semiconductor switching element 404.

While not shown in FIG. 43, these lines 523, 533, and 543 are formed along the surface of the back substrate 402.

Through the semiconductor switching element 404, driving voltage is applied to the first electrode 405 and the counter electrode 407 so as to drive the light-emitting display element and the reflective display element.

Structure of the Semiconductor Switching Element 404

As shown in FIG. 44, each semiconductor switching element 404 includes a first TFT 441, a second TFT 442, a capacitor 443, and non-contact switches 461-464.

A gate electrode 441*a* of the first TFT 441 is connected to the selection line 533. A gate electrode 441*b* of the first TFT 441 is connected to the data line 523, and a gate electrode 441*c* of the first TFT 441 is connected via the non-contact switch 461 to a gate electrode 442*a* of the second TFT 442.

An electrode 442*c* of the second TFT 442 is connected to the power line 543, and an electrode 442*b* is connected to the first electrode 405.

The capacitor 443 is connected between the gate electrode 442*a* of the second TFT 442 and the power line 543.

The electrode 441*c* of the first TFT 441 is connected to the first electrode 405 via the non-contact switch 462.

The first electrode 405 and the counter electrode 407 are connected via the non-contact switch 463, and the counter electrode 407 is connected via the non-contact switch 464.

The non-contact switches 461-464 are connected to control lines (not shown in the figures) that are common to all of the pixels. FIG. 2 shows whether each of the non-contact switches 461-464 is ON or OFF during light-emitting display, during reflective element display, and during a reset.

TABLE 2

| | Light-emitting element display | Reflective element display | Reset |
|---|---|---|---|
| Switch 461 | ON | OFF | OFF |
| Switch 462 | OFF | ON | OFF |
| Switch 463 | OFF | ON | ON |
| Switch 464 | ON | OFF | OFF |

Furthermore, in the present embodiment, reset lines (not shown in the figures) are provided from the power supply voltage setting unit 540 to the point in each pixel 420 shown by the arrow RST in FIG. 44, allowing for a positive reset voltage Vrst (+80 V) to be applied simultaneously to all of the first electrodes 405. Note that the reset voltage Vrst may be applied to the first electrodes 405 from the data voltage setting unit 520 via the plurality of data lines 523 and first TFT elements 441.

Each partition wall electrode 412 that extends along the partition walls 411 in the vertical direction (Y direction), as described above, faces the pixel on either side. All of the partition wall electrodes 412 are connected at a constant standard potential Vo (=Vgnd).

(Operations of Display Device)

Operations of the display device with the above structure are described with reference to FIGS. 42-47.

When the display switching unit 600 selects display by the light-emitting elements, a light-emitting element video signal vl is transmitted to the system control unit 700, whereas when the display switching unit 600 selects reflective display, a reflective element image signal vr is transmitted to the system control unit 700.

The light-emitting element video signal vl is a video signal mainly for displaying video and is composed of image signals for a plurality of frames transmitted sequentially.

The reflective element image signal vr is an image signal for displaying a still image. An image signal for one frame is composed of luminance signals for all of the pixels 420 in the display panel 510.

Upon receiving the light-emitting element video signal vl, the system control unit 700 first performs a reset operation, and then, based on the light-emitting element video signal vl, transmits a data control signal to the data voltage setting unit 520, a selection control signal to the selection voltage setting unit 530, and a power supply control signal to the power supply voltage setting unit 540, thus driving the light-emitting display element in each pixel 420 via the setting units 520-540 in order to display one frame of an image. When displaying video, such display of one frame of an image is repeated. During this time, the reflective display element is in an off state.

On the other hand, upon receiving the reflective element image signal vr, the system control unit 700 first performs a reset operation, and then, based on the reflective element image signal vr, transmits a data control signal to the data voltage setting unit 520 and a selection control signal to the selection voltage setting unit 530, thus driving the reflective display element in each pixel 420 via the setting units 520-530 in order to display an image. During this time, the light-emitting display element is in an off state.

The following describes 1. the reset operation, 2. image display by the light-emitting elements, and 3. image display by the reflective elements.

1. Reset Operation

At the time of a reset, the system control unit 700 turns the switch 463ON and the switches 461, 462, and 464 OFF in all of the pixels 420 at once, as shown in Table 2, and then applies a reset voltage Vrst from the power supply voltage setting unit 540 to the location of the arrow RST in FIG. 44.

As a result, the first electrode 405 and the counter electrode 407 are connected to each other and separated from GND, and a positive reset voltage Vrst (+80 V) is applied at once to all of the first electrodes 405 and counter electrodes 407.

Via this reset operation, an electrical field forms in the reflective display element from the counter electrode 407 to the partition wall electrodes 412. Therefore, as shown in FIG. 45, the colored particles 413 (with a positive electrostatic charge) located above the light-conducting layer 410 are forced towards the partition walls 411 (towards the partition wall electrodes 412), exposing the light-conducting layer 410. Accordingly, light that enters from the front of the panel reflects off the white reflective layer 409 and is emitted from the front of the panel, thus yielding a white display state.

With such a reset operation, all of the pixels in the display panel 510 enter a white display state, thus preventing burn-in whereby colored particles 413 remain attached to the light-conducting layer 410.

This white display state (initial state) is maintained until a voltage exceeding a threshold voltage Vth for driving the reflective display element is next applied to the counter electrode 407.

The magnitude of this threshold voltage Vth differs according to the colored particles 413 that are used, the type of substrate, and other such factors. In the present embodiment, the threshold voltage Vth is from several dozen V to several hundred V, since the colored particles 413 in the cell space 415 move in a gas. Until a voltage equal to or greater than the threshold voltage Vth is applied to the counter electrode 407, the colored particles 413 do not move, thus maintaining the white display state (initial state).

2. Image Display by Light-Emitting Elements

For image display by the light-emitting elements, the system control unit 700 turns the switches 461 and 464 ON and the switches 462 and 463 OFF in all of the pixels 420 at once, as shown in Table 2, and then drives the EL element in each pixel 420 similarly to how a regular active organic EL display is driven.

In other words, a selection voltage Vs is applied from the selection voltage setting unit 530 consecutively to a plurality of lines 533, and a data pulse of a magnitude corresponding to the display luminance to be displayed in the corresponding pixel is applied from the data voltage setting unit 520 to each of a plurality of data lines 523. In this way, in each pixel 420, a charge corresponding to the display luminance is maintained in the capacitor 443 via the first TFT 441.

By applying a positive driving voltage Vc uniformly from the power supply voltage setting unit 540 to each power supply line 543, the conductance of the second TFT 442 in the semiconductor switching element 404 of each pixel 420 changes in accordance with the charge stored in the capacitor 443. Therefore, in the organic EL element of each pixel 420, the power supplied by the power supply voltage setting unit 540 is controlled by the second TFT 442, yielding a light-emitting display in accordance with a light-emitting element video signal vl for one frame.

Video display is achieved by repeating such light-emitting display of one frame.

In this embodiment, the driving voltage Vc supplied from the power supply voltage setting unit 540 to each power line 543 is approximately 2 V-10 V. Therefore, when driving the organic EL element, the voltage between the first electrode 405 and the counter electrode 407 is at most approximately 10 V, and the magnitude of the voltage between the partition wall electrodes 412 and the counter electrode 407 is also at most approximately 10 V, which is smaller than the above threshold voltage Vth (several dozen V to several hundred V).

Accordingly, while the light-emitting display element is being driven, the colored particles 413 do not move, and the initial state shown in FIG. 45, in which the colored particles 413 are attached to the partition walls 411 yielding a large aperture ratio, is maintained.

Furthermore, as described above, the front substrate 401, the light-conducting layer 410, the sealing layer 408, the counter electrode 407, the first electrode 405, and the like are all transparent with respect to visible light.

Therefore, light from the light-emitting elements passes through the light-conducting layer 410 without being blocked by the colored particles 413 and is emitted from the front of the panel. Light that is emitted from the light-emitting elements towards the back is reflected by the white reflective layer 409 and emitted from the front of the panel.

3. Image Display by Reflective Elements

For image display by the reflective elements, the system control unit 700 turns the switches 462 and 463 ON and the switches 461 and 464 OFF in all of the pixels 420 at once, as shown in Table 2. As a result, the first electrodes 405 and the counter electrodes 407 are set to the same electric potential, and a negative data voltage VD can be applied to these electrodes 405 and 407 from the data voltage setting unit 520.

While applying a selection voltage Vs from the selection voltage setting unit 530 consecutively to a plurality of selection lines 533, the system control unit 700 applies a negative data voltage VD from the data voltage setting unit 520 to each of a plurality of data lines 523, the data voltage VD having a magnitude corresponding to a display luminance based on a reflective element image signal vr.

In this way, in each pixel 420 along the selection line 533 to which the selection voltage Vs is applied, the data voltage VD is applied to the counter electrode 407, and each pixel 420 is written based on the reflective element image signal vr.

This data voltage VD is determined to be a magnitude appropriate for changing a pixel in a white display state to a black display or a halftone display.

In other words, the data voltage VD for halftone display in a pixel is set between the saturation voltage and the threshold voltage for changing a pixel in a white display state to black display, whereas the magnitude of the data voltage VD for black display in a pixel is set to be approximately the saturation voltage.

The value that is appropriate for the data voltage VD differs according the colored particles 413 that are used, the type of front substrate 401, and other such factors. In the present embodiment, the threshold voltage for changing a pixel in a white display state to black display is −40 V, the saturation voltage is −60 V, the data voltage VD for a pixel that is to display black is −60 V, and the data voltage VD for a pixel that is to display a halftone is −50 V. On the other hand, no data voltage VD is applied to pixels that are to display white.

Note that during the above writing operation, since the first electrode 405 and the counter electrode 407 are at the same electric potential, the light-emitting layer 406 does not emit light.

During this writing operation, since no voltage is applied to the counter electrode 407 in pixels that are to display white, the colored particles 413 in these pixels do not move. Accordingly, the positively charged colored particles 413 remain in the initial state shown in FIG. 45, being forced towards and attached to the partition walls 411, so that light entering from the front of the panel is reflected by the white reflective layer 409 to emerge from the front of the panel, yielding a white display.

In pixels that are to display a halftone, a negative voltage of approximately −50 V is applied to the counter electrode 407. Therefore, an electrical field formed from the partition wall electrodes 412 towards the counter electrode 407, producing a negative electrical charge near the surface of the light-conducting layer 410. As a result, as shown in FIG. 46, a portion of the positively charged colored particles 413 is attracted towards the second electrode 416, so that a portion of the light-conducting layer 410 is covered by the black-colored particles 413. This yields a halftone display that combines the white reflective layer 409 with the black-colored particles 413.

A negative voltage of approximately −60 V is applied to the counter electrode 407 of pixels displaying black. As a result, the negative electrical charge near the surface of the light-conducting layer 410 completely prevails, and as shown in FIG. 47, the positively charged colored particles 413 are forced towards the light-conducting layer 410, thus spreading so as to cover the light-conducting layer 410.

In this pixel, the entire white reflective layer 409 is thereby covered by the black-colored particles 413, thus yielding a black display state.

In this way, based on the reflective element image signal vr, the reflective element in each pixel in the display panel 510 displays white, a halftone, or black, thereby displaying one frame of an image.

After writing, the colored particles 413 remain attached to the surface of the light-conducting layer 410, even if no voltage is applied to the counter electrode 407, due to van der Waals forces. Therefore, image display is maintained without consuming power.

Accordingly, the text screen or still image of an electronic book can be displayed over an extended time with little power consumption.

Next, when a reflective element image signal vr for displaying new contents is transmitted from the display switching unit 600, the system control unit 700 performs a reset operation and a writing operation, as above.
(Method of Manufacturing Display Panel 510)
Manufacturing Array Substrate 422

The white reflective layer 409, which is formed from a titanium oxide (titania) film, is coated, printed, cold sprayed, or the like on the back substrate 402, which is formed from alkalifree glass.

Next, the transparent first insulating layer 403 is formed from $SiO_2$ by a method such as vapor deposition, CVD, or the like. It is necessary for the thickness of the first insulating layer 403 to be sufficient to eliminate protrusions on the white reflective layer 409, yielding a smooth surface. In the present embodiment, the thickness is 1 μm-2 μm.

The semiconductor switching element 404 is then formed from an amorphous TFT. This step may be performed using the same formation method as for general amorphous TFT used in liquid crystal displays and organic EL displays.

Subsequently, the first electrodes 405, the light-emitting layers 406, and the counter electrodes 407 are formed after forming the second insulating layer 414. This step is performed by the same method as for forming electrodes and light-emitting layers in an organic EL display. The first electrodes 405 and the counter electrodes 407 are formed from ITO, which is a transparent conductive material.

The sealing layer 408 is formed by ICP-CVD from a silicon nitride film with a thickness of 100 nm-200 nm. ICP stands for Inductively Coupled Plasma and allows for thicker film formation at a lower temperature than other types of CVD. Use of ICP-CVD reduces the damage caused to the light-emitting layer 406, which is formed from organic EL material, by heat during film formation, thus achieving a dense silicon nitride film with an even higher visible light transmission of 95% and high moisture resistance.

Finally, the light-conducting layer 410 is formed from polyvinyl carbazole (PVK), phthalocyanine, or the like by a method such as coating or printing.

A surface-treated layer, having protrusions on the surface thereof, is formed on the surface of the light-conducting layer 410.

Through the above process, the array substrate 422 is manufactured to have the layers from the white reflective layer 409 through the light-conducting layer 410 formed on the back substrate 402.

Note that the array substrate 422 is similar to an array substrate used in a conventional organic EL display, yet differs by including the white reflective layer 409 and the light-conducting layer 410.
Formation of the Surface-Treated Layer A coating agent formed by dispersing $TiO_2$ particles in a water medium is applied to the surface of the light-conducting layer 410 to form a surface-treated layer on the surface of the light-conducting layer 410.

The surface-treated layer thus formed is firm, has a high degree of transparency, and is a uniform layer, with agglomerations of $TiO_2$ particles being relatively rare, and layered particles having an even particle diameter distribution. The layer is approximately 100 nm thick.

Thus forming the surface-treated layer on the surface of the light-conducting layer 410 reduces the van der Waals forces operating between the light-conducting layer 410 and the colored particles 413, thereby allowing for smooth movement of the colored particles 413 during driving.

The $TiO_2$ particles used for the coating agent are 30 nm in diameter, smaller than the colored particles 413 that are 5 μm in diameter. The reason for adopting this size is that if particles having a larger diameter than the colored particles 413 are used to form the surface-treated layer, the protrusions formed on the surface-treated layer become large, and the colored particles 413 end up attaching between the protrusions, thus eliminating the advantageous effect of reducing the van der Waals forces.

This sort of surface-treated layer may be formed not only on the light-conducting layer 410, but also on the surface of the partition walls 411 and the partition wall electrodes 412. By doing so, conditions such as electric resistance, electrostatic charge property, and shape are uniform across the entire surface of the cell space 415, yielding nearly the same voltage characteristics as the colored particles 413 attached to the surface-treated layer and achieving good display characteristics during driving.
Manufacturing Counter Substrate 421

The partition walls 411 are formed in a criss-cross fashion on the front substrate 401, which is formed from alkalifree glass, by a method such as photolithography. Next, after forming a film of conductive metal along the partition walls 411 by a method such as sputtering or vapor deposition, the partition wall electrodes 412 are formed by a method such as dry etching.

The counter substrate 421 is thus manufactured to have the partition walls 411 and the partition wall electrodes 412 formed on the front substrate 401.
Method of Manufacturing Colored Particles The method of manufacturing the colored particles 413 uses the hybridization system, like the method for the colored particles 4 described in Embodiment 1-1. Details such as the proportion of surface particles covering the entire surface of the core particles are similar to the description of the colored particles 4 in Embodiment 1-1.

The manufactured colored particles 413 have a positive electrostatic charge, and in order to maintain the charge amount constant, it is preferable to store the colored particles 413 in an atmosphere of dry air, dry nitrogen gas, or the like having a constant amount of moisture.

Panel Assembly Process

The colored particles 413 are spread nearly evenly in the spaces partitioned by the partition walls 411 for each pixel in the counter substrate 421 manufactured as above. The counter substrate 421 is then overlaid on the array substrate 422. The periphery of the front substrate 401 is coated with an epoxy-based UV adhesive.

Subsequently, the pixels formed by the counter substrate 421 and the array substrate 422 are aligned, and the counter substrate 421 and the array substrate 422 are exposed to UV light. The adhesive thereby hardens to complete assembly of the display panel 510.

It is preferable to assemble the display panel in a dry gas atmosphere (such as dry nitrogen) that has been desiccated to severely reduce moisture. By doing so, dry gas from which moisture has been removed is enclosed in the cell space 415 with the colored particles 413, and the amount of electrostatic charge of the colored particles 413 is maintained constant.

(Advantageous Effects of the Display Device According to the Present Embodiment)

The main advantageous effect of the display device according to the present embodiment is that in each pixel 420 in the display panel 510, by providing the cell space 415 of the reflective display element on top of the light-emitting display element composed of the first electrode 405, the light-emitting layer 406, and the counter electrode 407, the area occupied by the light-emitting display element and the reflective display element in the pixel 420 increases.

The reflective display element is provided with in-plane electrodes 412 and 407 along the cell space 415, in which the colored particles 413 are enclosed. Display is achieved through changing the amount of light that is reflected after entering from the front of the display panel 510 by causing the colored particles 413 to shift between being gathered by the partition wall electrodes 412 and being spread along the counter electrode 407. Therefore, when driving the light-emitting display element for light-emitting display, the colored particles 413 are caused to gather by the partition wall electrodes 412 in order to increase the aperture ratio of the reflective display element and allow light from the light-emitting display element to be emitted well from the front of the panel.

Furthermore, as described above, in order to move the colored particles 413 to drive the reflective display element and display an image, it is necessary to apply a voltage between the partition wall electrodes 412 and the counter electrode 407 exceeding the threshold voltage Vth. After displaying an image, however, the state of the colored particles 413 in the cell space 415 is maintained even if application of voltage to the reflective display element ceases, and image display is thus maintained. Accordingly, no power is required to maintain image display by the reflective display elements.

Furthermore, the size of the driving voltage for driving the light-emitting display element is smaller than the threshold voltage Vth, and therefore driving the light-emitting display element does not cause the colored particles 413 in the cell space 415 to move. Accordingly, when driving the light-emitting display elements, a large aperture ratio is maintained in the reflective display element without applying voltage to the reflective display element, so that light from the light-emitting elements is emitted from the front of the panel without being blocked by the colored particles 413. This achieves video display performance similar to a regular top-emission organic EL display.

In this way, the display device of the present embodiment achieves good image display with almost no reduction in image quality during both reflective display and light-emitting display.

In the reflective display element, the colored particles 413 are enclosed in a gas in the cell space 415, the refractive index of which is approximately one. Therefore, good optical characteristics are obtained as compared to when the particles are enclosed in an insulating transparent liquid used in an electrophoretic system, such as silicon oil (refractive index of 1.4). Furthermore, since the colored particles 413 are enclosed in a gas, a voltage of a certain magnitude is necessary to begin movement, but the colored particles move quickly after movement begins.

Note that increase in the threshold voltage to a large value of dozens of V when driving the reflective display element as described above is mainly due to the colored particles 413 being enclosed in a gas. In other words, when an electrophoretic system, in which colored particles are in a liquid, is used in the reflective display element, the colored particles begin to move upon application of even a slight voltage, making it difficult to maintain a good display state of the reflective display elements.

Furthermore, in the display device of the present embodiment, the counter electrode 407 serves as both the cathode in the light-emitting display element and the back electrode in the reflective display element, thus reducing the number of constituent elements between the light-emitting display element and the reflective display element, with a corresponding increase in light transmission.

In the display device of the present embodiment, the common semiconductor switching element 404 is used to drive both the light-emitting display element and the reflective display element, and use of the lines 523 and 533 is shared, resulting in a relatively simple wiring configuration in the display panel 510.

Next, the advantageous effects of the composite particles are described.

As explained above, adopting a structure for the colored particles 413 in which the entire surface of the core particles is covered by surface particles reduces the van der Waals forces produced between the colored particles 413 on the one hand and the light-conducting layer 410, the partition walls 411, and the partition wall electrodes 412 on the other. This not only reduces the voltage necessary for pulling the colored particles 413 away from the surface to which they have attached, but also improves anti-humidity characteristics.

Furthermore, providing the surface-treated layer with minute protrusions on the surface of the light-conducting layer 410, the partition walls 411, and the partition wall electrodes 412, as described above, yields the advantageous effect of further reducing the van der Waals forces operating between these surfaces and the colored particles 413.

(Experiments)

1. Experiments were performed to assess the voltage characteristics of a variety of combinations of material quality for the colored particles 413 and material quality for the surface-treated layer of the light-conducting layer 410, i.e. the inner surface of the cell space.

The experiments revealed that using acrylic resin (PMMA) as the compositional material of the particles and $TiO_2$ in the surface-treated layer of the light-conducting layer 410, as in the present embodiment, yielded good electrostatic characteristics between the colored particles 413 and the surface-treated layer, thereby yielding good voltage characteristics.

2. The voltage necessary for changing from a black display state to a white display state was measured for when the light-conducting layer 410 was and was not provided with a surface-treated layer.

Figure 48:
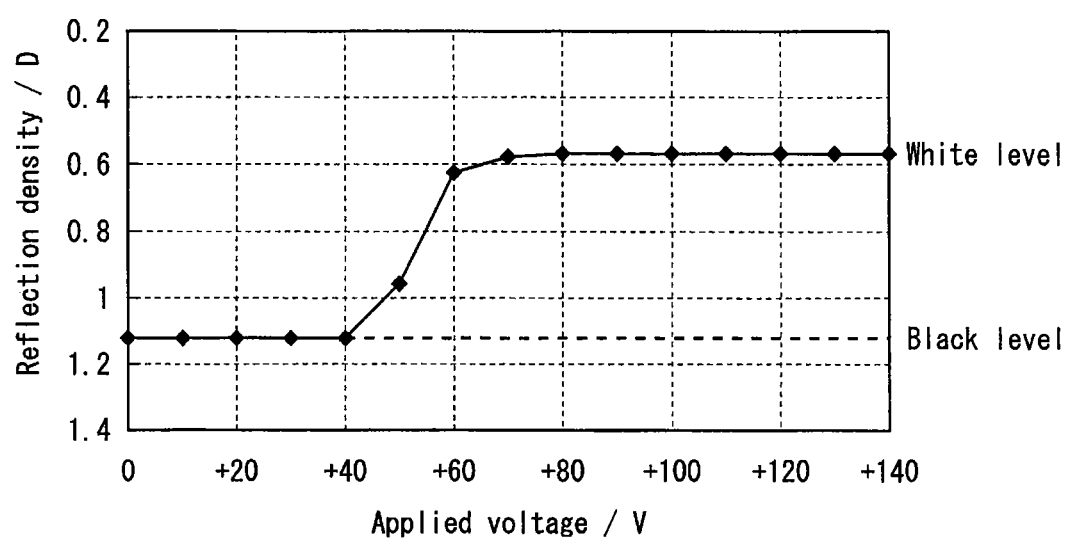
FIG. 48 is a graph showing voltage characteristics in the display device of Embodiment 4-1.

FIG. 48 is a graph showing the result of measuring voltage characteristics when providing a surface-treated layer on the surface of the light-conducting layer 410 in the display device of the present embodiment. FIG. 48 shows the relationship between (i) the voltage applied between the partition wall electrodes 412 and the counter electrode 407 and (ii) reflection density.

As shown in FIG. 48, the voltage (threshold voltage) between the partition wall electrodes 412 and the counter electrode 407 necessary to move the colored particles 413 in the black display state was 40 V, and the minimum necessary applied voltage (saturation voltage) to change to a white display state was 70 V.

On the other hand, when no surface-treated layer was provided on the surface of the light-conducting layer 410 in this display device, the saturation voltage was a high value of 150 V.

The magnitude of the threshold voltage for moving the colored particles 413 in the white display state was nearly the same, and to move the colored particles 413 in the white display state, it was necessary for the voltage of the counter electrode 407 with respect to the partition wall electrodes 412 to be set to −40 V or less.

Embodiment 4-2

In Embodiment 4-1, a semiconductor switching element is provided in each pixel for active driving, but in the present embodiment, no semiconductor switching element is provided in the pixels, and the pixels are driven by a simple matrix method.

(Device Structure of Display Panel 510)

The following describes a display device according to the present embodiment.

Figure 49:
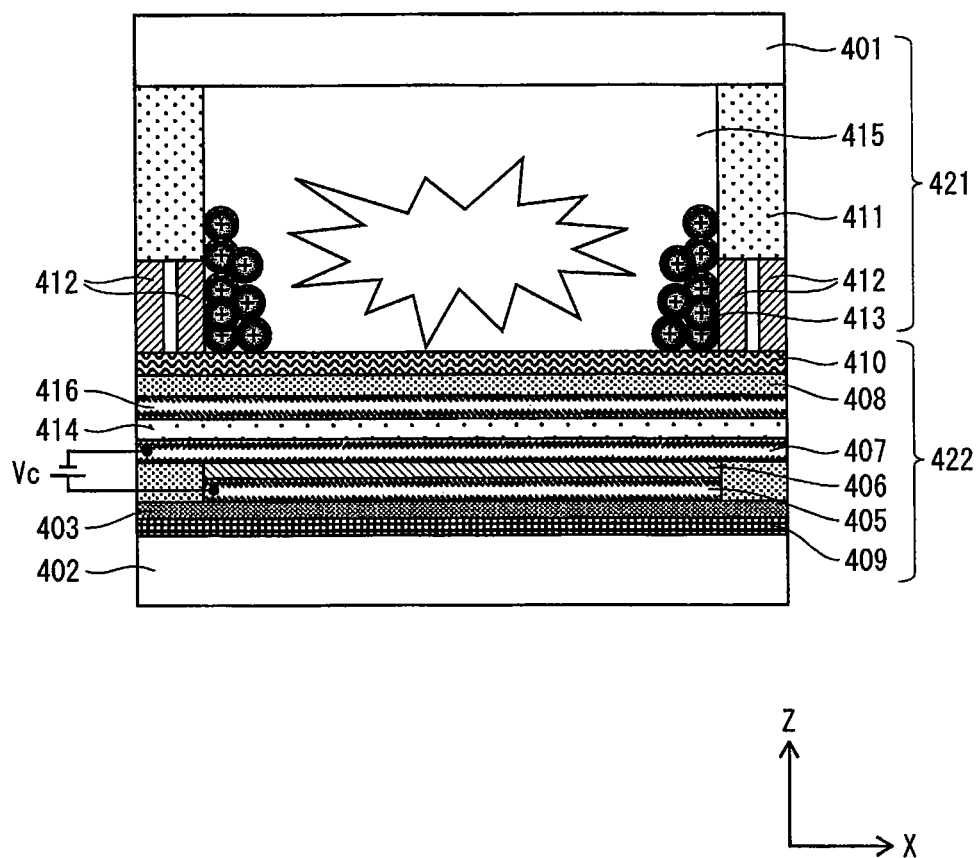
FIG. 49 is a cross-section diagram schematically showing the structure of a pixel unit in the display panel according to Embodiment 4-2, illustrating light-emitting display.

FIG. 49 is a partial cross-section diagram showing the device structure of the display device according to the present embodiment. Similar constituent elements as Embodiment 4-1 are indicated with the same labels.

As shown in FIG. 49, the display panel 510 is formed by joining an array substrate 422 and an counter substrate 421, and each pixel includes a light-emitting display element and a reflective display element in overlap, as in Embodiment 4-1.

Furthermore, in the array substrate 422, a white reflective layer 409 is formed as the lowest layer above a back substrate 402, with a first insulating layer 403, first electrodes 405, light-emitting layers 406, and counter electrodes 407 formed thereabove, and a light-conducting layer 410 formed above a sealing layer 408, as in Embodiment 4-1. A second insulating layer 414 and a second electrode 416 are laminated above the counter electrodes 407 and are also sealed by the sealing layer 408.

The second electrode 416 extends along the bottom of the cell space 415. The second electrode 416 and a pair of partition wall electrodes 412 form an in-plane electrode for a reflective display device.

In the present embodiment, since the light-emitting display elements are driven by a simple matrix method, the first electrodes 405 extend in stripes in the vertical direction (Y direction), and the counter electrodes 407 extend in stripes in the horizontal direction (X direction), so as be at right angles to each other, with the rectangular light-emitting layer 406 in each pixel therebetween. This structure results in light-emitting display elements in a simple matrix. The first electrodes 405 correspond to column electrodes, and the counter electrodes 407 correspond to row electrodes.

In the present embodiment, since the reflective display elements are also driven by a simple matrix method, the second electrodes 416 extend in stripes in the horizontal direction (X direction) above the counter electrodes 407 with the second insulating layer 414 therebetween. The second electrodes 416 and the partition wall electrodes 412 extending in stripes in the vertical direction (Y direction) are at right angles to each other, thus forming a matrix of electrodes.

In Embodiment 4-1, the partition wall electrodes 412 are shared by horizontally neighboring pixels, since all of the partition wall electrodes 412 are connected at a constant standard potential. In the present embodiment, however, which adopts simple matrix driving, voltage is applied to partition wall electrodes 412 independently of whether pixels neighbor horizontally. Therefore, as shown in FIG. 49, partition wall electrodes 412 in horizontally neighboring pixels are not shared, but rather are provided independently.

(Means for Driving Display Panel 510)

Figure 50:
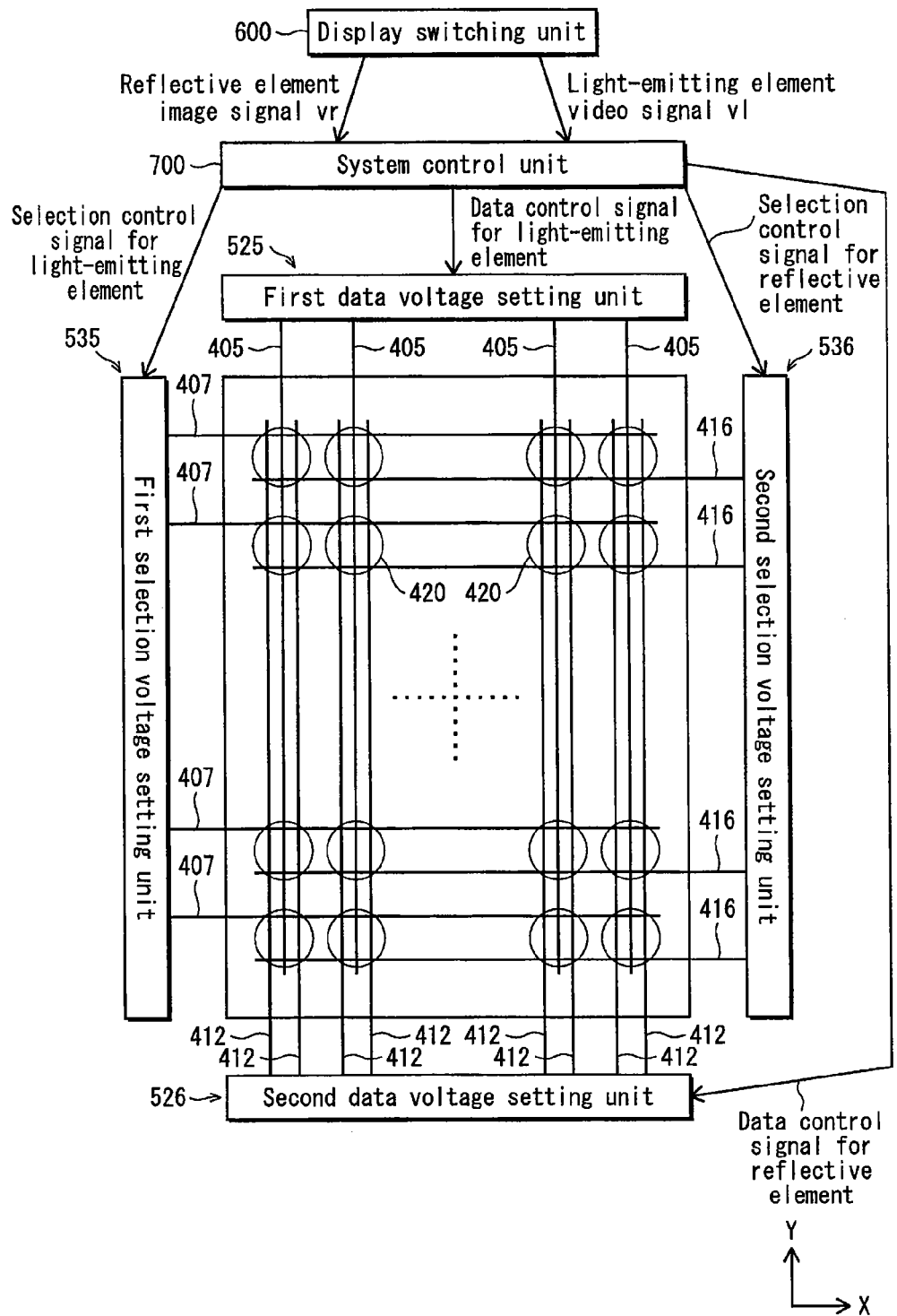
FIG. 50 shows the structure of the drive circuit that drives the light-emitting element and the reflective element according to Embodiment 4-2.

FIG. 50 shows the structure of a drive circuit for applying voltage to the first electrodes 405 and the counter electrodes 407. As described above, in the display panel 510, the first electrodes 405 and the counter electrodes 407 are provided at right angles to each other so as to traverse all of the pixels 420 in the matrix, and the pairs of partition wall electrodes 412 and the second electrodes 416 are also provided to traverse all of the pixels 420.

In order to drive the light-emitting display elements, a first data voltage setting unit 525, which applies a data voltage VD1 separately to each of a plurality of first electrodes 405, and a first selection voltage setting unit 535, which consecutively applies a selection voltage Vs1 to each of a plurality of counter electrodes 407, are provided.

In order to drive the reflective display elements, a second data voltage setting unit 526, which applies a data voltage VD2 separately to each of a plurality of partition wall electrodes 412, and a second selection voltage setting unit 536, which consecutively applies a selection voltage Vs2 to each of a plurality of second electrodes 416, are provided.

Note that at the time of a reset, the second selection voltage setting unit 536 is capable of applying a positive reset voltage Vrst at once to a plurality of second electrodes 416.

(Operations of Display Device)

Operations of the display device with the above structure are described with reference to FIGS. 49-53.

When the display switching unit 600 selects display by the light-emitting elements, a light-emitting element video signal vl is transmitted to the system control unit 700, whereas when the display switching unit 600 selects reflective display, a reflective element image signal vr is transmitted to the system control unit 700.

The light-emitting element video signal vl and the reflective element image signal vr are as described in Embodiment 4-1.

Upon receiving the light-emitting element video signal vl, the system control unit 700 first performs a reset operation, and then, based on the light-emitting element video signal vl, transmits a data control signal to the first data voltage setting unit 525 and a selection control signal to the first selection voltage setting unit 535, thus driving the light-emitting display element in each pixel 420 via the setting units 525 and 535 in order to display one frame of an image. When displaying video, display of one frame of an image is repeated. During this time, the reflective display element is in an off state.

On the other hand, upon receiving the reflective element image signal vr, the system control unit 700 first performs a reset operation, and then, based on the reflective element image signal vr, transmits a data control signal to the second data voltage setting unit 526 and a selection control signal to the second selection voltage setting unit 536, thus driving the reflective display element in each pixel 420 via the setting units 526 and 536 in order to display an image. During this time, the light-emitting display element is in an off state.

The following describes 1. the reset operation, 2. image display by the light-emitting elements, and 3. image display by the reflective elements.

1. Reset Operation

At the time of a reset, the first data voltage setting unit 525 grounds all of the partition wall electrodes 412, and the first selection voltage setting unit 535 applies a positive reset voltage Vrst (+80 V) to all of the second electrodes 416.

Via this reset operation, an electrical field forms in the reflective display element from the second electrode 416 to the partition wall electrodes 412. Therefore, as shown in FIG. 49, the colored particles 413 (with a positive electrostatic charge) located above the light-conducting layer 410 are forced towards the partition walls 411 (towards the partition wall electrodes 412), exposing the light-conducting layer 410. Accordingly, light that enters from the front of the panel reflects off the white reflective layer 409 and is emitted from the front of the panel, thus yielding a white display state. This white display state (initial state) is maintained until a voltage exceeding a threshold voltage Vth (several dozen V to several hundred V) for driving the reflective display element is next applied to the second electrode 416.

2. Image Display by Light-Emitting Elements

For image display by the light-emitting elements, a negative selection voltage Vs1 is applied from the first selection voltage setting unit 535 consecutively to a plurality of counter electrodes 407, and a positive data voltage VD1 of a magnitude corresponding to the display luminance to be displayed in the corresponding pixel is applied from the first data voltage setting unit 525 to each of a plurality of first electrodes 405.

As a result, a voltage corresponding to the difference between the positive data voltage VD1 and the negative selection voltage Vs1 is applied to the light-emitting layer 406 in each pixel 420, thereby achieving light-emitting display corresponding to a light-emitting element video signal vl for one frame.

Video display is achieved by repeating such light-emitting display of one frame.

In this embodiment, the difference between the positive selection voltage Vs1 and the negative data voltage VD1 (Vs1−Vd1) is approximately 2 V-10 V. Accordingly, when driving the light-emitting elements, the voltage between the partition wall electrodes 412 and the second electrodes 416 is at most approximately 10 V, which is smaller than the above threshold voltage Vth (several dozen V to several hundred V).

Therefore, light from the light-emitting elements passes through the light-conducting layer 410 without being blocked by the colored particles 413 and is emitted from the front of the panel. Light that is emitted from the light-emitting elements towards the back is reflected by the white reflective layer 409 and emitted from the front of the panel.

3. Image Display by Reflective Elements

For image display by the reflective elements, a negative selection voltage Vs2 is applied from the second selection voltage setting unit 536 consecutively to a plurality of second electrodes 416, and a positive data voltage VD2 of a magnitude corresponding to a display luminance based on the reflective element image signal vr is applied from the second data voltage setting unit 526 to each of a plurality of pairs of partition wall electrodes 412.

In this embodiment, the magnitude of the negative selection voltage Vs2 and the magnitude of the positive data voltage VD2 are both set to be less than the magnitude of the threshold voltage Vth, and the difference between the data voltage VD2 and the selection voltage Vs2 is set to be greater than the magnitude of the threshold voltage Vth.

For example, the selection voltage Vs2 is set to −30 V, the data voltage VD2 for pixels that are to display black is set to 30 V, and the data voltage VD2 for pixels that are to display a halftone is set to 20 V. On the other hand, no data voltage VD2 is applied to pixels that are to display white.

By applying the selection voltage and the data voltage with such magnitudes to the second electrodes 416 and the partition wall electrodes 412, the magnitudes of the data voltage VD2 and the selection voltage Vs2 are 30 V or less, which is smaller than the magnitude of the threshold voltage Vth (40 V). Therefore, the colored particles 413 do not move in pixels to which either the data voltage VD2 or the selection voltage Vs2 is applied independently, whereas in pixels that are to display black or a halftone, the data voltage VD2 and the selection voltage Vs2 overlap, resulting in application of a voltage corresponding to the difference therebetween (Vs2−VD2). This difference exceeds the threshold voltage Vth (40 V), and thus the colored particles 413 move.

Figure 51:
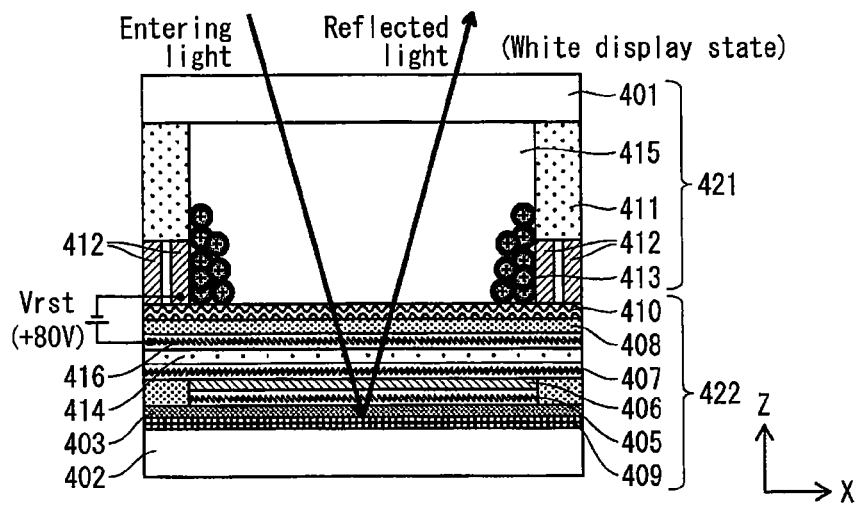
FIG. 51 is a cross-section diagram schematically showing the structure of a pixel unit in the display panel according to Embodiment 4-2, illustrating white display.

In other words, in pixels that are to display white, no data voltage VD2 is applied to the partition wall electrodes 412, and therefore the colored particles 413 do not move. Accordingly, as shown in FIG. 51, the positively charged colored particles 413 remain in the initial state, being forced towards and attached to the partition walls 411, so that the white reflective layer 409 can be seen from the front of the panel, yielding a white display.

Figure 52:
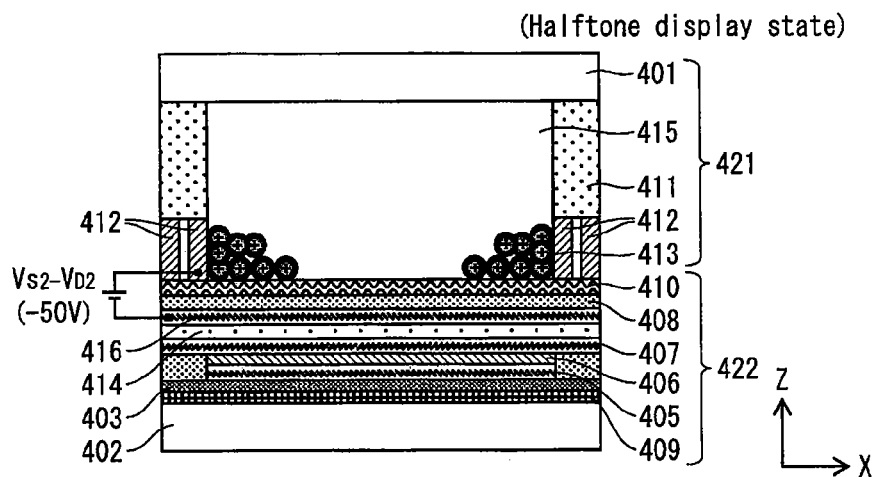
FIG. 52 is a cross-section diagram schematically showing the structure of a pixel unit in the display panel according to Embodiment 4-2, illustrating halftone display.

Between the partition wall electrodes 412 and the second electrode 416 in pixels that are to display a halftone, a negative voltage (Vs2−VD2=approximately −50 V) is applied to the second electrode 416, so that an electrical field forms from the partition wall electrodes 412 towards the second electrode 416, producing a negative electrical charge near the surface of the light-conducting layer 410. As a result, as shown in FIG. 52, a portion of the positively charged colored particles 413 is attracted towards the second electrode 416, so that a portion of the white reflective layer 409 is covered by the black-colored particles 413. This yields a halftone display that combines the white reflective layer 409 with the black-colored particles 413.

Figure 53:
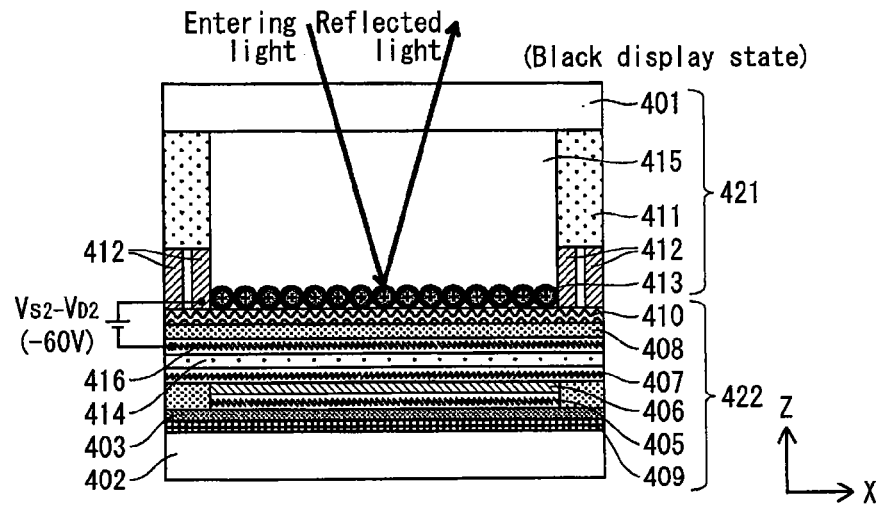
FIG. 53 is a cross-section diagram schematically showing the structure of a pixel unit in the display panel according to Embodiment 4-2, illustrating black display.

Between the partition wall electrodes 412 and the second electrode 416 in pixels that display black, a negative voltage (Vs2−VD2=−60 V) is applied to the second electrode 416, and a negative electrical charge near the surface of the light-conducting layer 410 completely prevails. As shown in FIG. 53, the positively charged colored particles 413 are forced towards the light-conducting layer 410, thus spreading so as to cover the light-conducting layer 410. In this pixel, the entire white reflective layer 409 is thereby covered by the black-colored particles 413, thus yielding a black display state.

In this way, based on the reflective element image signal vr, the reflective element in each pixel in the display panel 510 displays white, a halftone, or black, thereby displaying one frame of an image.

After writing, the colored particles 413 remain attached to the surface of the light-conducting layer 410, even if no voltage is applied to the counter electrode 407, due to van der Waals forces. Therefore, image display is maintained without consuming power.

Accordingly, the text screen or still image of an electronic book can be displayed over an extended time with little power consumption.

Next, when a reflective element image signal vr for displaying new contents is transmitted from the display switching unit 600, the system control unit 700 performs a reset operation and a writing operation, as above.

When contents such as the text screen or still image of an electronic book are continually displayed for a certain length of time, the colored particles 413 remain attached to the surface of the light-conducting layer 410 due to van der Waals forces, even if application of voltage to the first electrodes 405 stops. Accordingly, this embodiment does not differ from Embodiment 4-1 in that the display state is maintained without consuming power.

In the above explanation, selection voltage is applied to the second electrodes 416, and data voltage to the pairs of partition wall electrodes 412, but image display by a reflective display device may be similarly achieved by reversing the electrodes to which selection voltage and data voltage are applied, consecutively applying a positive selection voltage to the plurality of pairs of partition wall electrodes 412, and applying a negative data voltage to the plurality of second electrodes 416.

(Method of Manufacturing Display Device)

The array substrate 422 is manufactured by a similar method as in Embodiment 4-1 through the white reflective layer 409, the first insulating layer 403, the first electrodes 405, the light-emitting layers 406, and the counter electrodes 407. The present embodiment differs greatly from Embodiment 4-1, however, in that no semiconductor switching element 404 is formed. The present embodiment also differs from Embodiment 4-1 in that the first electrodes 405 correspond to column electrodes and are formed in stripes in the Y direction, and in that the counter electrodes 407 correspond to row electrodes and are formed in stripes in the X direction.

Next, after forming the second insulating layer 414 by the same method as the first insulating layer 403, the second electrodes 416 corresponding to column electrodes are formed in stripes in the Y direction. Like the first electrodes 405 and the counter electrodes 407, the second electrodes 416 are formed from ITO, a transparent conductive material. Furthermore, the sealing layer 408 and the light-conducting layer 410 are formed by a similar method as in Embodiment 4-1.

The counter substrate 421 and the colored particles 413, as well as the surface-treated layer that forms minute protrusions on the surface layer 410a of the light-conducting layer 410, are manufactured by a similar method as Embodiment 4-1.

The assembly process by which the counter substrate 421 and the array substrate 422 are joined to assemble the display panel 510 is similar to Embodiment 4-1.

(Advantageous Effects of the Display Device According to the Present Embodiment)

The advantageous effects are basically similar to Embodiment 4-1. The reflective display element is driven with a voltage equal to or greater than a threshold voltage Vth (several dozen V to several hundred V), and the driving voltage of the light-emitting display element is smaller than the threshold voltage Vth. Therefore, when the light-emitting display element is selected for light-emitting display, the reflective display element is maintained in an initial state. Accordingly, the light-emitting display is not obstructed, thereby yielding video display performance similar to a regular top-emission organic EL display.

Furthermore, as described above, when the reflective display elements are written by a simple matrix method, the magnitude of the voltages (Vs2, VD2) applied to the partition wall electrodes 412 and to the second electrode 416 are set to be smaller than the threshold voltage Vth, so that the colored particles 413 only move in pixels that are to display black or a halftone, and not in pixels displaying white. Accordingly, the simple matrix method also allows for accurate display.

Adopting this simple matrix method in the display device of Embodiment 4-2 also simplifies the panel structure and reduces manufacturing cost.

<Modifications and the Like>

In Embodiment 4-1, the semiconductor switching element 404 is used to drive both the reflective display element and the light-emitting display element, but similar advantageous effects may be achieved when providing both a semiconductor switching element for the reflective display element and a semiconductor switching element for the light-emitting display element.

In Embodiment 4-2, both the reflective display element and the light-emitting display element are driven by a simple matrix method, but alternatively, only one of the two elements may be driven by a simple matrix method.

In the display device of Embodiments 4-1 and 4-2, one pair of a reflective display element overlaid on a light-emitting display element is provided in each pixel. Alternatively, a display device capable of full-color display may be achieved by providing a plurality of pairs of a reflective display element overlaid on a light-emitting display element and displaying gradations of colors such as R, G, and B.

INDUSTRIAL APPLICABILITY

The present invention allows for a paper-like display with a high degree of reflection and high contrast, yet with low driving voltage. The present invention also allows for low power consumption digital paper that can maintain display when turned off, display devices for a variety of mobile devices, and display devices capable of highly efficient, full-color video display.

Furthermore, a structure combining reflective display elements with light-emitting display elements yields a thin, low power consumption display device with excellent visibility both indoors and outdoors.

Accordingly, the present invention is useful as technology for the display device in a variety of mobile devices, such as cellular telephones.

| [Reference Signs List] | |
| --- | --- |
| 1 | front substrate |
| 2 | back substrate |
| 3 | first insulating layer |
| 4a, 4b | semiconductor switching element |
| 5 | pixel electrode |
| 6 | light-emitting layer |
| 7 | counter electrode |
| 8 | sealing layer |
| 9 | white reflective layer |
| 10 | light-conducting layer |
| 10a | surface of light-conducting layer |
| 10b | surface-treated layer |
| 10b1 | particle layer |
| 10b2 | insulating layer |

-continued

[Reference Signs List]

| | | |
|---|---|---|
| 11 | partition wall | |
| 12 | partition wall electrode | |
| 13 | colored particle | |
| 13a | core particle | |
| 13b | surface particle | |
| 14 | second insulating layer | |
| 15 | cell space | |
| 16 | pixel electrode | |
| 20 | pixel | |
| 21 | counter substrate | |
| 22 | array substrate | |
| 41 | first TFT | |
| 42 | second TFT | |
| 43 | capacitor | |
| 45 | TFT | |
| 100 | display unit | |
| 110 | display panel | |
| 120 | data voltage setting unit | |
| 121 | first data voltage setting unit | |
| 125 | second data voltage setting unit | |
| 130 | selection voltage setting unit | |
| 131 | first selection voltage setting unit | |
| 135 | second selection voltage setting unit | |
| 140 | power supply voltage setting unit | |
| 141 | first power supply voltage setting unit | |
| 145 | second power supply voltage setting unit | |
| 200 | display switching unit | |
| 300 | system control unit | |

The invention claimed is:

1. A display device provided with a panel and a driving unit, comprising:
   the panel including a front substrate and a back substrate disposed to face each other with a space therebetween, partition walls disposed in the space to partition adjacent pixels into cell spaces, and colored particles enclosed in each cell space, the driving unit causing the colored particles to move within the cell space,
   a first electrode being provided independently in each pixel of the panel at a bottom of the cell space facing the back substrate,
   a second electrode, having a common electric potential in every pixel, being provided within the partition walls and closer to the front substrate than the first electrode, and
   the driving unit applying a voltage between the first electrode and the second electrode to cause the colored particles in each pixel to move between being gathered by the first electrode and being gathered by the second electrode, in order to change an amount of light emitted towards the front of the panel, wherein
   the colored particles are constituted by core particles and surface particles covering a surface of the core particles, the core particles being formed from a material that takes a positive or negative electrostatic charge.

2. The display device of claim 1,
   wherein the second electrode is provided at a distance from the bottom of the cell space towards the front substrate.

3. The display device of claim 1, wherein
   a distance at which the second electrode is provided from the bottom of the cell space towards the front substrate is at least ⅕ a height of the partition walls.

4. The display device of claim 1, wherein
   a thickness of the second electrode in a direction of thickness of the substrates is between 5 μm and 25 μm inclusive.

5. The display device of claim 1, wherein
   the second electrode protrudes from a side of the partition wall towards a central region of the cell space.

6. The display device of claim 1, wherein
   in plan view from the front of the panel, at least a portion of the second electrode overlaps an outer periphery of the first electrode.

7. The display device of claim 1, wherein
   the colored particles are enclosed in a gas in the cell space.

8. The display device of claim 1, wherein
   a color filter is provided on the front substrate.

9. The display device of claim 1, wherein
   before displaying an image, the driving unit causes the colored particles to be gathered by the second electrode by applying a reset voltage between the first electrode and the second electrode.

10. The display device of claim 1, wherein
    the back substrate is provided with a reflective layer facing a back surface of the first electrode, and
    the driving unit causes the colored particles to move in order to change an amount of light reflected after entering from the front of the panel.

11. The display device of claim 1, wherein
    a backlight is provided at a back side of the back substrate.

12. The display device of claim 1, wherein
    in the panel, a light-emitting display element facing a back surface of the first electrode is provided in each pixel,
    the first electrode and the light-emitting display element transmit visible light, and
    a reflective layer is provided facing a back surface of the light-emitting display element.

13. A display device provided with a panel and a driving unit, comprising:
    the panel including a front substrate and a back substrate disposed to face each other with a space therebetween, partition walls disposed in the space to partition adjacent pixels into cell spaces, and colored particles enclosed in each cell space, the driving unit causing the colored particles to move within the cell space,
    a first electrode being provided independently in each pixel of the panel at a bottom of the cell space facing the back substrate,
    a second electrode, having a common electric potential in every pixel, being provided within the partition walls and closer to the front substrate than the first electrode, and
    the driving unit applying a voltage between the first electrode and the second electrode to cause the colored particles in each pixel to move between being gathered by the first electrode and being gathered by the second electrode, in order to change an amount of light emitted towards the front of the panel, wherein
    wherein a surface-treated layer having protrusions on a surface thereof is provided on an inner surface of the cell space.

14. The display device of claim 13, wherein
    the surface-treated layer is formed from a material having the same electrostatic charge property as the colored particles.

15. The display device of claim 13, wherein
    an average distance between the protrusions on the surface of the surface-treated layer is smaller than an average particle diameter of the colored particles.

16. The display device of claim 13, wherein
    the protrusions on the surface of the surface-treated layer are formed evenly across the entire surface.

17. The display device of claim 13, wherein
the surface-treated layer is a coated layer formed by applying a coating agent having particles dispersed therein to the inner surface of the cell space.

18. The display device of claim 17, wherein
the colored particles are constituted by core particles and surface particles covering a surface of the core particles, and
an average particle diameter of the particles dispersed in the coating agent is larger than an average particle diameter of the surface particles and smaller than an average particle diameter of the core particles.

19. A display device provided with a display panel and a driving unit, comprising:
the display panel including a front substrate, a back substrate facing the front substrate, an intermediate substrate between the front substrate and the back substrate, and a plurality of pixels in a matrix, each pixel including a first display element facing the front substrate and a second display element facing the back substrate, the driving unit driving the first display element and the second display element,
in the first display element, first partition walls being disposed in a space between the front substrate and the intermediate substrate to partition adjacent pixels into first cell spaces, first colored particles having an electrostatic charge property being enclosed in each first cell space, a first display electrode facing the front substrate being provided in each first cell space, and one or more first focusing electrodes being provided within the first partition walls,
in the second display element, second partition walls being disposed in a space between the back substrate and the intermediate substrate to partition adjacent pixels into second cell spaces, second colored particles having an electrostatic charge property being enclosed in each second cell space, a second display electrode facing the back substrate being provided in each second cell space, and one or more second focusing electrodes being provided within the second partition walls,
the driving unit changing a voltage application pattern between the first display electrode and the first focusing electrode and a voltage application pattern between the second display electrode and the second focusing electrode, and
by changing the voltage application patterns, the driving unit causing the first colored particles to shift between covering the front substrate and clearing the front substrate to attach to the first partition walls and causing the second colored particles to shift between covering the back substrate and clearing the back substrate to attach to the second partition walls, in order to change a gradation of light extracted through the front of the panel.

20. The display device of claim 19,
wherein in the first display element, the first colored particles include two types of colored particles, the two types having a different color and a different electrical polarity,
the first focusing electrodes are provided as a pair at opposing positions within the first partition walls on either side of the first cell space, and
the driving unit applies voltage between the first display electrode and the pair of first focusing electrodes using different voltage application patterns.

21. The display device of claim 19, wherein
in the second display element, the second colored particles include two types of colored particles, the two types having a different color and a different electrical polarity,
the second focusing electrodes are provided as a pair at opposing positions within the second partition walls on either side of the second cell space, and
the driving unit applies voltage between the second display electrode and the pair of second focusing electrodes using different voltage application patterns.

22. The display device of claim 21, wherein
the first colored particles are of two colors selected from among red, green, blue, and black, and
the second colored particles are of the two remaining colors not selected for the first colored particles.

23. The display device of claim 21, wherein
the first colored particles are of two colors selected from among cyan, yellow, magenta, and black, and
the second colored particles are of the two remaining colors not selected for the first colored particles.

24. The display device of claim 19, wherein
the front substrate, the intermediate substrate, the first display electrode, and the second display electrode are made of transparent material.

25. The display device of claim 24, wherein
a white reflective layer is provided facing a back surface of the second display element.

26. The display device of claim 19, wherein
with respect to each pixel, the driving unit
adjusts voltage applied between the first display electrode and the first focusing electrode in the first display element and voltage applied between the second display electrode and the second focusing electrode in the second display element, and
displays gradations by changing a proportion of the first colored particles covering the front substrate and a proportion of the second colored particles covering the back substrate.

27. The display device of claim 19, wherein
before applying voltage for image display, the driving unit
applies a reset voltage between the first display electrode and the first focusing electrode in the first display element to cause the first colored particles to be gathered by the first focusing electrode, and
applies a reset voltage between the second display electrode and the second focusing electrode in the second display element to cause the second colored particles to be gathered by the second focusing electrode.

28. The display device of claim 19, wherein
the first focusing electrode is positioned within the first partition walls between a side of the first cell space facing the front substrate and a side of the first cell space facing the intermediate substrate, and
the second focusing electrode is positioned within the second partition walls between a side of the second cell space facing the back substrate and a side of the second cell space facing the intermediate substrate.

29. The display device of claim 28, wherein
the first focusing electrode is positioned in a central region of the first cell space in a direction of height of the first partition walls, and
the second focusing electrode is positioned in a central region of the second cell space in a direction of height of the second partition walls.

30. The display device of claim 28, wherein
the first focusing electrode is positioned at a distance towards the intermediate substrate from a side of the first cell space facing the front substrate, and
the second focusing electrode is positioned at a distance towards the intermediate substrate from a side of the second cell space facing the back substrate.

31. The display device of claim 19, wherein
the first cell space and the second cell space are filled with a gas.

32. The display device of claim 19, wherein
at least one the first colored particles and the second colored particles includes core particles and surface particles covering a surface of the core particles, the core particles being formed from a material that takes a positive or negative electrostatic charge.

33. The display device of claim 19, wherein
a surface-treated layer having protrusions on a surface thereof is provided on an inner surface of the first cell space and on an inner surface of the second cell space.

34. The display device of claim 33, wherein
each surface-treated layer is formed from a material having the same electrostatic charge property as the colored particles enclosed in the corresponding cell space.

35. The display device of claim 33, wherein
an average distance between the protrusions on the surface of each surface-treated layer is smaller than an average particle diameter of the colored particles enclosed in the corresponding cell space.

36. The display device of claim 33, wherein
the protrusions on the surface of each surface-treated layer are formed evenly across the entire surface.

37. The display device of claim 33, wherein
each surface-treated layer is a coated layer formed by applying a coating agent having particles dispersed therein to the inner surface of each cell space.

38. A display device comprising:
a panel including a front substrate and a back substrate, disposed to face each other and to enclose a light-emitting first display element and a reflective second display element in overlap in each pixel; and
a driving unit configured to drive the first display element and the second display element separately,
the second display element including partition walls partitioning adjacent pixels into cell spaces, colored particles enclosed in each cell space, and an in-plane electrode along an inner surface of the cell space, and
the driving unit applying a voltage to the in-plane electrode to cause the colored pixels to move within the cell space in order to change an amount of light reflected after entering from the front of the panel, wherein
the colored particles are constituted by core particles and surface particles covering a surface of the core particles, the core particles being formed from a material that takes a positive or negative electrostatic charge.

39. The display device of claim 38, wherein
the in-plane electrode is formed by a pair of a partition wall electrode provided along the partition wall and a back electrode provided along a bottom of the cell space, and
the driving unit applies voltage between the partition wall electrode and the back electrode to cause the colored particles to move between being gathered by the partition wall electrode and being gathered by the back electrode.

40. The display device of claim 39, wherein
before driving the first display element, the driving unit applies voltage between the partition wall electrode and the back electrode to cause the colored particles to be gathered by the partition wall electrode.

41. The display device of claim 38, wherein
the first display element is formed from material that transmits visible light, and
a reflective layer is provided at a back of the first display element.

42. The display device of claim 38, wherein
in the second display element, a light-conducting layer is provided facing the cell space on the back electrode.

43. The display device of claim 38, wherein
in the second display element, the colored particles are enclosed in a gas in the cell space.

44. The display device of claim 38, wherein
the first display element is sealed by a sealing layer, and the cell space in the second display element is provided in front of the sealing layer.

45. A method of manufacturing the display device of claim 44, comprising the steps of:
sealing the first display element with a sealing layer m a dry gas atmosphere; and
dispersing, in a dry gas atmosphere, the colored particles in each cell space partitioned by the partition walls.

46. The display device of claim 38, wherein
a surface-treated layer having protrusions on a surface thereof is provided on an inner surface of the cell space.

47. The display device of claim 46, wherein
the surface-treated layer is formed from a material having the same electrostatic charge property as the colored particles.

48. The display device of claim 46, wherein
an average distance between the protrusions on the surface of the surface-treated layer is smaller than an average particle diameter of the colored particles.

49. The display device of claim 46, wherein
the protrusions on the surface of the surface-treated layer are formed evenly across the entire surface.

50. The display device of claim 46, wherein
the surface-treated layer is a coated layer formed by applying a coating agent having particles dispersed therein to the inner surface of the cell space.

51. The display device of claim 50, wherein
the coating agent is formed by dispersing $TiO_2$ particles in a medium of water, the $TiO_2$ particles having an anatase crystal structure.

52. The display device of claim 50, wherein
the coating agent is formed by dispersing inorganic particles in a medium constituted by a solution of insulating resin fused in a solvent.

53. The display device of claim 52, wherein
the insulating resin is polycarbonate.

54. The display device of claim 52, wherein
the colored particles are constituted by core particles and surface particles covering a surface of the core particles, and
an average particle diameter of the particles dispersed in the coating agent is larger than an average particle diameter of the surface particles and smaller than an average particle diameter of the core particles.

55. The display device of claim 38, wherein
the driving unit is provided with a first semiconductor switching element applying voltage to the first display element and a second semiconductor switching element applying voltage to the second display element.

56. A method of manufacturing the display device of claim 38, comprising the step of:

dispersing, in a dry gas atmosphere, the colored particles in each cell space partitioned by the partition walls.

57. A display device comprising:

a panel including a front substrate and a back substrate, disposed to face each other and to enclose a light-emitting first display element and a reflective second display element in each pixel; and a driving unit configured to drive the first display element and the second display element separately, the driving unit applying a driving voltage equaling at least a threshold voltage when driving the second display element, and the driving unit applying a driving voltage equaling at most the threshold voltage when driving the first display element, wherein the first display element includes an anode and a cathode, and when the second display element is driven, the anode of the first display element and the back electrode of the second display element are connected so as to be at the same electric potential.

58. The display device of claim 57, wherein in each pixel, the second display element is provided in front of and overlapping the first display element.

59. The display device of claim 58, wherein the second display element includes partition walls partitioning adjacent pixels into cell spaces, colored particles enclosed in each cell space, and an in-plane electrode along an inner surface of the cell space, and the driving unit applies a voltage to the in-plane electrode to cause the colored pixels to move within the cell space in order to change an amount of light reflected after entering from outside of the panel.

60. The display device of claim 59, wherein the threshold voltage is a minimum voltage necessary to apply to the in-plane electrode to cause the colored particles to move in the cell space.

61. The display device of claim 59, wherein in the second display element, the colored particles are enclosed in a gas in the cell space.

62. The display device of claim 59, wherein the in-plane electrode in the second display element is formed by a pair of a partition wall electrode provided along the partition wall and a back electrode provided along a bottom of the cell space, and the driving unit applies voltage between the partition wall electrode and the back electrode to cause the colored particles to move between being gathered by the partition wall electrode and being gathered by the back electrode.

63. The display device of claim 62, wherein the first display element includes an anode and a cathode, and the cathode also functions as the back electrode.

64. The display device of claim 58, wherein the first display element is formed from material that transmits visible light, and a reflective layer is provided at a back of the first display element.

65. The display device of claim 57, wherein at least one of the first display device and the second display element is driven by a simple matrix method.

66. The display device of claim 57, wherein the driving unit drives the first display element and the second display element with a common semiconductor switching element.

67. A display device provided with a panel and a driving unit, the panel including a front substrate and a back substrate disposed to face each other with a space therebetween, partition walls disposed in the space to partition adjacent pixels into cell spaces, and colored particles enclosed in each cell space, the driving unit causing the colored particles to move within the cell space, a first electrode being provided independently in each pixel of the panel at a bottom of the cell space facing the back substrate, a second electrode, having a common electric potential in every pixel, being provided within the partition walls and closer to the front substrate than the first electrode, and the driving unit applying a voltage between the first electrode and the second electrode to cause the colored particles in each pixel to move between being gathered by the first electrode and being gathered by the second electrode, in order to change an amount of light emitted towards the front of the panel, wherein before displaying an image, the driving unit causes the colored particles to be gathered by the second electrode by applying a reset voltage between the first electrode and the second electrode.

68. A display device provided with a panel and a driving unit, the panel including a front substrate and a back substrate disposed to face each other with a space therebetween, partition walls disposed in the space to partition adjacent pixels into cell spaces, and colored particles enclosed in each cell space, the driving unit causing the colored particles to move within the cell space, a first electrode being provided independently in each pixel of the panel at a bottom of the cell space facing the back substrate, a second electrode, having a common electric potential in every pixel, being provided within the partition walls and closer to the front substrate than the first electrode, and the driving unit applying a voltage between the first electrode and the second electrode to cause the colored particles in each pixel to move between being gathered by the first electrode and being gathered by the second electrode, in order to change an amount of light emitted towards the front of the panel, wherein the back substrate is provided with a reflective layer facing a back surface of the first electrode, and the driving unit causes the colored particles to move in order to change an amount of light reflected after entering from the front of the panel.

* * * * *